(12) United States Patent
Chida

(10) Patent No.: US 11,411,208 B2
(45) Date of Patent: *Aug. 9, 2022

(54) MANUFACTURING METHOD OF LIGHT-EMITTING DEVICE, LIGHT-EMITTING DEVICE, MODULE, AND ELECTRONIC DEVICE

(71) Applicant: Semiconductor Energy Laboratory Co., Ltd., Atsugi (JP)

(72) Inventor: Akihiro Chida, Kanagawa (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/001,973

(22) Filed: Aug. 25, 2020

(65) Prior Publication Data

US 2020/0388795 A1    Dec. 10, 2020

Related U.S. Application Data

(62) Division of application No. 16/178,656, filed on Nov. 2, 2018, now Pat. No. 10,804,503, which is a division
(Continued)

(30) Foreign Application Priority Data

Jul. 30, 2015 (JP) .................................. 2015-150777
Jun. 16, 2016 (JP) .................................. 2016-119834

(51) Int. Cl.
    *H01L 51/56*      (2006.01)
    *H01L 51/52*      (2006.01)
    *H01L 51/00*      (2006.01)

(52) U.S. Cl.
CPC .......... *H01L 51/56* (2013.01); *H01L 51/0097* (2013.01); *H01L 51/5246* (2013.01);
(Continued)

(58) Field of Classification Search
None
See application file for complete search history.

(56) References Cited

U.S. PATENT DOCUMENTS

| 4,767,679 A | 8/1988 | Kawachi |
| 5,189,405 A | 2/1993 | Yamashita et al. |

(Continued)

FOREIGN PATENT DOCUMENTS

| CN | 001430192 A | 7/2003 |
| CN | 001925140 A | 3/2007 |

(Continued)

OTHER PUBLICATIONS

International Search Report (Application No. PCT/IB2016/054254) dated Nov. 8, 2016.
(Continued)

*Primary Examiner* — Khaja Ahmad
(74) *Attorney, Agent, or Firm* — Fish & Richardson P.C.

(57) ABSTRACT

A highly reliable light-emitting device is provided. A yield in a manufacturing process of a light-emitting device is increased. A light-emitting device is provided in which a non-light-emitting portion having a frame-like shape outside a light-emitting portion includes a portion thinner than the light-emitting portion. A light-emitting element and a bonding layer are formed over a substrate. The light-emitting element is sealed by overlapping a pair of substrates and curing the bonding layer. Then, while the cured bonding layer is heated, pressure is applied to at least a portion of the non-light-emitting portion with a member having a projection.

6 Claims, 33 Drawing Sheets

Related U.S. Application Data of application No. 15/897,191, filed on Feb. 15, 2018, now Pat. No. 10,135,037, which is a division of application No. 15/220,455, filed on Jul. 27, 2016, now Pat. No. 9,917,282.

(52) U.S. Cl.
CPC ..... *H01L 2251/5338* (2013.01); *Y02E 10/549* (2013.01); *Y02P 70/50* (2015.11)

(56) References Cited

U.S. PATENT DOCUMENTS

| | | | |
|---|---|---|---|
| 6,823,153 B2 | 11/2004 | Ueno et al. | |
| 7,271,076 B2 | 9/2007 | Yamazaki et al. | |
| 7,566,633 B2* | 7/2009 | Koyama | H01L 27/283 438/149 |
| 7,611,965 B2 | 11/2009 | Suzuki et al. | |
| 7,667,549 B2 | 2/2010 | Endo | |
| 7,671,959 B2 | 3/2010 | Koo et al. | |
| 7,714,535 B2 | 5/2010 | Yamazaki et al. | |
| 7,736,964 B2 | 6/2010 | Yamamoto et al. | |
| 8,138,614 B2 | 3/2012 | Yamazaki et al. | |
| 8,222,666 B2 | 7/2012 | Hatano et al. | |
| 8,232,621 B2 | 7/2012 | Yamazaki et al. | |
| 8,237,248 B2 | 8/2012 | Yamazaki et al. | |
| 8,264,144 B2 | 9/2012 | Oikawa et al. | |
| 8,284,369 B2 | 10/2012 | Chida et al. | |
| 8,343,802 B2 | 1/2013 | Reynolds et al. | |
| 8,367,440 B2 | 2/2013 | Takayama et al. | |
| 8,372,668 B2 | 2/2013 | Hatano et al. | |
| 8,415,208 B2 | 4/2013 | Takayama et al. | |
| 8,432,254 B2 | 4/2013 | Koyama et al. | |
| 8,760,046 B2 | 6/2014 | Seo et al. | |
| 8,766,269 B2 | 7/2014 | Yamazaki et al. | |
| 8,956,891 B2 | 2/2015 | Chida | |
| 9,065,034 B2 | 6/2015 | Chida | |
| 9,088,006 B2 | 7/2015 | Yamazaki et al. | |
| 9,184,297 B2 | 11/2015 | Koezuka et al. | |
| 9,196,813 B2 | 11/2015 | Chida | |
| 9,269,914 B2 | 2/2016 | Yamazaki et al. | |
| 9,337,244 B2 | 5/2016 | Hatano et al. | |
| 9,437,831 B2 | 9/2016 | Yamazaki et al. | |
| 9,444,020 B2 | 9/2016 | Chida | |
| 9,548,393 B2 | 1/2017 | Koezuka et al. | |
| 9,559,316 B2 | 1/2017 | Yamazaki et al. | |
| 9,559,317 B2 | 1/2017 | Yamazaki et al. | |
| 9,773,998 B2 | 9/2017 | Chida et al. | |
| 9,780,219 B2 | 10/2017 | Koezuka et al. | |
| 9,793,509 B2 | 10/2017 | Jing et al. | |
| 9,905,696 B2 | 2/2018 | Koezuka et al. | |
| 9,978,981 B2 | 5/2018 | Chida | |
| 10,312,315 B2 | 6/2019 | Yamazaki et al. | |
| 10,347,768 B2 | 7/2019 | Koezuka et al. | |
| 10,355,067 B2 | 7/2019 | Yamazaki et al. | |
| 10,490,766 B2 | 11/2019 | Chida | |
| 10,686,157 B2 | 6/2020 | Chida et al. | |
| 10,693,010 B2 | 6/2020 | Koezuka et al. | |
| 10,734,596 B2 | 8/2020 | Chida | |
| 10,763,322 B2 | 9/2020 | Yamazaki et al. | |
| 10,854,697 B2 | 12/2020 | Yamazaki et al. | |
| 10,872,947 B2 | 12/2020 | Yamazaki et al. | |
| 10,879,331 B2 | 12/2020 | Yamazaki et al. | |
| 11,004,925 B2 | 5/2021 | Yamazaki et al. | |
| 2003/0162312 A1 | 8/2003 | Takayama et al. | |
| 2004/0099926 A1 | 5/2004 | Yamazaki et al. | |
| 2005/0156908 A1 | 7/2005 | Sato et al. | |
| 2007/0045621 A1 | 3/2007 | Suzuki et al. | |
| 2007/0152956 A1* | 7/2007 | Danner | G02F 1/1679 345/107 |
| 2007/0279571 A1* | 12/2007 | Koo | H01L 51/5246 349/190 |
| 2008/0079360 A1 | 4/2008 | Kubota | |
| 2009/0128019 A1 | 5/2009 | Schaepkens et al. | |
| 2009/0195147 A1 | 8/2009 | Song et al. | |
| 2009/0212297 A1 | 8/2009 | Watanabe et al. | |
| 2009/0239320 A1 | 9/2009 | Takayama et al. | |
| 2010/0001307 A1 | 1/2010 | Reynolds et al. | |
| 2010/0039802 A1 | 2/2010 | Tuan | |
| 2010/0075563 A1 | 3/2010 | Matsui et al. | |
| 2010/0163859 A1* | 7/2010 | Yamazaki | H01L 51/529 257/40 |
| 2010/0173555 A1 | 7/2010 | Nishi et al. | |
| 2010/0258346 A1 | 10/2010 | Chen et al. | |
| 2010/0264817 A1* | 10/2010 | Bouten | G02F 1/133305 313/512 |
| 2012/0217516 A1 | 8/2012 | Hatano et al. | |
| 2013/0299789 A1 | 11/2013 | Yamazaki et al. | |
| 2014/0065430 A1 | 3/2014 | Yamazaki et al. | |
| 2014/0118640 A1 | 5/2014 | Chen | |
| 2014/0268606 A1 | 9/2014 | Chen | |
| 2014/0339516 A1 | 11/2014 | Hu et al. | |
| 2015/0035001 A1 | 2/2015 | Yamazaki et al. | |
| 2015/0044792 A1 | 2/2015 | Aoyama et al. | |
| 2015/0155363 A1 | 6/2015 | Nakazawa et al. | |
| 2015/0325812 A1 | 11/2015 | Yamazaki et al. | |
| 2016/0111485 A1 | 4/2016 | Chida | |
| 2016/0226019 A1 | 8/2016 | Yamazaki et al. | |
| 2020/0313115 A1 | 10/2020 | Chida et al. | |
| 2020/0358023 A1 | 11/2020 | Chida | |
| 2021/0057582 A1 | 2/2021 | Koezuka et al. | |

FOREIGN PATENT DOCUMENTS

| | | |
|---|---|---|
| CN | 101083277 A | 12/2007 |
| CN | 101160001 A | 4/2008 |
| CN | 102867923 A | 1/2013 |
| CN | 104538564 A | 4/2015 |
| EP | 1760776 A | 3/2007 |
| JP | 63-105493 A | 5/1988 |
| JP | 63-245889 A | 10/1988 |
| JP | 03-266392 A | 11/1991 |
| JP | 2003-174153 A | 6/2003 |
| JP | 2003-229548 A | 8/2003 |
| JP | 2005-293946 A | 10/2005 |
| JP | 2007-096276 A | 4/2007 |
| JP | 2007-220402 A | 8/2007 |
| JP | 2008-091237 A | 4/2008 |
| JP | 2010-146924 A | 7/2010 |
| JP | 2012-059641 A | 3/2012 |
| JP | 2012-190794 A | 10/2012 |
| JP | 2012-216466 A | 11/2012 |
| JP | 2013-243041 A | 12/2013 |
| JP | 2014-154507 A | 8/2014 |
| JP | 2014-197522 A | 10/2014 |
| JP | 2014-222659 A | 11/2014 |
| KR | 2003-0044840 A | 6/2003 |
| KR | 2008-0031115 A | 4/2008 |
| KR | 2014-0052969 A | 5/2014 |
| TW | 200300610 | 6/2003 |
| TW | 200824489 | 6/2008 |
| TW | 201037799 | 10/2010 |
| TW | 201244204 | 11/2012 |
| TW | 201409708 | 3/2014 |
| TW | 201414042 | 4/2014 |
| TW | 201442303 | 11/2014 |
| TW | 201515213 | 4/2015 |
| TW | 201523877 | 6/2015 |
| TW | 201523961 | 6/2015 |
| WO | WO-2008/009929 | 1/2008 |
| WO | WO-2010/007656 | 1/2010 |
| WO | WO-2011/096308 | 8/2011 |
| WO | WO-2012/115016 | 8/2012 |
| WO | WO-2014/013959 | 1/2014 |
| WO | WO-2015/079360 | 6/2015 |
| WO | WO-2015/083029 | 6/2015 |

OTHER PUBLICATIONS

Written Opinion (Application No. PCT/IB2016/054254) dated Nov. 8, 2016.

Chinese Office Action (Application No. 201680044762.9) dated Mar. 13, 2020.

(56) References Cited

OTHER PUBLICATIONS

Taiwanese Office Action (Application No. 105123632) dated Jul. 14, 2021.

* cited by examiner

S2-6A

S2-8A

<u>S3-2</u>

<u>S3-4</u>

<u>S3-6</u>

<u>S3-10A</u>

<u>S3-12A</u>

S3-9B

S3-10B

S3-12A

S3-12C

S3-11D

S3-12D

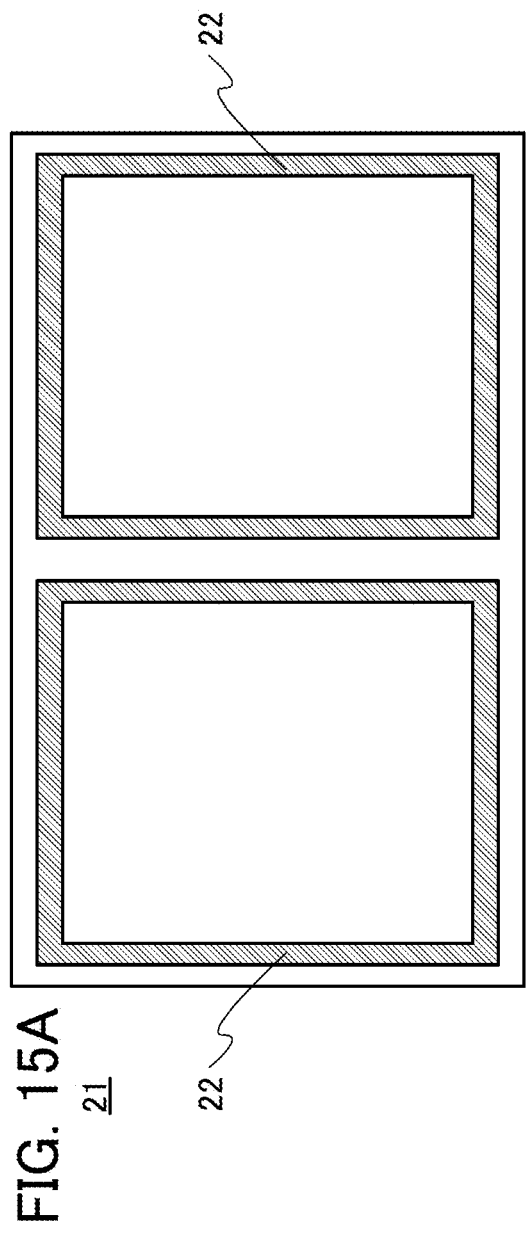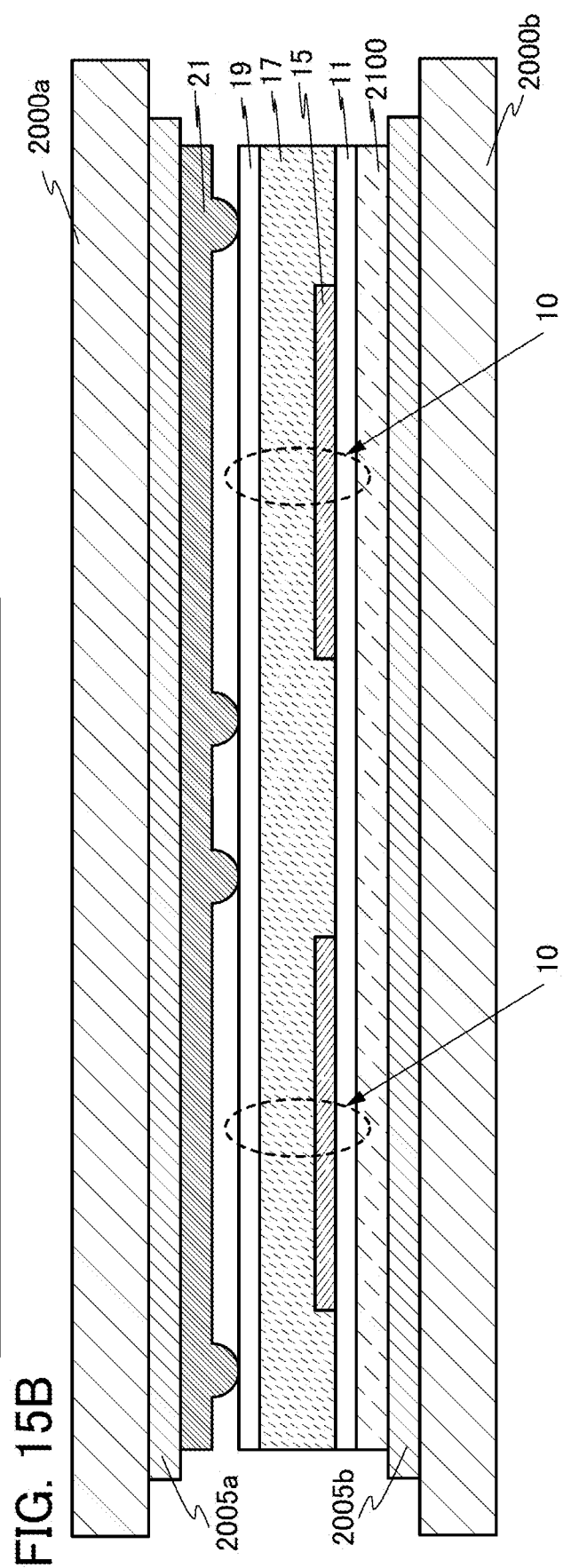

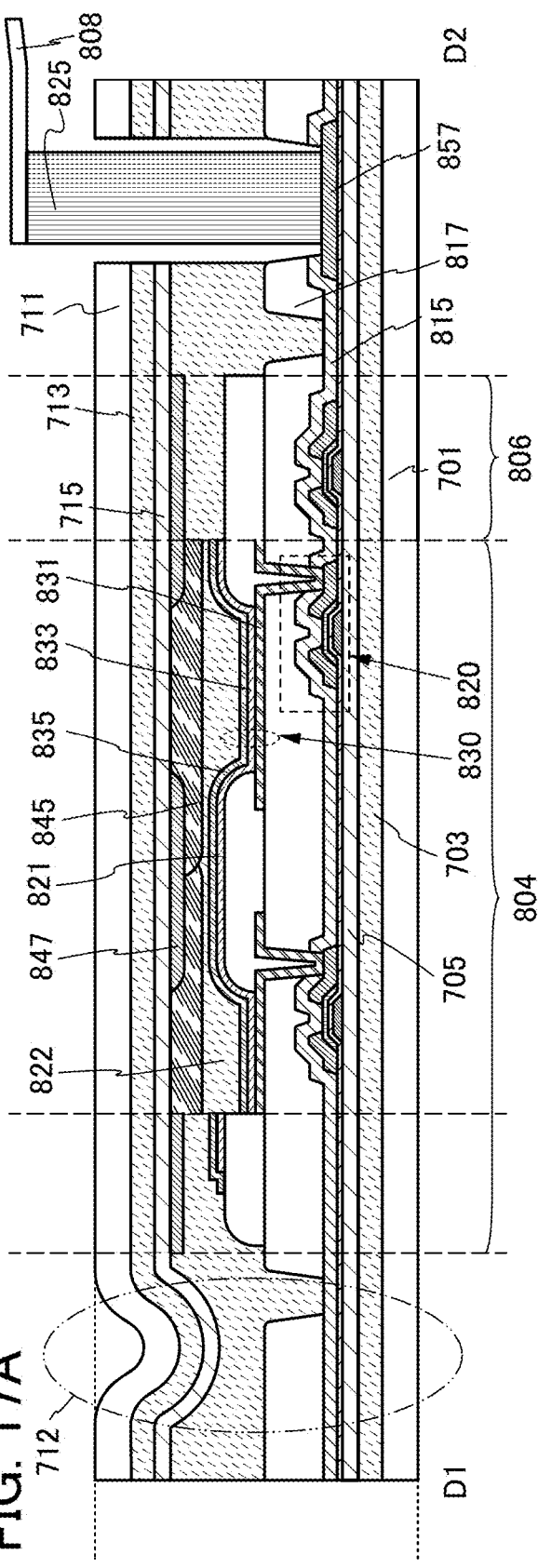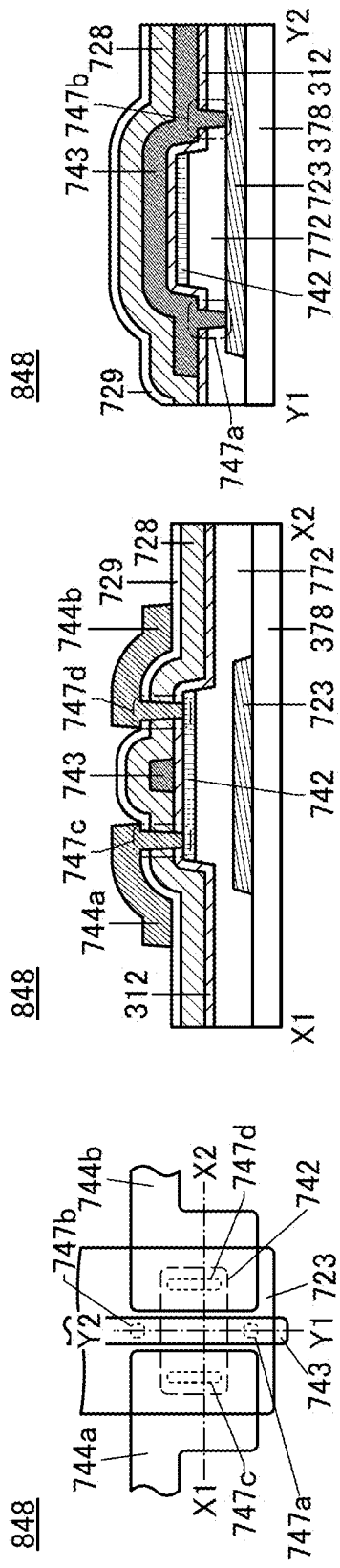

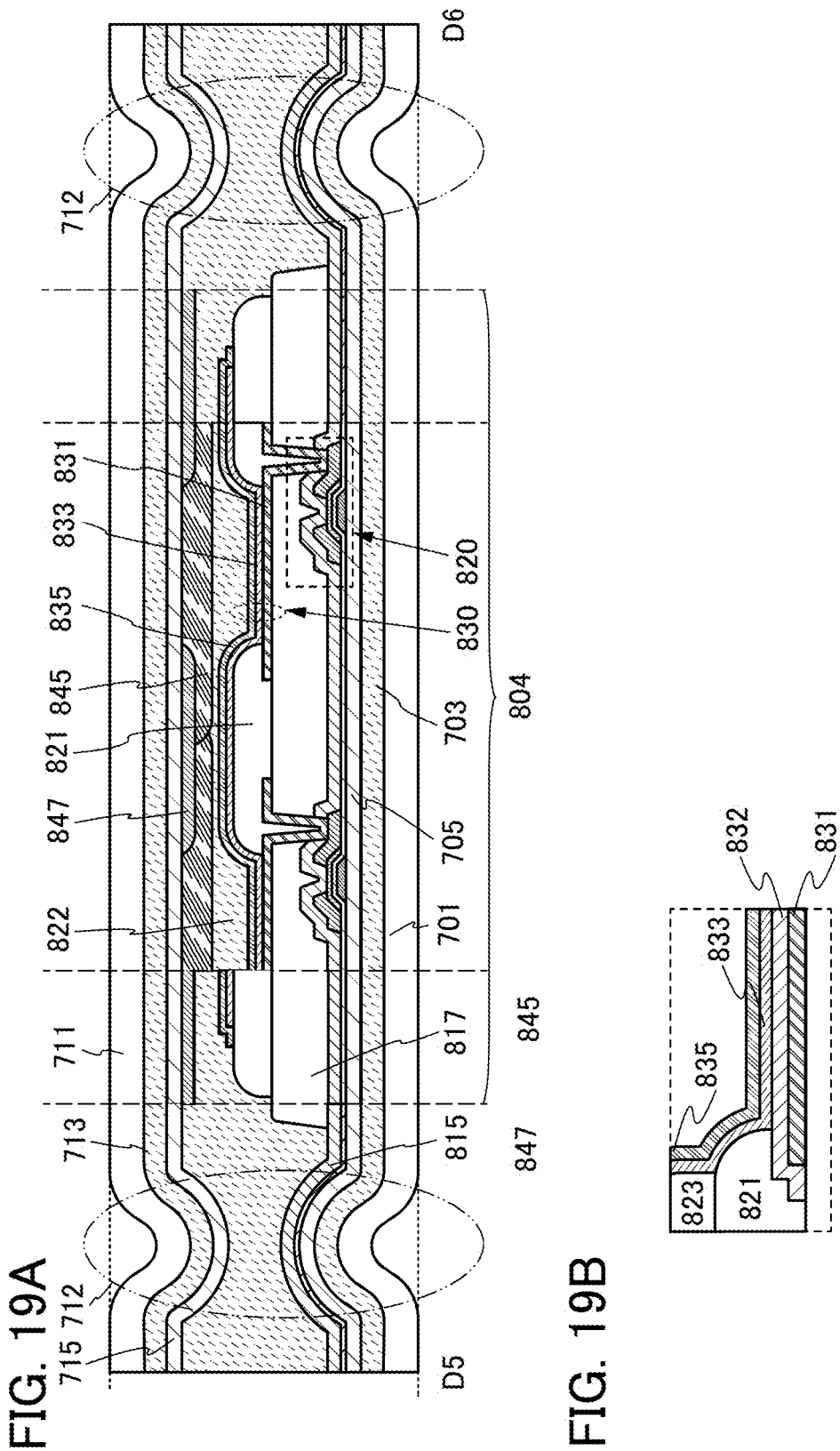

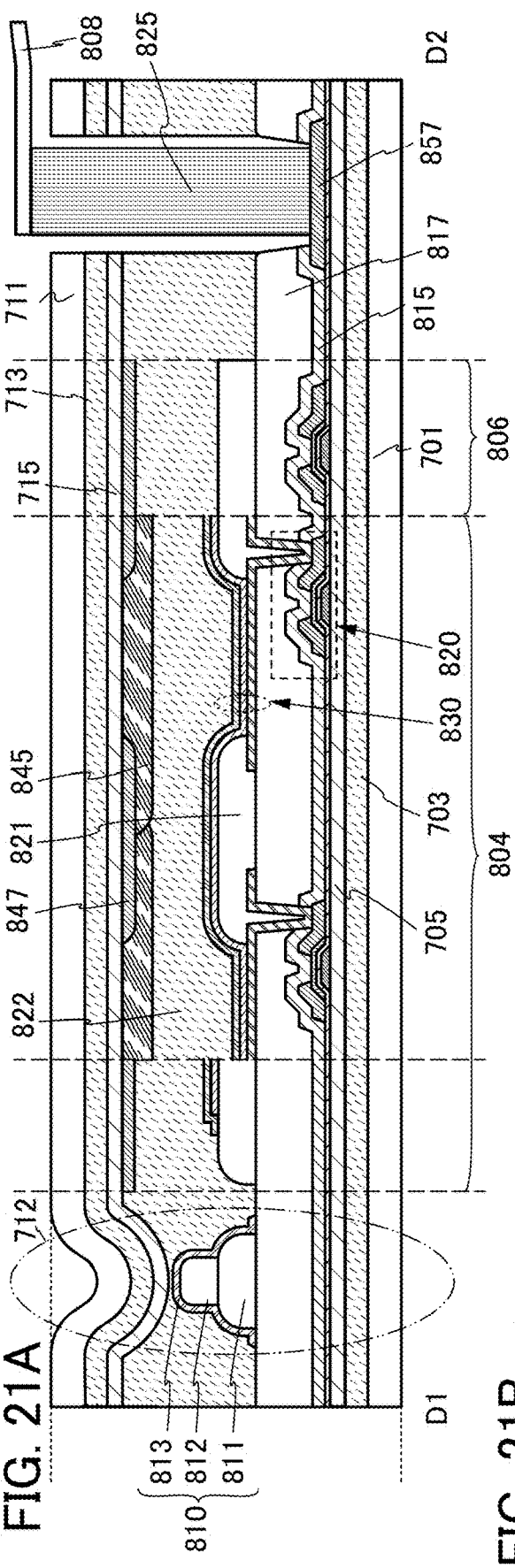

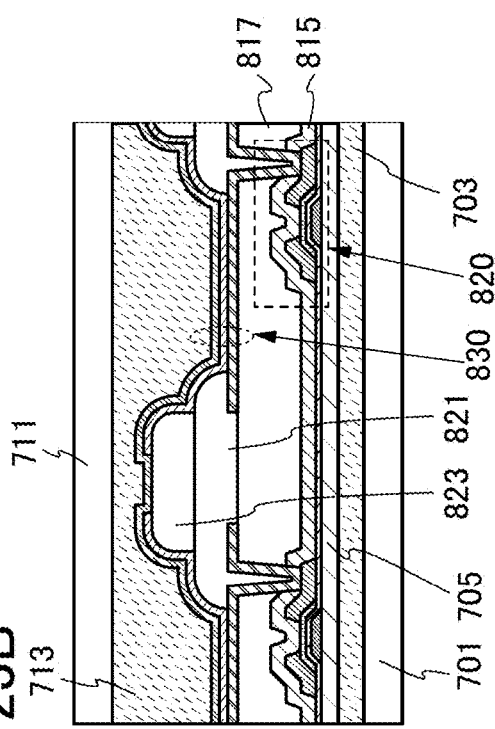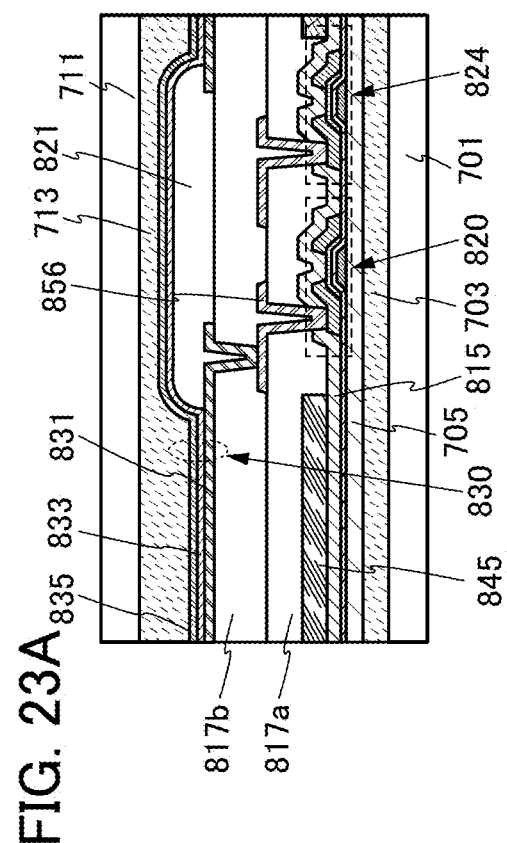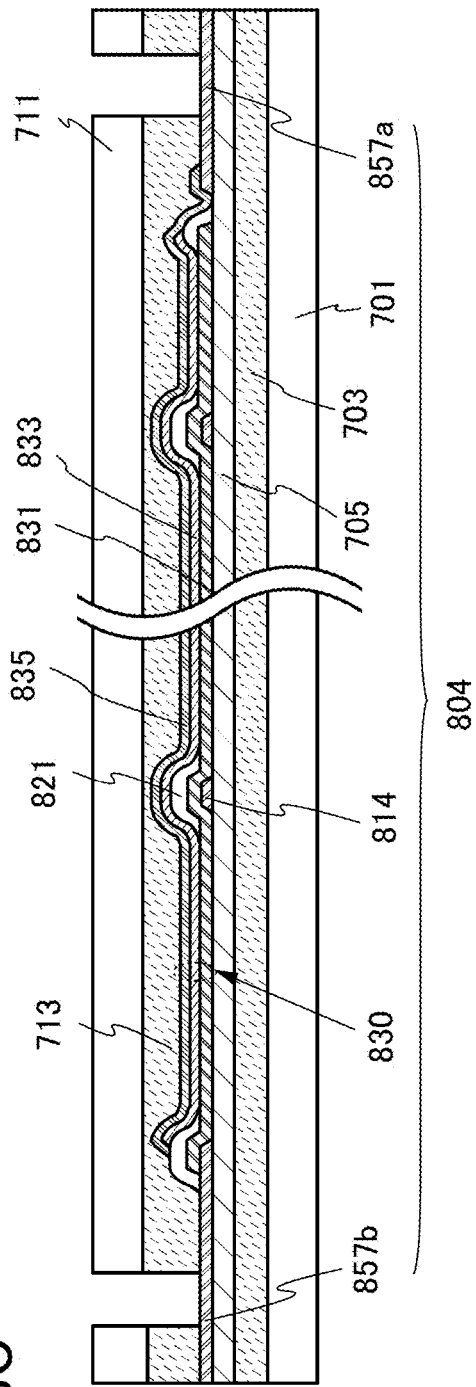
FIG. 23A
FIG. 23B
FIG. 23C

FIG. 28A
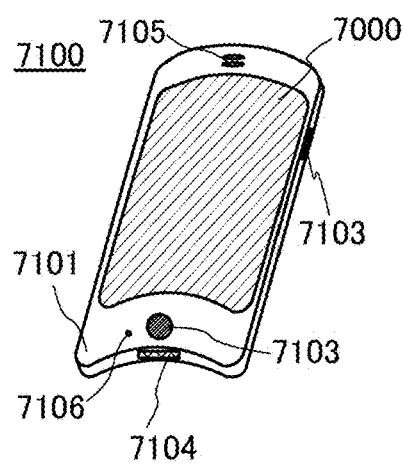
FIG. 28B
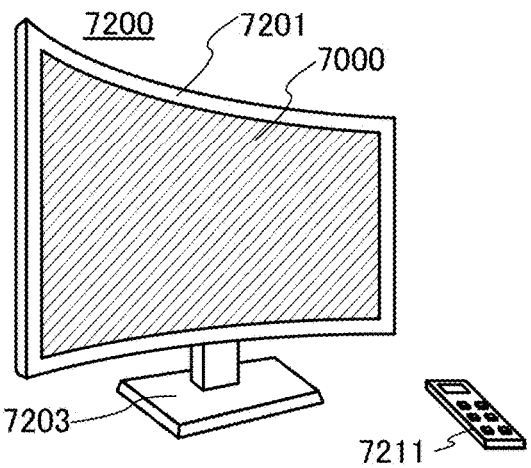
FIG. 28C1
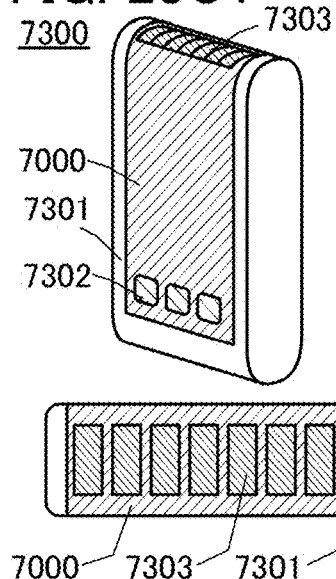
FIG. 28D
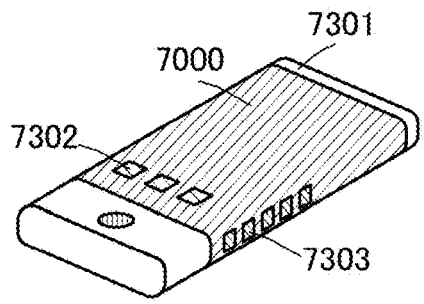
FIG. 28E
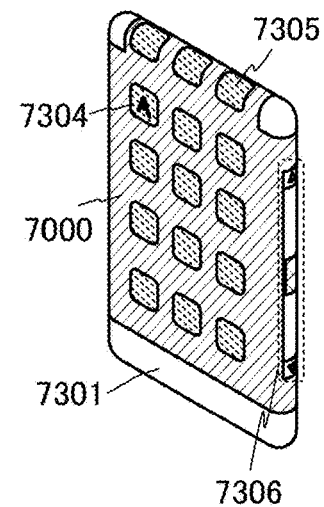
FIG. 28C2
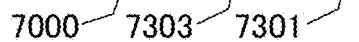
FIG. 28F
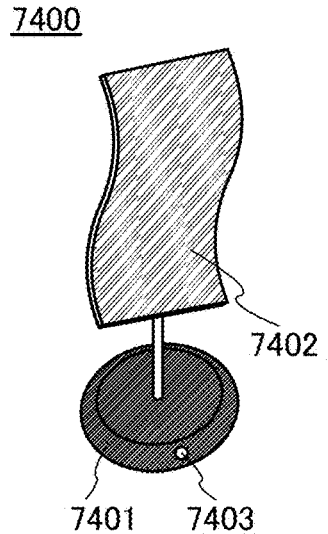
FIG. 28G
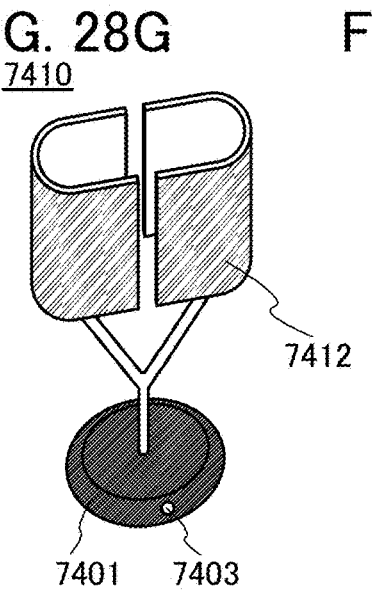
FIG. 28H
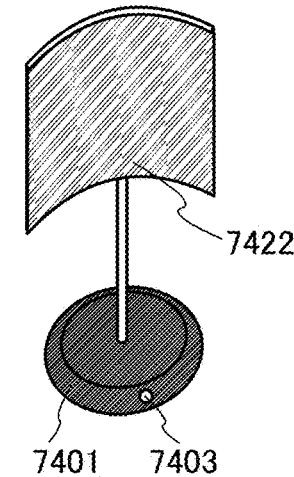

FIG. 29A1
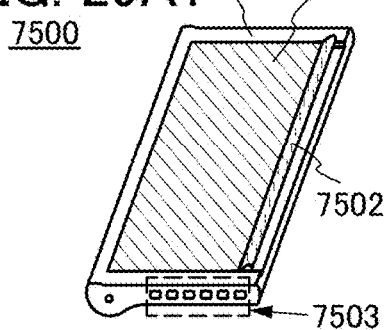
FIG. 29B
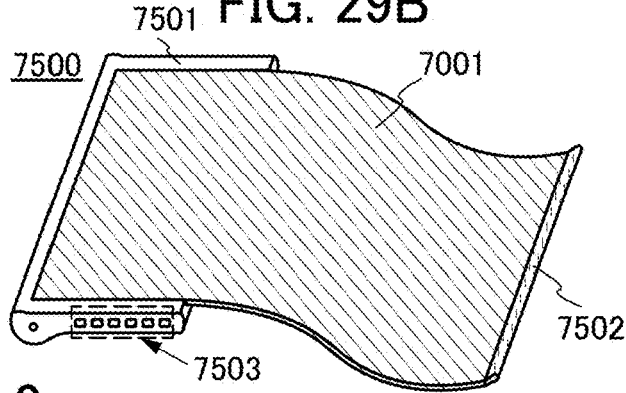
FIG. 29A2
FIG. 29C
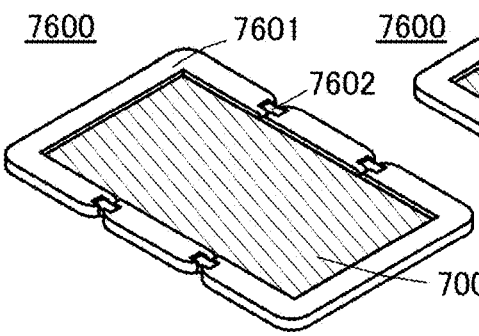
FIG. 29D
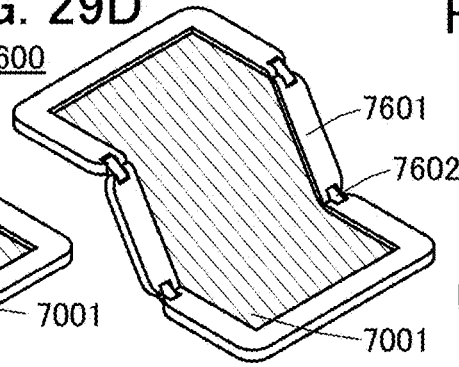
FIG. 29E
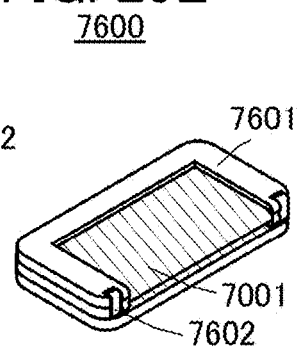
FIG. 29F
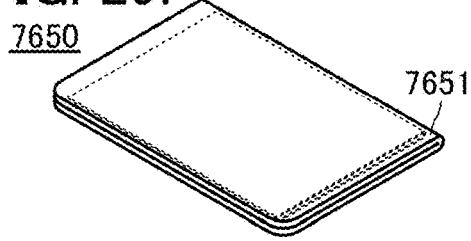
FIG. 29G
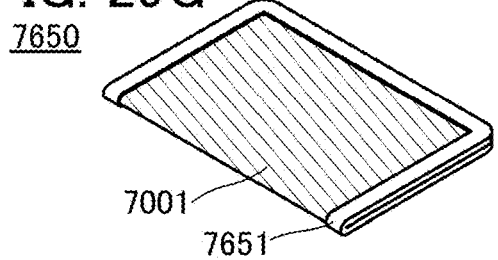
FIG. 29H
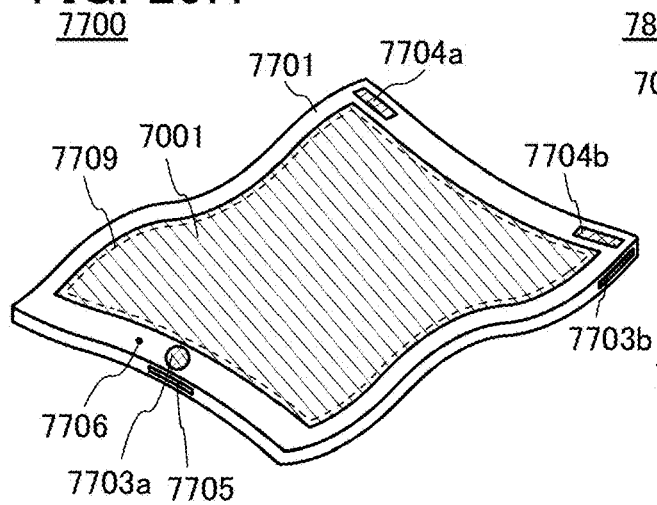
FIG. 29I
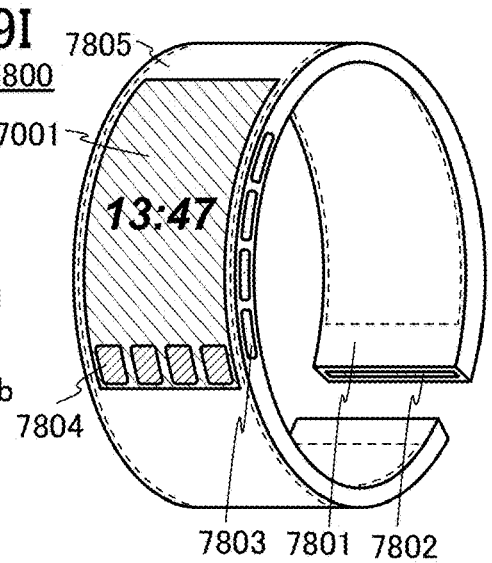

FIG. 32A a plan-view TEM image

FIG. 32B a cross-sectional TEM image

MANUFACTURING METHOD OF LIGHT-EMITTING DEVICE, LIGHT-EMITTING DEVICE, MODULE, AND ELECTRONIC DEVICE

CROSS-REFERENCE TO RELATED APPLICATIONS

This application is a divisional of U.S. application Ser. No. 16/178,656, filed Nov. 2, 2018, now allowed, which is a divisional of U.S. application Ser. No. 15/897,191, filed Feb. 15, 2018, now U.S. Pat. No. 10,135,037, which is a divisional of U.S. application Ser. No. 15/220,455, filed Jul. 27, 2016, now U.S. Pat. No. 9,917,282, which claims the benefit of foreign priority applications filed in Japan as Serial No. 2015-150777 on Jul. 30, 2015, and Serial No. 2016-119834 on Jun. 16, 2016, all of which are incorporated by reference.

TECHNICAL FIELD

One embodiment of the present invention relates to a light-emitting device, a module, an electronic device, and a manufacturing method thereof. In particular, one embodiment of the present invention relates to a light-emitting device utilizing organic electroluminescence (EL), and a manufacturing method thereof.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (such as a touch sensor), an input/output device (such as a touch panel), a method for driving any of them, and a method for manufacturing any of them.

BACKGROUND ART

Recent light-emitting devices are expected to be applied to a variety of uses and become diversified.

For example, light-emitting devices for mobile devices and the like are required to be thin, lightweight, and less likely to be broken.

Light-emitting elements utilizing EL (also referred to as EL elements) have features such as ease of thinning and lightening, high-speed response to input signal, and driving with a direct-current low voltage source; therefore, application of the light-emitting elements to light-emitting devices has been proposed.

For example, Patent Document 1 discloses a flexible active matrix light-emitting device in which an organic EL element and a transistor serving as a switching element are provided over a film substrate.

An organic EL element has a problem in that entry of impurities such as moisture or oxygen from the outside erodes the reliability.

When impurities such as moisture or oxygen enter an organic compound or a metal material contained in an organic EL element from the outside of the organic EL element, the lifetime of the organic EL element is significantly shortened in some cases. This is because the organic compound or the metal material contained in the organic EL element reacts with the impurities and thus deteriorates.

Thus, a technique to seal an organic EL element for preventing entry of impurities has been researched and developed. [Patent Document]

[Patent Document 1] Japanese Published Patent Application No. 2014-197522

DISCLOSURE OF INVENTION

An object of one embodiment of the present invention is to improve the reliability of a light-emitting device. An object of one embodiment of the present invention is to increase a yield in a manufacturing process of a light-emitting device.

An object of one embodiment of the present invention is to provide a light-emitting device with a curved surface. An object of one embodiment of the present invention is to provide a flexible light-emitting device. An object of one embodiment of the present invention is to provide a light-weight light-emitting device. An object of one embodiment of the present invention is to provide a thin light-emitting device. An object of one embodiment of the present invention is to provide a novel light-emitting device or the like.

Note that the descriptions of these objects do not disturb the existence of other objects. In one embodiment of the present invention, there is no need to achieve all the objects. Other objects can be derived from the description of the specification, the drawings, and the claims.

One embodiment of the present invention is a method for manufacturing a light-emitting device which includes a light-emitting portion including a light-emitting element and a non-light-emitting portion having a frame-like shape outside the light-emitting portion. The non-light-emitting portion preferably includes a spacer and an inorganic insulating layer.

A method a for manufacturing a light-emitting device in one embodiment of the present invention includes a first step of forming a light-emitting element over a first substrate, a second step of forming a bonding layer over the first substrate or a second substrate, a third step of overlapping the first substrate and the second substrate so as to position the light-emitting element in a space surrounded by the bonding layer, the first substrate, and the second substrate, a fourth step of curing the bonding layer, and a fifth step of applying pressure to at least a portion of a non-light-emitting portion with a member having a projection while heating the bonding layer after curing the bonding layer.

In the manufacturing method a, it is preferable to form a spacer and an inorganic insulating layer covering a side surface and a top surface of the spacer over the first substrate or the second substrate before the second step. In the fifth step of the manufacturing method a, the projection preferably overlaps with the inorganic insulating layer.

A method b for manufacturing a light-emitting device in one embodiment of the present invention includes a first step of forming a separation layer over a first substrate, a second step of forming a layer to be separated over the separation layer, a third step of forming a bonding layer over the first substrate or a second substrate, a fourth step of overlapping the first substrate and the second substrate, a fifth step of curing the bonding layer, a sixth step of separating the first substrate and the layer to be separated from each other, and a seventh step of applying pressure to at least a portion of a non-light-emitting portion with a member having a projection while heating the bonding layer after curing the bonding layer. In the second step of the manufacturing method b, an insulating layer over the separation layer and a light-emitting element over the insulating layer are formed as the layer to be separated. In the third step of the manufacturing method b, the bonding layer is formed to overlap with the separation layer and the layer to be separated. In the fourth step of the manufacturing method b, the light-emitting element is positioned in a space surrounded by the bonding layer, the first substrate, and the second substrate.

The manufacturing method b may include a step of attaching a third substrate to the separated layer between the sixth step and the seventh step. Alternatively, the manufacturing method b may include the step of attaching the third substrate to the separated layer after the seventh step.

In the manufacturing method b, it is preferable to form a spacer and an inorganic insulating layer covering a side surface and a top surface of the spacer over the first substrate or the second substrate before the third step. In the seventh step of the manufacturing method b, the projection preferably overlaps with the inorganic insulating layer.

A method c for manufacturing a light-emitting device in one embodiment of the present invention includes a first step of forming a first separation layer over a first substrate, a second step of forming a first layer to be separated over the first separation layer, a third step of forming a second separation layer over a second substrate, a fourth step of forming a second layer to be separated over the second separation layer, a fifth step of forming a bonding layer over the first substrate or the second substrate, a sixth step of overlapping the first substrate and the second substrate, a seventh step of curing the bonding layer, an eighth step of separating the first substrate and the first layer to be separated from each other, a ninth step of attaching a third substrate to the first separated layer, a tenth step of separating the second substrate and the second layer to be separated from each other, and an eleventh step of applying pressure to at least a portion of a non-light-emitting portion with a member having a projection while heating the bonding layer after curing the bonding layer. In the manufacturing method c, an insulating layer and a light-emitting element over the insulating layer are formed as the first layer to be separated or the second layer to be separated. In the fifth step of the manufacturing method c, the bonding layer is formed to overlap with the first separation layer and the first layer to be separated. In the sixth step of the manufacturing method c, the light-emitting element is positioned in a space surrounded by the bonding layer, the first substrate, and the second substrate.

The manufacturing method c may include a step of attaching a fourth substrate to the second separated layer between the tenth step and the eleventh step. Alternatively, the manufacturing method c may include the step of attaching the fourth substrate to the second separated layer after the eleventh step.

The manufacturing method c preferably includes the step of forming a partition over the first substrate or the second substrate before the sixth step. The partition is formed to surround the bonding layer.

In the manufacturing method c, it is preferable to form a spacer and an inorganic insulating layer covering a side surface and a top surface of the spacer over the first substrate or the second substrate before the fifth step. In the eleventh step of the manufacturing method c, the projection preferably overlaps with the inorganic insulating layer.

A light-emitting device in one embodiment of the present invention includes a light-emitting portion and a non-light-emitting portion having a frame-like shape outside the light-emitting portion. The light-emitting device includes a first flexible substrate, a second flexible substrate, a first bonding layer, a second bonding layer, a first insulating layer, and a first functional layer. The first bonding layer is positioned between the first flexible substrate and the first insulating layer. The second bonding layer is positioned between the second flexible substrate and the first insulating layer. The first functional layer is positioned between the second bonding layer and the first insulating layer. The first bonding layer and the second bonding layer partly overlap with each other with the first insulating layer provided therebetween. The light-emitting portion includes a light-emitting element in the first functional layer. The non-light-emitting portion includes a spacer and an inorganic insulating layer in the first functional layer. The inorganic insulating layer covers a side surface and a top surface of the spacer. A gap between the first flexible substrate and the second flexible substrate is smaller in a first portion of the non-light-emitting portion than in the light-emitting portion. The first portion preferably includes the inorganic insulating layer.

One embodiment of the present invention is a module including any of the light-emitting devices in the above embodiments. The module is provided with a connector such as a flexible printed circuit (hereinafter also referred to as an FPC) or a tape carrier package (TCP) or is mounted with an integrated circuit (IC) by a chip on glass (COG) method, a chip on film (COF) method, or the like.

Any of the above embodiments of the present invention may be applied to a display device or an input/output device (such as a touch panel) instead of the light-emitting device.

One embodiment of the present invention is an electronic device including the above-mentioned module and at least one of an antenna, a battery, a housing, a camera, a speaker, a microphone, and an operation button.

One embodiment of the present invention can improve the reliability of a light-emitting device. One embodiment of the present invention can increase a yield in a manufacturing process of a light-emitting device.

One embodiment of the present invention can provide a light-emitting device with a curved surface. One embodiment of the present invention can provide a flexible light-emitting device. One embodiment of the present invention can provide a lightweight light-emitting device. One embodiment of the present invention can provide a thin light-emitting device. One embodiment of the present invention can provide a novel light-emitting device or the like.

Note that the descriptions of these effects do not disturb the existence of other effects. One embodiment of the present invention does not necessarily achieve all the effects. Other effects can be derived from the description of the specification, the drawings, and the claims.

BRIEF DESCRIPTION OF DRAWINGS

FIGS. 15A and 15B are a top view of a member having a projection and a cross-sectional view illustrating a method for manufacturing a light-emitting device.

FIGS. 17A to 17D are a cross-sectional view illustrating an example of a light-emitting device and a top view and cross-sectional views illustrating an example of a transistor.

FIGS. 19A and 19B are cross-sectional views illustrating an example of a light-emitting device.

FIGS. 20A and 20B are cross-sectional views each illustrating an example of a light-emitting device.

FIGS. 21A and 21B are cross-sectional views each illustrating an example of a light-emitting device.

FIGS. 23A to 23C are cross-sectional views each illustrating an example of a light-emitting device.

FIGS. 28A, 28B, 28C1, 28C2, 28D, 28E, 28F, 28G, and 28H illustrate examples of electronic devices and lighting devices.

FIGS. 29A1, 29A2, 29B, 29C, 29D, 29E, 29F, 29G, 29H, and 29I illustrate examples of electronic devices.

FIGS. 32A and 32B are TEM images of samples and FIGS. 32C to 32L are electron diffraction patterns thereof.

BEST MODE FOR CARRYING OUT THE INVENTION

Figure 1A:
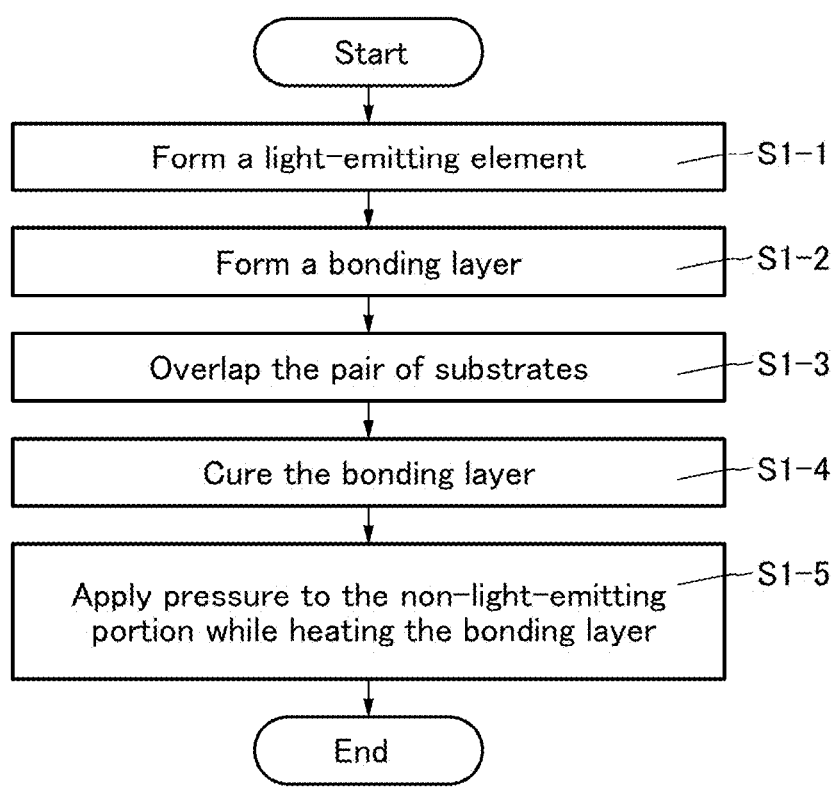
FIGS. 1A to 1E are a flowchart and cross-sectional views illustrating an example of a method for manufacturing a light-emitting device.

Embodiments will be described in detail with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments.

Note that in the structures of the invention described below, the same portions or portions having similar functions are denoted by the same reference numerals in different drawings, and description of such portions is not repeated. Furthermore, the same hatch pattern is applied to similar functions, and these are not especially denoted by reference numerals in some cases.

In addition, the position, size, range, or the like of each structure illustrated in drawings is not accurately represented in some cases for easy understanding. Therefore, the disclosed invention is not necessarily limited to the position, size, range, or the like disclosed in the drawings.

Note that the terms "film" and "layer" can be interchanged with each other depending on the case or circumstances. For example, the term "conductive layer" can be changed into the term "conductive film." Also, the term "insulating film" can be changed into the term "insulating layer."

Embodiment 1

In this embodiment, a light-emitting device of one embodiment of the present invention and a manufacturing method thereof will be described with reference to FIGS. 1A to 1E, FIGS. 2A to 2G, FIGS. 3A to 3G, FIGS. 4A to 4D, FIGS. 5A to 5F, FIGS. 6A to 6D, FIG. 7, FIGS. 8A to 8E, FIGS. 9A to 9E, FIGS. 10A and 10B, FIGS. 11A to 11D, FIGS. 12A to 12H, FIGS. 13A and 13B, FIGS. 14A to 14G, and FIGS. 15A and 15B.

Alight-emitting device including an EL element is mainly described in this embodiment as an example; however, one embodiment of the present invention is not limited to this example. A light-emitting device or a display device including another light-emitting element or display element is also one embodiment of the present invention. Moreover, one embodiment of the present invention is not limited to the light-emitting device or the display device and can be applied to a variety of devices such as a semiconductor device and an input/output device.

The light-emitting device of one embodiment of the present invention includes a light-emitting portion and a non-light-emitting portion. The light-emitting portion includes a light-emitting element. The non-light-emitting portion is provided outside the light-emitting portion so as to have a frame-like shape.

In some cases, a functional element (e.g., a light-emitting element or a transistor) included in a light-emitting device deteriorates because of entry of impurities such as moisture from the outside, which might reduce the reliability. Entry of impurities in the thickness direction of the light-emitting device (i.e., entry through a light-emitting surface and a surface facing the light-emitting surface) can be minimized by providing the functional element between a pair of layers (substrates, insulating layers, or the like) with an excellent gas barrier property. At a side surface of the light-emitting device, a bonding layer for sealing the light-emitting element or the like is exposed to the air. When a resin is used for the bonding layer, for example, it is possible to achieve higher impact resistance, higher heat resistance, and greater robustness against deformation due to external force or the like than when a glass frit or the like is used. The use of a resin for the bonding layer can increase the flexibility and the resistance to bending of the light-emitting device. On the other hand, a resin has an insufficient gas barrier property, water-resistant property, or moisture-resistant property in some cases.

In view of the above, in one embodiment of the present invention, the non-light-emitting portion of the light-emitting device has a portion whose thickness is smaller than that of the light-emitting portion.

When the light-emitting device (or the bonding layer) has a region having a smaller thickness than other portions, impurities such as moisture entering through a side surface of the light-emitting device do not easily pass through the region. As a result, the impurities are less likely to reach the functional element than when the light-emitting device (or the bonding layer) has a uniform thickness, and a reduction in reliability of the light-emitting device can be inhibited.

In one embodiment of the present invention, the reliability of the light-emitting device can be improved by changing its shape (or the thickness of the bonding layer), which allows the material used for the bonding layer to be selected from a wider range of options. For example, a light-emitting device having a long lifetime can be manufactured even when a resin is used for the bonding layer.

Note that the thinner region may be locally provided in the non-light-emitting portion. Alternatively, the thickness may decrease in a continuous (smooth) manner from the light-emitting portion side of the non-light-emitting portion to an end portion of the light-emitting device.

Examples of the manufacturing method of the light-emitting device of one embodiment of the present invention are described below.

<Manufacturing Method 1>

FIG. 1A illustrates a flowchart of a manufacturing method 1 of the light-emitting device.

[S1-1: Form a Light-Emitting Element]

Figure 1B:
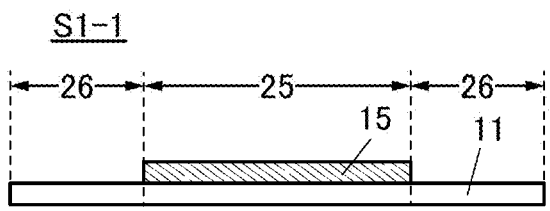

First, a pair of substrates (a substrate 11 and a substrate 19) are prepared. Next, a light-emitting element 15 is formed over the substrate 11 (FIG. 1B). In FIG. 1B and the like, a portion where the light-emitting element 15 is provided over the substrate 11 is illustrated as a light-emitting portion 25, and a portion other than the light-emitting portion 25 is illustrated as a non-light-emitting portion 26.

As the pair of substrates, substrates having at least heat resistance high enough to withstand process temperature in a manufacturing process are used. A material such as glass, quartz, sapphire, ceramic, an organic resin, a metal, an alloy, or a semiconductor can be used for the pair of substrates. The substrate on the side from which light from the light-emitting element is extracted is formed using a material which transmits the light.

A substrate having flexibility (hereinafter referred to as a flexible substrate) is preferably used as each of the pair of substrates. For example, an organic resin; or glass, a metal, or an alloy that is thin enough to have flexibility can be used. For example, the thickness of the flexible substrate is preferably greater than or equal to 1 μm and less than or equal to 200 μm, further preferably greater than or equal to 1 μm and less than or equal to 100 μm, still further preferably greater than or equal to 10 μm and less than or equal to 50 μm, yet further preferably greater than or equal to 10 μm and less than or equal to 25 μm. The thickness and hardness of the flexible substrate are set in the range where mechanical strength and flexibility can be balanced against each other. The flexible substrate may have a single-layer structure or a stacked-layer structure.

Examples of materials for metal substrates include aluminum, copper, nickel, and the like. Examples of materials for alloy substrates include an aluminum alloy, stainless steel, and the like. Examples of materials for semiconductor substrates include silicon and the like.

Examples of materials having flexibility and a light-transmitting property include polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (such as nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, and an ABS resin. In particular, a material having a low coefficient of linear expansion is preferable, and for example, a polyamide-imide resin, a polyimide resin, a polyamide resin, or PET can be suitably used. A substrate in which a fibrous body is impregnated with a resin (also referred to as prepreg) or a substrate whose coefficient of linear expansion is reduced by mixing an inorganic filler with an organic resin can also be used.

As the light-emitting element 15, a self-luminous element can be used, and an element whose luminance is controlled by current or voltage is included in the category of the light-emitting element. For example, a light-emitting diode (LED), an organic EL element, an inorganic EL element, or the like can be used. Note that one embodiment of the present invention is not limited to the light-emitting device and can be applied to display devices including various display elements. For example, instead of the light-emitting element, a liquid crystal element, an electrophoretic element, a display element using micro electro mechanical systems (MEMS), or the like can be used in a display device.

In addition to the light-emitting element 15, one or more of various functional elements such as a transistor, a resistor, a switching element, and a capacitor can be formed over the substrate 11.

A region where a functional element is provided is not limited to the light-emitting portion 25. For example, one or more of a signal line driver circuit, a scan line driver circuit, an external connection electrode, and the like can be formed in the non-light-emitting portion 26. The external connection electrode is electrically connected to an external input terminal through which a signal (e.g., a video signal, a clock signal, a start signal, or a reset signal) or a potential from the outside is transmitted.

[S1-2: Form a Bonding Layer]

Next, a bonding layer 17 is formed over the substrate 11 or the substrate 19.

The thickness of the bonding layer 17 can be greater than or equal to 1 μm and less than or equal to 200 μm, preferably greater than or equal to 1 μm and less than or equal to 100 μm, further preferably greater than or equal to 1 μm and less than or equal to 50 μm, for example.

There is no particular limitation on methods for forming the bonding layer 17; for example, a droplet discharge method, a printing method (a screen printing method or an offset printing method), a coating method such as a spin coating method or a spray coating method, a dipping method, a dispenser method, or a nanoimprint method can be employed.

As the glass transition temperature of an adhesive used for the bonding layer 17 decreases, the bonding layer 17 becomes more easily depressed when pressure is applied to the bonding layer 17 in a later step. Therefore, a portion where the bonding layer 17 is extremely thin can be easily formed in the light-emitting device, and the reliability of the light-emitting device can be improved. On the other hand, as the glass transition temperature of the adhesive used for the bonding layer 17 increases, the heat resistance of the light-emitting device increases. Therefore, the glass transition temperature of the adhesive used for the bonding layer 17 is preferably higher than or equal to 60° C. and lower than or equal to 120° C., further preferably higher than or equal to 80° C. and lower than or equal to 100° C.

The bonding layer 17 preferably has thermoplasticity as described later.

A thermosetting adhesive or a UV delay curing adhesive is preferably used for the bonding layer 17. Any of various curable adhesives, e.g., a photocurable adhesive such as an ultraviolet curable adhesive, a reactive curable adhesive, and an anaerobic adhesive can also be used. Examples of resins included in the adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred.

Furthermore, the resin may include a drying agent. As the drying agent, for example, a substance that adsorbs moisture by chemical adsorption, such as an oxide of an alkaline earth metal (e.g., calcium oxide or barium oxide), can be used. Alternatively, a substance that adsorbs moisture by physical adsorption, such as zeolite or silica gel, may be used. The drying agent is preferably included, in which case it can suppress deterioration of the functional element due to entry of moisture in the air and can improve the reliability of the light-emitting device.

The above resin may include a leveling agent or a surface-active agent.

When a leveling agent or a surface-active agent is added to the resin, surface tension of the resin can be reduced and the wettability thereof can be increased. High wettability allows uniform application of the resin. Accordingly, inclusion of bubbles at the time of attachment of the pair of substrates can be inhibited, and the probability of a cohesive failure of the bonding layer and interfacial failure between the bonding layer and a layer to be bonded can be reduced. Display defects of the light-emitting device can also be inhibited.

As the leveling agent or the surface-active agent, a material that does not adversely affect the light-emitting element and the like is used. For example, an epoxy resin to which a fluorine-based leveling agent is added at greater than or equal to 0.01 wt % and less than or equal to 0.5 wt % may be used.

In addition, a filler with a high refractive index or a light-scattering member may be mixed into the resin, in which case the efficiency of light extraction from the light-emitting element can be improved. For example, titanium oxide, barium oxide, zeolite, zirconium, or the like can be used.

[S1-3: Overlap the Pair of Substrates]

Figure 1D:
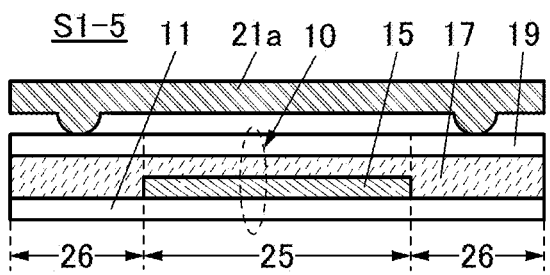
Figure 1C:
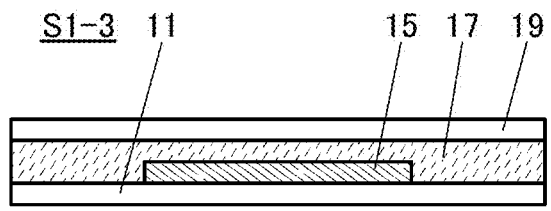

Next, the substrate 11 and the substrate 19 are overlapped such that the light-emitting element 15 is positioned in a space surrounded by the bonding layer 17, the substrate 11, and the substrate 19 (FIG. 1C). In terms of reliability of the light-emitting device, this step is preferably performed in a reduced-pressure atmosphere.

[S1-4: Cure the Bonding Layer]

Next, the bonding layer 17 is cured.

[S1-5: Apply Pressure to the Non-Light-Emitting Portion while Heating the Bonding Layer]

Next, while the bonding layer 17 is heated, pressure is applied to at least a portion of the non-light-emitting portion 26 by using a member 21a having a projection (FIG. 1D).

Figure 1E:
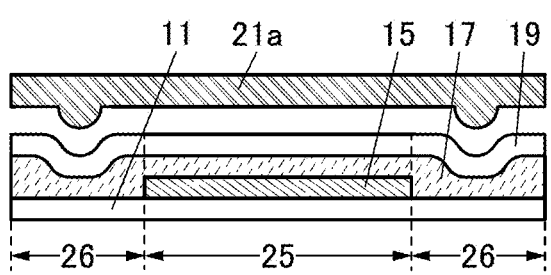

The bonding layer 17 becomes thinner at the portion to which pressure is applied than at the other portion (FIG. 1E). It can also be said that the gap between the substrate 11 and the substrate 19 becomes narrower in a portion of the non-light-emitting portion 26 than in the light-emitting portion 25.

Examples of conditions under which impurities entering through a side surface of the light-emitting device do not easily reach the light-emitting element 15 include a small minimum thickness of the light-emitting device, a small minimum gap between the substrate 11 and the substrate 19, and a small minimum thickness of the bonding layer 17. In one embodiment of the present invention, a purpose of the step of applying pressure to the non-light-emitting portion is to decrease at least one of these three minimum values.

Note that an uneven thickness of the light-emitting portion 25 might result in degradation of display quality. In one embodiment of the present invention, the bonding layer 17 is changed in shape after being cured once. After being cured, the bonding layer 17 is more rigid or less fluid than before being cured. Therefore, the bonding layer 17 can be locally changed in shape by using the member 21a having the projection. The shape-changing region of the bonding layer 17 in the non-light-emitting portion 26 does not expand excessively beyond an area to which pressure is directly applied with the projection. Therefore, the thinned region of the bonding layer 17 can be kept within the non-light-emitting portion, and the thickness of the light-emitting portion 25 does not easily become uneven. In one embodiment of the present invention, the reliability of the light-emitting device can be improved, and a decrease in viewing angle characteristics and a degradation of display quality of the light-emitting device can be suppressed.

A resin having thermoplasticity (hereinafter referred to as a thermoplastic resin) is preferably used for the bonding layer 17. An epoxy resin or the like can be suitably used as the thermoplastic resin.

The use of the thermoplastic resin allows the cured bonding layer 17 to be softened by heating. For example, the bonding layer 17 is cured at approximately 60° C. in the step S1-4, and the bonding layer 17 is softened at approximately 100° C. in the step S1-5. The softened bonding layer 17 can be more easily changed in shape by pressure application than the fully cured bonding layer 17. In addition, the softened bonding layer 17 can be more locally changed in shape than the fully cured bonding layer 17.

For example, pressure can be applied to at least a portion of the non-light-emitting portion 26 with the use of a mold having a projection. Specifically, the mold is made to overlap with the substrate 11 or the substrate 19 so that the projection overlaps with the non-light-emitting portion 26. Then, pressure is applied to the stacked structure of a light-emitting device 10 and the mold. The light-emitting device 10 in a portion that overlaps with the projection and the vicinity thereof are pressed by the projection, where the bonding layer 17 has a smaller thickness than in other portions. Thus, the non-light-emitting portion 26 of the light-emitting device 10 can have a first portion whose thickness is smaller than that of the light-emitting portion 25. Note that the non-light-emitting portion 26 may include, outside the thin first portion, a second portion whose thickness is larger than that of the first portion. The relation between the thickness in the second portion and that in the light-emitting portion 25 is not particularly limited; the second portion may have a larger or smaller thickness than or may have the same thickness as the light-emitting portion 25.

Pressure is preferably applied to the light-emitting device 10 with the use of an apparatus capable of applying pressure, such as a hot press. Examples of the hot press are given later in this embodiment.

In the above manner, the light-emitting device in which part of the non-light-emitting portion 26 has a smaller thickness than the light-emitting portion 25 can be manufactured. With this structure, entry of impurities such as moisture and oxygen into the light-emitting device or arrival thereof at the light-emitting element can be inhibited.

Formation of the thin region in the non-light-emitting portion 26 can be verified by observation of interference fringes generated in the non-light-emitting portion 26, for example. In the non-light-emitting portion 26, a region including interference fringes may be formed to have a width of greater than or equal to 0.1 mm, greater than or equal to 0.5 mm, or greater than or equal to 1 mm, and less than or equal to 10 mm, less than or equal to 5 mm, or less than or equal to 2 mm, for example. When interference fringes are generated in the light-emitting portion 25, display quality deteriorates in some cases. It is thus preferable that in the light-emitting portion 25, interference fringes not be formed and the thickness of the light-emitting portion 25 be uniform (or substantially uniform).

Although FIG. 1D illustrates an example of applying pressure to the non-light-emitting portion 26 from the substrate 19 side with the use of the member 21a having the projection, one embodiment of the present invention is not limited to this example. It is preferable that the member 21a having the projection be positioned on the side closer to the substrate 11 or the substrate 19 which is more flexible or thinner than the other, in which case pressure can be more easily applied to the non-light-emitting portion 26.

Figure 2A:
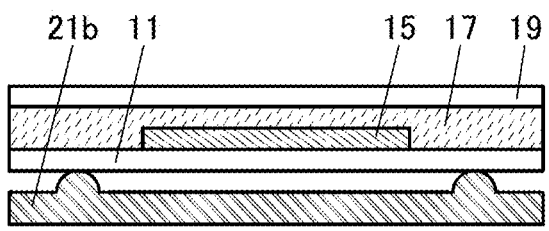
FIGS. 2A to 2G are cross-sectional views illustrating an example of a method for manufacturing a light-emitting device.
Figure 2B:
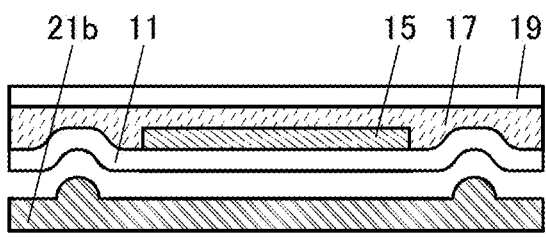

FIG. 2A illustrates an example of applying pressure to the non-light-emitting portion from the substrate 11 side with the use of a member 21b having a projection. Also in this case, the bonding layer 17 becomes thinner at the portion to which pressure is applied of the non-light-emitting portion than at the other portion (FIG. 2B).

Figure 2C:
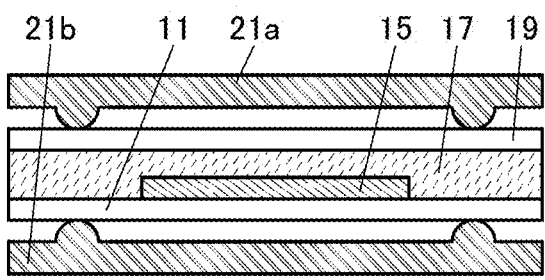
Figure 2D:
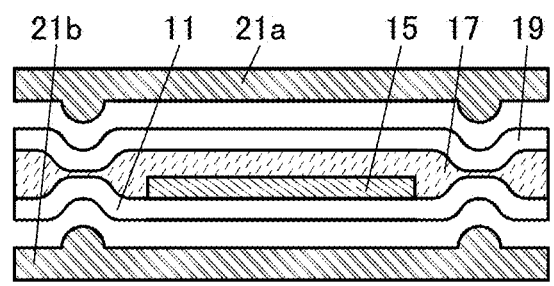

FIG. 2C illustrates an example of applying pressure to the non-light-emitting portion from both the substrate 11 side and the substrate 19 side with the use of the members 21a and 21b having the projections. In this example, the width, height, and position of the projection of each of the members 21a and 21b can be individually determined. When the projections of the members 21a and 21b overlap with each other with the light-emitting device provided therebetween, a much thinner portion than the light-emitting portion can be formed in the non-light-emitting portion (FIG. 2D). This is preferable because impurities entering through a side surface of the light-emitting device do not easily reach the light-emitting element 15 and a decrease in reliability of the light-emitting device can be suppressed. Note that the positions of the projections of the members 21a and 21b may be misaligned with each other.

Figure 2E:
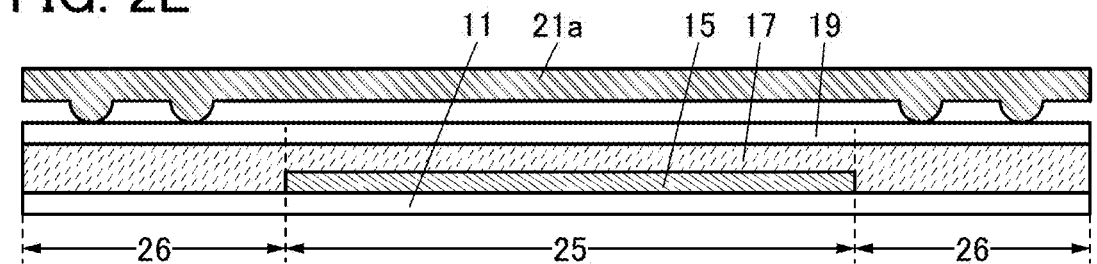
Figure 2F:
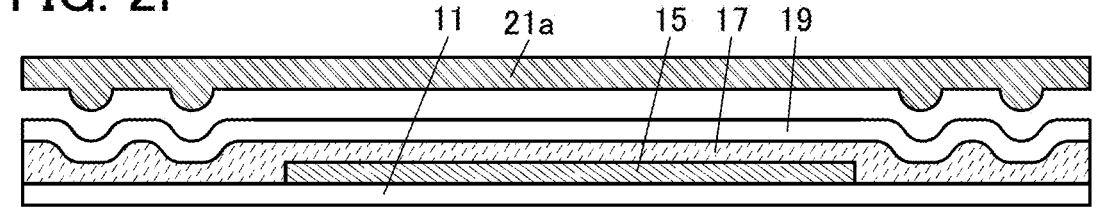
Figure 2G:
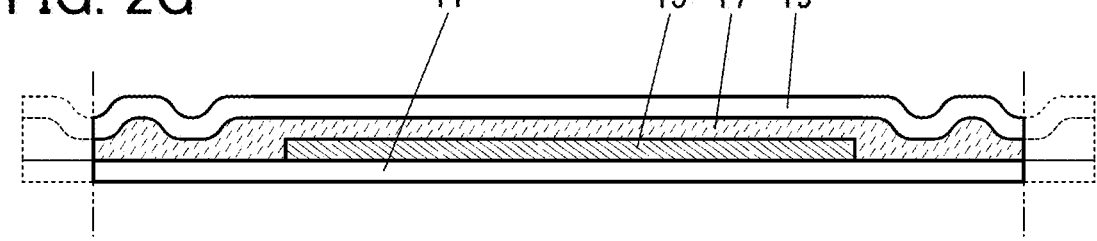

One or more portions to which pressure is to be applied with the member 21a having the projection are provided between an end portion of the light-emitting portion 25 and an end portion of the light-emitting device. FIG. 1D illustrates an example in which there is one portion to which pressure is to be applied with the projection between a left end portion of the light-emitting portion 25 and a left end portion of the light-emitting device and there is another portion to which pressure is to be applied between a right end portion of the light-emitting portion 25 and a right end portion of the light-emitting device. FIG. 2E illustrates an example in which there are two portions at each end. In the example in FIG. 2E, two depressions (referring to depressed portions or hollows) are provided at each of the left and right ends of the light-emitting device (FIG. 2F). After that, the width of the non-light-emitting portion of the light-emitting device may be decreased by partly removing one of the two depressions which is located outwardly from the other as illustrated in FIG. 2G (a decrease in width of the bezel of the light-emitting device). In that case, it is preferable to cut the light-emitting device so that the thinnest portion of the light-emitting device remains. The light-emitting device in FIG. 2G has a portion where the thickness thereof continuously (smoothly) decreases from the light-emitting portion side of the non-light-emitting portion toward an end portion of the light-emitting device.

Since the light-emitting device in FIG. 2G has the thin end portion, external impurities do not easily enter from the end portion. The light-emitting device in FIG. 2G also has the depression in the non-light-emitting portion. Therefore, even when impurities enter from the end portion of the light-emitting device, the impurities do not easily reach the light-emitting element.

Although the light-emitting element 15 is formed directly over the substrate 11 in the manufacturing method 1, one embodiment of the present invention is not limited to this example. A light-emitting element or the like formed over a formation substrate 31 may be transferred to the substrate 11, as described in the following manufacturing methods 2 and 3. With this method, for example, a layer to be separated which is formed over a formation substrate having high heat resistance can be transferred to a substrate having low heat resistance, and the formation temperature of the layer to be separated is not limited by the substrate having low heat resistance. The layer to be separated can be transferred to a substrate or the like that is more lightweight or flexible or thinner than the formation substrate, whereby a reduction in thickness and weight and improvement in flexibility of the light-emitting device can be achieved.

<Manufacturing Method 2>

Figure 3A:
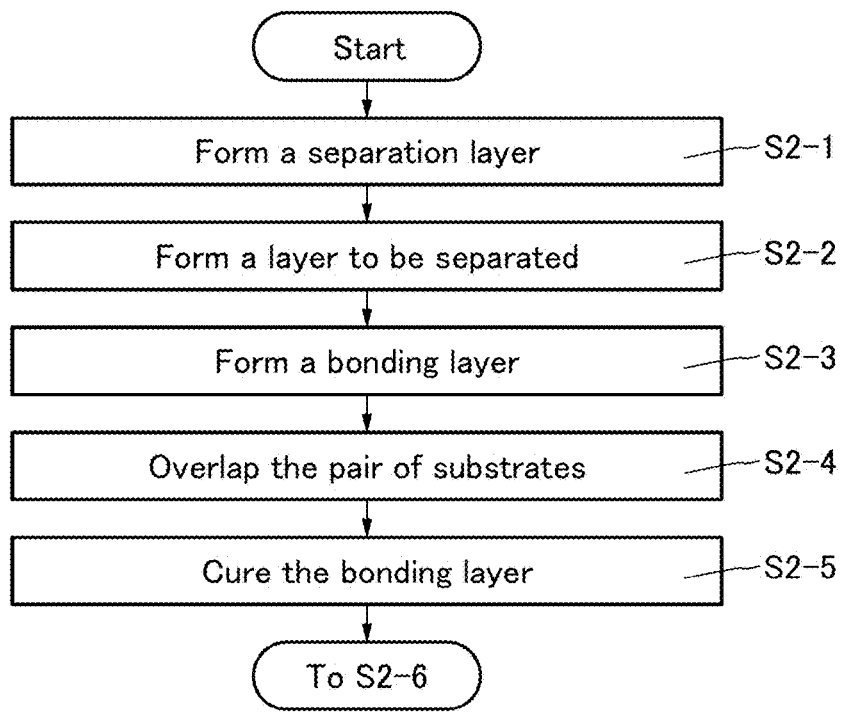
FIGS. 3A to 3G are a flowchart, cross-sectional views, and top views illustrating an example of a method for manufacturing a light-emitting device.

FIG. 3A illustrates a flowchart of the manufacturing method 2 of the light-emitting device.

[S2-1: Form a Separation Layer]

First, a pair of substrates (a formation substrate 31 and a substrate 19) are prepared. Next, a separation layer 32 is formed over the formation substrate 31.

Although an example in which the separation layer is formed to have an island shape is described here, one embodiment of the present invention is not limited to such an example. In this step, materials are selected that would cause separation at the interface between the formation substrate 31 and the separation layer 32, the interface between the separation layer 32 and an insulating layer 13 described later, or in the separation layer 32 when the formation substrate 31 and the insulating layer 13 are separated. In this embodiment, an example in which separation occurs at the interface between the insulating layer 13 and the separation layer 32 is described; however, one embodiment of the present invention is not limited to such an example and depends on a material used for the separation layer 32 or the insulating layer 13.

As the formation substrate 31, a substrate having at least heat resistance high enough to withstand process temperature in a manufacturing process is used. A material such as glass, quartz, sapphire, ceramic, an organic resin, a metal, an alloy, or a semiconductor can be used for the formation substrate 31. The formation substrate 31 does not necessarily have a light-transmitting property.

Note that it is preferable to use a large-sized glass substrate as the formation substrate 31 in terms of productivity. For example, a glass substrate having a size greater than or equal to the 3rd generation (550 mm×650 mm) and less than or equal to the 10th generation (2950 mm×3400 mm) or a glass substrate having a larger size than the 10th generation can be used.

In the case where a glass substrate is used as the formation substrate 31, as a base film, an insulating layer such as a silicon oxide film, a silicon oxynitride film, a silicon nitride film, or a silicon nitride oxide film is preferably formed between the formation substrate 31 and the separation layer 32, in which case contamination from the glass substrate can be prevented.

The separation layer 32 can be formed using an element selected from tungsten, molybdenum, titanium, tantalum, niobium, nickel, cobalt, zirconium, zinc, ruthenium, rhodium, palladium, osmium, iridium, and silicon; an alloy material containing any of the elements; a compound material containing any of the elements; or the like. A crystal structure of a layer containing silicon may be amorphous, microcrystal, or polycrystal. Furthermore, a metal oxide such as aluminum oxide, gallium oxide, zinc oxide, titanium dioxide, indium oxide, indium tin oxide, indium zinc oxide, or an In—Ga—Zn oxide can be used. The separation layer 32 is preferably formed using a high-melting-point metal material such as tungsten, titanium, or molybdenum, in which case the degree of freedom of the process for forming the insulating layer 13 and the functional element can be increased.

The separation layer 32 can be formed by, for example, a sputtering method, a plasma CVD method, a coating method (including a spin coating method, a droplet discharging method, a dispensing method, and the like), a printing method, or the like. The thickness of the separation layer 32 is, for example, greater than or equal to 1 nm and less than or equal to 200 nm, preferably greater than or equal to 10 nm and less than or equal to 100 nm.

In the case where the separation layer 32 has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. Note that the mixture of tungsten and molybdenum is an alloy of tungsten and molybdenum, for example.

In the case where the separation layer 32 is formed to have a stacked-layer structure including a layer containing tungsten and a layer containing an oxide of tungsten, the layer containing an oxide of tungsten may be formed as follows: the layer containing tungsten is formed first and an insulating layer containing an oxide is formed thereover, so that the layer containing an oxide of tungsten is formed at the interface between the tungsten layer and the insulating layer. Alternatively, the layer containing an oxide of tungsten may be formed by performing thermal oxidation treatment, oxygen plasma treatment, nitrous oxide ($N_2O$) plasma treatment, treatment with a highly oxidizing solution such as ozone water, or the like on the surface of the layer containing tungsten. Plasma treatment or heat treatment may be performed under an atmosphere of oxygen, nitrogen, or nitrous oxide alone, or a mixed gas of any of these gasses and another gas. Surface condition of the separation layer 32 is changed by the plasma treatment or heat treatment, whereby adhesion between the separation layer 32 and the insulating layer 13 can be controlled.

Note that the separation layer is not necessary in the case where separation at the interface between the formation substrate 31 and the insulating layer 13 is possible. For example, a glass substrate is used as the formation substrate 31, and an organic resin such as polyimide, polyester, polyolefin, polyamide, polycarbonate, or acrylic is formed in contact with the glass substrate. Next, adhesion between the formation substrate 31 and the organic resin is improved by laser light irradiation or heat treatment. Then, the insulating layer 13, a light-emitting element 15, and the like are formed over the organic resin. After that, separation at the interface between the formation substrate 31 and the organic resin can be performed by performing laser light irradiation with energy density higher than that of the above laser light irradiation or performing heat treatment at a temperature higher than that of the above heat treatment. Moreover, the interface between the formation substrate 31 and the organic resin may be filled with a liquid to perform separation.

In the case where the above method is employed, the insulating layer 13, the light-emitting element 15, a transistor, and the like are formed over the organic resin having low heat resistance, and thus it is difficult to expose the substrate to high temperatures in the manufacturing process. Here, a manufacturing process at high temperatures is dispensable for a transistor including an oxide semiconductor; therefore, the transistor can be favorably formed over the organic resin.

Note that the organic resin may be used as the substrate of the device. Alternatively, the organic resin may be removed and another substrate may be attached to the exposed surface using an adhesive.

Alternatively, separation at the interface between a metal layer and the organic resin may be performed in the following manner: the metal layer is provided between the formation substrate 31 and the organic resin and current is made to flow in the metal layer so that the metal layer is heated.

[S2-2: Form a Layer to be Separated]

Figure 3B:
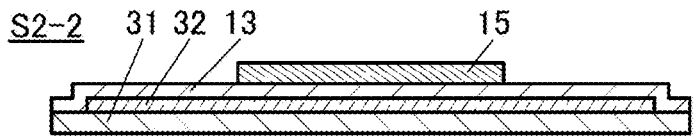

Next, a layer to be separated is formed over the separation layer 32. FIG. 3B illustrates an example in which the insulating layer 13 over the separation layer 32 and the light-emitting element 15 over the insulating layer 13 are formed as the layer to be separated.

As the insulating layer 13, an insulating layer having an excellent gas barrier property, an excellent water-resistant property, or an excellent moisture-resistant property is preferably used.

As the insulating layer having an excellent moisture-resistant property, a film containing nitrogen and silicon (e.g., a silicon nitride film or a silicon nitride oxide film), a film containing nitrogen and aluminum (e.g., an aluminum nitride film), or the like can be used.

For example, the water vapor transmittance of the insulating layer having an excellent moisture-resistant property is lower than or equal to $1 \times 10^{-5}$ [$g/(m^2 \cdot day)$], preferably lower than or equal to $1 \times 10^{-6}$ [$g/(m^2 \cdot day)$], further preferably lower than or equal to $1\times10^{-7}$ [g/(m²·day)], still further preferably lower than or equal to $1\times10^{-8}$ [g/(m²·day)].

Alternatively, a silicon oxide film, a silicon oxynitride film, an aluminum oxide film, or the like can be used as the insulating layer 13.

The insulating layer 13 can be formed by a sputtering method, a plasma CVD method, a coating method, a printing method, or the like. For example, the insulating layer 13 is formed at a temperature higher than or equal to 250° C. and lower than or equal to 400° C. by a plasma CVD method, whereby the insulating layer 13 can be a dense film having an excellent moisture-resistant property. Note that the thickness of the insulating layer 13 is preferably greater than or equal to 10 nm and less than or equal to 3000 nm, further preferably greater than or equal to 200 nm and less than or equal to 1500 nm.

In addition to the light-emitting element 15, one or more of various functional elements such as a transistor, a resistor, a switching element, and a capacitor can be formed as the layer to be separated over the formation substrate 31. Alternatively, a display element other than the light-emitting element may be formed. A coloring layer or a light-blocking layer may be formed.

[S2-3: Form a Bonding Layer]

Next, a bonding layer 17 is formed over the formation substrate 31 or the substrate 19.

The bonding layer 17 is preferably formed such that an end portion of the bonding layer 17 overlaps with the separation layer 32 and the insulating layer 13. In that case, the yield of separation of the formation substrate 31 can be increased. In the case where the bonding layer 17 is formed over the substrate 19, it is acceptable as long as the end portion of the bonding layer 17 overlaps with the separation layer 32 and the insulating layer 13 when the formation substrate 31 and the substrate 19 are made to overlap with each other in the next step S2-4.

[S2-4: Overlap the Pair of Substrates]

Figure 3C:
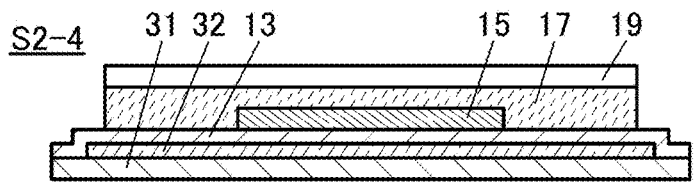

Next, the formation substrate 31 and the substrate 19 are overlapped such that the light-emitting element 15 is positioned in a space surrounded by the bonding layer 17, the formation substrate 31, and the substrate 19 (FIG. 3C).

As illustrated in FIG. 3C, the end portion of the bonding layer 17 is preferably positioned inwardly from an end portion of the separation layer 32. Alternatively, the end portion of the bonding layer 17 and that of the separation layer 32 may overlap with each other. Accordingly, strong adhesion between the formation substrate 31 and the substrate 19 can be suppressed; thus, a decrease in yield of a subsequent separation process can be suppressed.

Figure 3D:
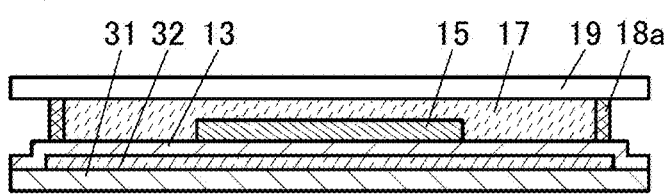

In the case where the bonding layer 17 is formed using a material with high fluidity, a partition 18a illustrated in FIG. 3D is preferably used to hold the bonding layer 17.

Figure 3E:
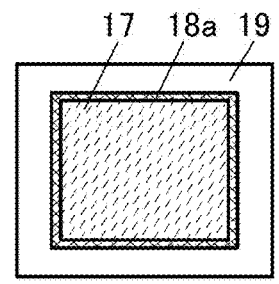

FIG. 3E illustrates an example of a top view in which the bonding layer 17 and the partition 18a are formed over the substrate 19. The bonding layer 17 is provided inside the partition 18a having a frame-like shape.

Figure 3F:
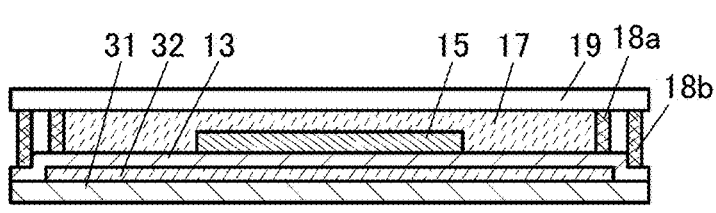

As illustrated in FIG. 3F, a temporary sealing layer 18b may be provided outside the partition 18a.

Figure 3G:
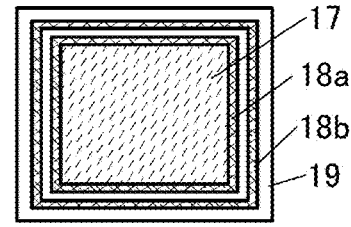

FIG. 3G illustrates an example of a top view in which the bonding layer 17, the partition 18a, and the temporary sealing layer 18b are formed over the substrate 19. The bonding layer 17 is provided inside the partition 18a having a frame-like shape. The temporary sealing layer 18b having a frame-like shape is provided outside the partition 18a having a frame-like shape.

The bonding layer 17, the partition 18a, and the temporary sealing layer 18b may be formed over either the formation substrate 31 or the substrate 19. All of the bonding layer 17, the partition 18a, and the temporary sealing layer 18b may be formed over one of the substrates. Alternatively, the bonding layer 17 and the partition 18a may be formed over one substrate and the temporary sealing layer 18b may be formed over the other substrate.

The thickness of the partition 18a and that of the temporary sealing layer 18b are each greater than or equal to 1 μm and less than or equal to 200 μm, preferably greater than or equal to 1 μm and less than or equal to 100 μm, further preferably greater than or equal to 1 μm and less than or equal to 50 μm, for example.

There is no particular limitation on methods for forming the partition 18a and the temporary sealing layer 18b; for example, a droplet discharge method, a printing method (such as a screen printing method or an offset printing method), a coating method such as a spin coating method or a spray coating method, a dipping method, a dispenser method, a nanoimprint method, or the like can be employed.

A variety of materials that can be used for the bonding layer 17 can be used for the partition 18a and the temporary sealing layer 18b.

The partition 18a is preferably formed using a material having higher viscosity than the bonding layer 17. The partition 18a is preferably formed using a material with high viscosity, in which case entry of impurities such as moisture from the air can be inhibited.

[S2-5: Cure the Bonding Layer]

Next, the bonding layer 17 is cured.

Furthermore, at least part of the temporary sealing layer 18b may be cured. When the light-emitting device is exposed to an air atmosphere, atmospheric pressure is applied to the formation substrate 31 and the substrate 19. As a result, the reduced-pressure state of the space surrounded by the temporary sealing layer 18b, the formation substrate 31, and the substrate 19 is maintained. Thus, impurities such as moisture in the air can be prevented from entering the light-emitting device.

Furthermore, the partition 18a may be cured. By curing the partition 18a, the light-emitting device in which the light-emitting element 15 is sealed with the bonding layer 17, the partition 18a, and the substrate 19 can be manufactured.

There is no particular limitation on the order of curing the bonding layer 17, the partition 18a, and the temporary sealing layer 18b.

As for subsequent steps, there are three manufacturing methods 2-A, 2-B, and 2-C.

Figure 4A:
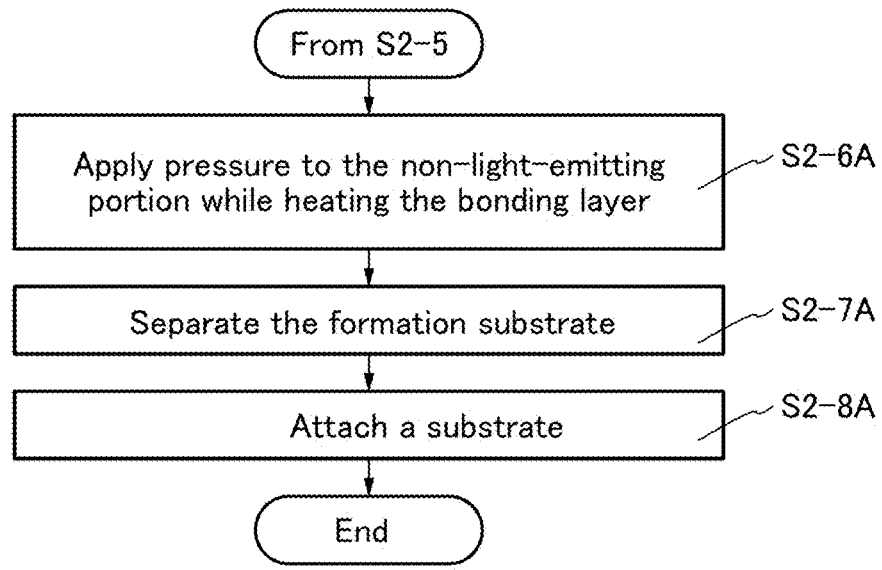
FIGS. 4A to 4D are a flowchart and cross-sectional views illustrating an example of a method for manufacturing a light-emitting device.

First, FIG. 4A illustrates a flowchart of the manufacturing method 2-A. The manufacturing method 2-A is an example of changing the shape of the light-emitting device before separating the formation substrate 31.

[S2-6A: Apply Pressure to the Non-Light-Emitting Portion while Heating the Bonding Layer]

Figure 4B:
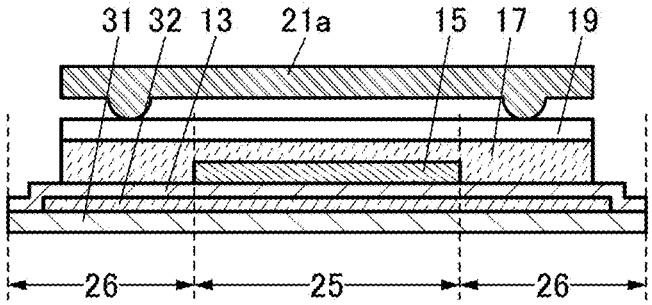

Next, while the bonding layer 17 is heated, pressure is applied to at least a portion of a non-light-emitting portion 26 by using a member 21a having a projection (FIG. 4B).

In FIG. 4B and the like, a portion where the light-emitting element 15 is provided over the formation substrate 31 is illustrated as a light-emitting portion 25, and a portion other than the light-emitting portion 25 is illustrated as the non-light-emitting portion 26.

Figure 4C:
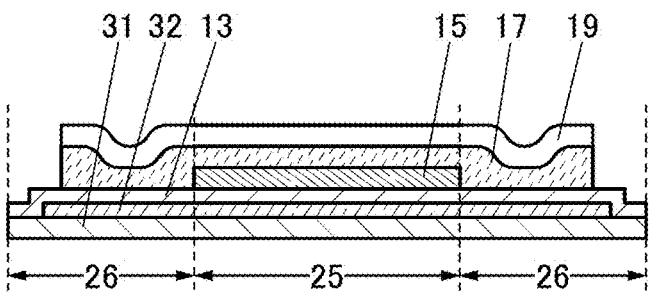
Figure 4D:
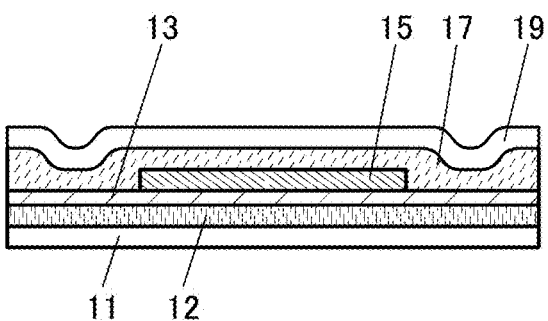

The bonding layer 17 becomes thinner at the portion to which pressure is applied than at the other portion (FIG. 4C). It can also be said that the gap between the formation substrate 31 and the substrate 19 becomes narrower in a portion of the non-light-emitting portion 26 than in the light-emitting portion 25.

[S2-7A: Separate the Formation Substrate]

Next, the formation substrate 31 and the insulating layer 13 are separated from each other. Here, a separation starting point (also referred to as a trigger) for separation of the formation substrate 31 is preferably formed. The separation starting point is formed in a region where the bonding layer 17 and the separation layer 32 overlap with each other.

The separation starting point can be formed through laser light irradiation, etching of the separation layer using a gas, a solution, or the like, division of the substrate, or mechanical removal such as making a cut with a sharp cutting tool such as a knife, a scalpel, or a cutter, for example. Formation of the separation starting point facilitates separation of the separation layer and the layer to be separated, which is preferable.

For example, when the substrate 19 can be divided with a cutting tool or the like, the separation starting point can be formed by making a cut in the substrate 19, the bonding layer 17, and the insulating layer 13.

In the case where laser light irradiation is employed, a region where the bonding layer 17 in a cured state, the insulating layer 13, and the separation layer 32 overlap with one another is preferably irradiated with the laser light. Although laser light irradiation may be performed from either substrate side, it is preferably performed from the formation substrate 31 side in which the separation layer 32 is provided, in order to prevent the light-emitting element, the transistor, or the like from being irradiated with scattered light. Note that a material that transmits the laser light is used for the substrate on the side where laser light irradiation is performed.

The insulating layer 13 is cracked (or broken), whereby the separation starting point can be formed. At this time, not only the insulating layer 13 but also part of the separation layer 32 and the bonding layer 17 may be removed. Laser light irradiation enables part of the films included in the insulating layer 13, the separation layer 32, or the bonding layer 17 to be dissolved, evaporated, or thermally broken.

It is preferable that in the separation step, force of separating the insulating layer 13 and the separation layer 32 be concentrated at the separation starting point; therefore, it is preferable to form the separation starting point not at the center portion of the bonding layer 17 in a cured state but in the vicinity of the end portion. It is particularly preferable to form the separation starting point in the vicinity of the corner portion compared to the vicinity of the side portion among the vicinities of the end portion. In such a case where the separation starting point is formed in a position not overlapping with the bonding layer 17, it is preferable that the position at which the separation starting point is formed be in a short distance from the bonding layer 17, whereby the separation layer 32 and the insulating layer 13 can be separated surely; specifically, it is preferable that the separation starting point be formed in a distance from the end portion of the bonding layer 17 within 1 mm.

There is no particular limitation on lasers used to form the separation starting point. For example, a continuous wave laser or a pulsed laser can be used. A condition for laser light irradiation such as frequency, power density, energy density, or beam profile is controlled as appropriate in consideration of thicknesses, materials, or the like of the formation substrate 31 and the separation layer 32.

Laser light is preferably employed, in which case the substrate does not need to be, for example, cut to form the separation starting point and generation of dust or the like can be suppressed. In addition, the time taken to form the separation starting point can be shortened. Moreover, the formation substrate 31 can be reused easily because dust that remains on the surface of the formation substrate 31 can be reduced. Furthermore, laser light results in low cost and can be easily applied to mass production because it does not cause wear of a sharp cutting tool such as a cutter. Separation can be started by pulling the end portion of either of the substrates and therefore can be easily applied to mass production.

Then, the insulating layer 13 and the formation substrate 31 are separated from each other from the formed separation starting point. At this time, one of the substrates is preferably fixed to a suction stage or the like. For example, the formation substrate 31 may be fixed to the suction stage to separate the insulating layer 13 from the formation substrate 31. Alternatively, the substrate 19 may be fixed to a suction stage to separate the formation substrate 31 from the substrate 19.

For example, the insulating layer 13 and the formation substrate 31 may be separated from the separation starting point by mechanical force (e.g., a separation process with a human hand or a jig, or a separation process by rotation of a roller).

Alternatively, the formation substrate 31 and the insulating layer 13 may be separated by filling the interface between the separation layer 32 and the insulating layer 13 with a liquid such as water. A portion between the separation layer 32 and the insulating layer 13 absorbs a liquid through capillarity action, so that separation occurs easily. Furthermore, an adverse effect on the functional element included in the insulating layer 13 due to static electricity caused at separation (e.g., a phenomenon in which a semiconductor element is damaged by static electricity) can be suppressed. Note that the liquid can be sprayed in the form of mist or steam. As the liquid, pure water, an organic solvent, a neutral, alkaline, or acid aqueous solution, an aqueous solution in which a salt is dissolved, or the like can be used.

Note that after the separation, the bonding layer 17, the partition 18a, the temporary sealing layer 18b, and the like which do not contribute to attachment between the insulating layer 13 and the substrate 19 and which remain over the substrate 19 may be removed. By such removal, an adverse effect on the functional element in a subsequent step (e.g., entry of impurities) can be preferably suppressed. For example, an unnecessary resin can be removed by wiping or cleaning.

[S2-8A: Attach a Substrate]

Next, to the insulating layer 13 that is exposed by separation of the formation substrate 31, a substrate 11 is attached with the use of a bonding layer 12. A step of, for example, cutting an end portion of the light-emitting device is performed, so that the light-emitting device illustrated in FIG. 4D can be manufactured.

A variety of materials that can be used for the bonding layer 17 can be used for the bonding layer 12. Any of the above-described materials can be used for the substrate 11, and it is particularly preferable that a flexible substrate be used.

In the above-described manner, the light-emitting device of one embodiment of the present invention can be manufactured.

Figure 5A:
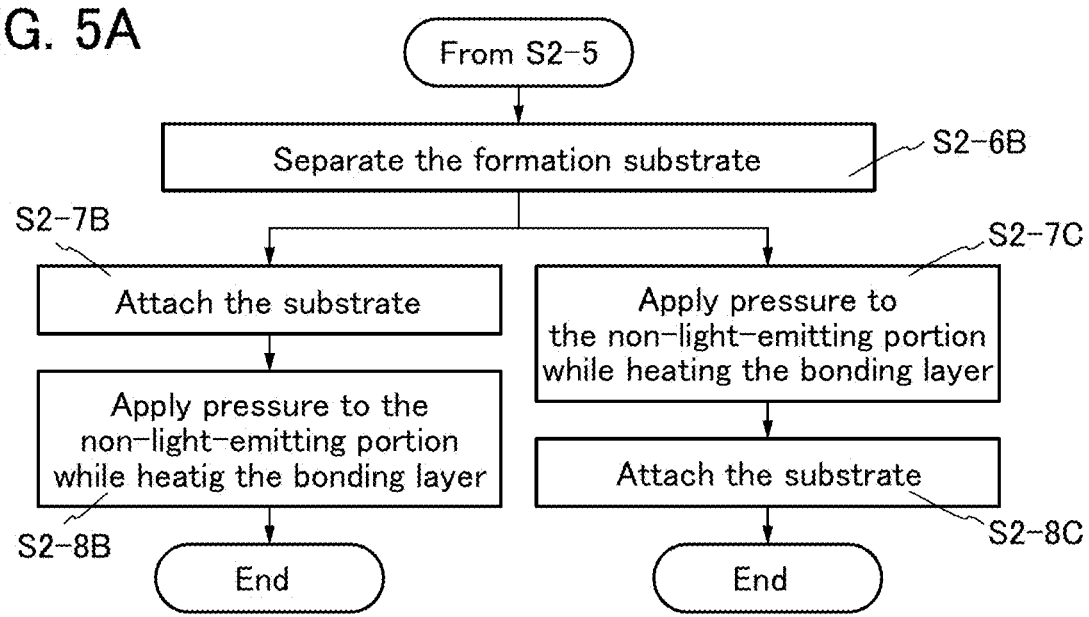
FIGS. 5A to 5F are a flowchart and cross-sectional views illustrating an example of a method for manufacturing a light-emitting device.

Next, FIG. 5A illustrates a flowchart of the manufacturing methods 2-B and 2-C. The manufacturing methods 2-B and 2-C are examples of changing the shape of the light-emitting device after separating the formation substrate 31. The manufacturing method 2-B is an example of changing the shape of the light-emitting device after attaching the substrate 11. The manufacturing method 2-C is an example of changing the shape of the light-emitting device before attaching the substrate 11.

[S2-6B: Separate the Formation Substrate]

Figure 5B:
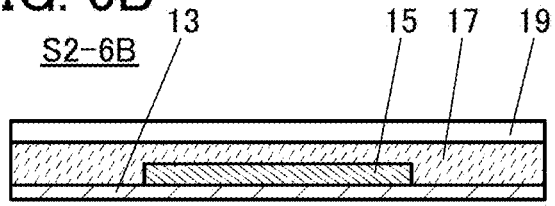

In each of the manufacturing methods 2-B and 2-C, the formation substrate 31 and the insulating layer 13 are separated from each other after the bonding layer 17 is cured. The step S2-7A can be referred to for details of the separation method. By this step, the insulating layer 13 is exposed (FIG. 5B).

Since the formation substrate 31 is separated before the shape of the light-emitting device is changed, a decrease in yield of separation due to the change in shape of the light-emitting device can be suppressed.

[S2-7B: Attach the Substrate]

In the manufacturing method 2-B, the substrate 11 is then attached to the insulating layer 13 with the bonding layer 12.

In many cases, both sides of a film that can be favorably used as the substrate 11 are provided with separation films (also referred to as separate films or release films). When the substrate 11 and the insulating layer 13 are attached to each other, only one of the separation films provided on the substrate 11 is separated. Leaving the other separation film facilitates transportation or processing in a later step. In some cases, the separation film is preferably separated before the step of changing the shape of the light-emitting device, depending on physical properties of the separation film (such as the coefficient of linear expansion) and conditions for changing the shape of the light-emitting device (such as temperature and pressure).

[S2-8B: Apply Pressure to the Non-Light-Emitting Portion while Heating the Bonding Layer]

Figure 5C:
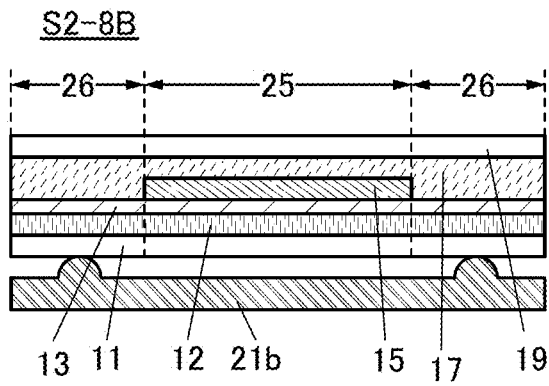

Next, while the bonding layer 17 is heated, pressure is applied to at least a portion of the non-light-emitting portion 26 by using a member 21b having a projection (FIG. 5C).

In FIG. 5C and the like, a portion where the light-emitting element 15 is provided over the substrate 11 is illustrated as the light-emitting portion 25, and a portion other than the light-emitting portion 25 is illustrated as the non-light-emitting portion 26.

Figure 5D:
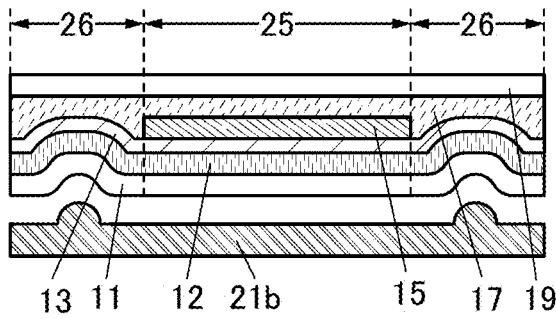

The bonding layer 17 becomes thinner at the portion to which pressure is applied than at the other portion (FIG. 5D). It can also be said that the gap between the substrate 11 and the substrate 19 becomes narrower in a portion of the non-light-emitting portion 26 than in the light-emitting portion 25.

Although FIG. 5C illustrates an example of applying pressure to the non-light-emitting portion 26 from the substrate 11 side with the use of the member 21b having the projection, one embodiment of the present invention is not limited to this example.

Figure 6A:
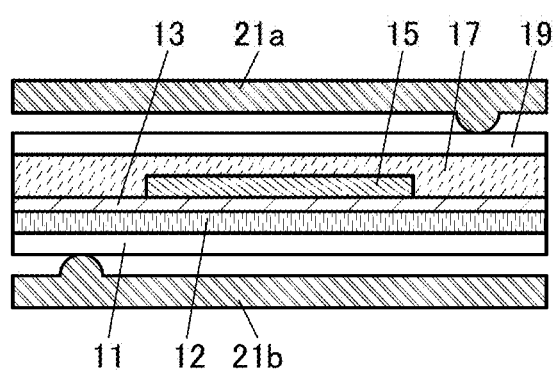
FIGS. 6A to 6D are cross-sectional views illustrating an example of a method for manufacturing a light-emitting device.
Figure 6B:
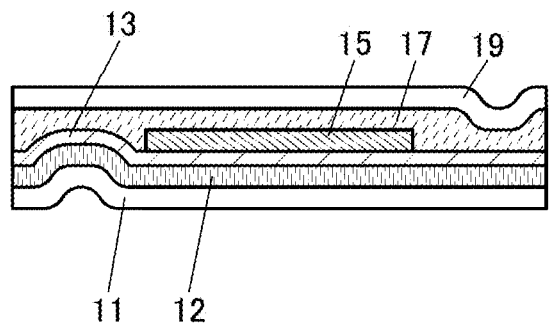

FIG. 6A illustrates an example of applying pressure to the non-light-emitting portion from both the substrate 11 side and the substrate 19 side with the use of the members 21a and 21b having the projections. Also in this case, the bonding layer 17 becomes thinner at the portion to which pressure is applied of the non-light-emitting portion than at the other portion (FIG. 6B). The projections of the members 21a and 21b do not necessarily overlap with each other with the light-emitting device provided therebetween.

In the above-described manner, the light-emitting device of one embodiment of the present invention can be manufactured.

[S2-7C: Apply Pressure to the Non-Light-Emitting Portion while Heating the Bonding Layer]

Figure 5E:
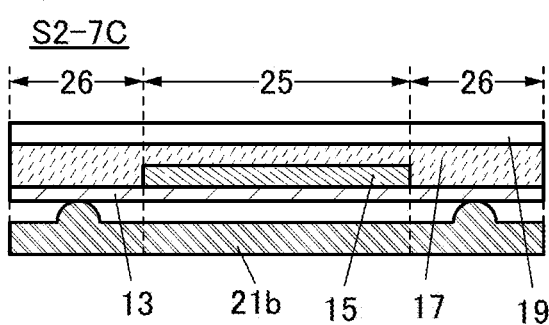

In the manufacturing method 2-C, after the step S2-6B, while the bonding layer 17 is heated, pressure is applied to at least a portion of the non-light-emitting portion 26 by using the member 21b having the projection (FIG. 5E).

In FIG. 5E, a portion where the light-emitting element 15 is provided over the insulating layer 13 is illustrated as the light-emitting portion 25, and a portion other than the light-emitting portion 25 is illustrated as the non-light-emitting portion 26.

FIG. 5E illustrates an example in which only the insulating layer 13 is located between the bonding layer 17 and the member 21b having the projection. Pressure can be applied to the bonding layer 17 more directly than in the step S2-8B or the like in which pressure is applied to the bonding layer 17 through the substrate 11 or the like. Therefore, by this step, the bonding layer 17 can be surely made thinner than at the other portion.

[S2-8C: Attach the Substrate]

The substrate 11 is then attached to the insulating layer 13 with the bonding layer 12. A step of, for example, cutting an end portion of the light-emitting device is performed, so that the light-emitting device illustrated in FIG. 5F can be manufactured.

Figure 5F:
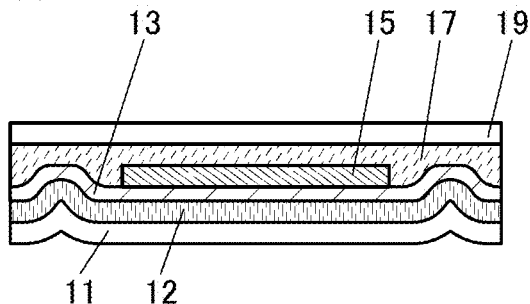

The bonding layer 17 is thinner at the portion to which pressure is applied than at the other portion (FIG. 5F). It can also be said that the gap between the substrate 11 and the substrate 19 is narrower in a portion of the non-light-emitting portion than in the light-emitting portion.

In the manufacturing method 2-C, the substrate 11 is attached after the shape of the bonding layer 17 is changed. Therefore, the physical properties of the substrate 11 (such as the coefficient of linear expansion) and the physical properties of the bonding layer 12 (such as the glass transition temperature) are not limited by conditions (such as temperature and pressure) for the step of changing the shape of the light-emitting device.

Although FIG. 5E illustrates an example of applying pressure to the non-light-emitting portion 26 from the insulating layer 13 side with the use of the member 21b having the projection, one embodiment of the present invention is not limited to this example.

Figure 6C:
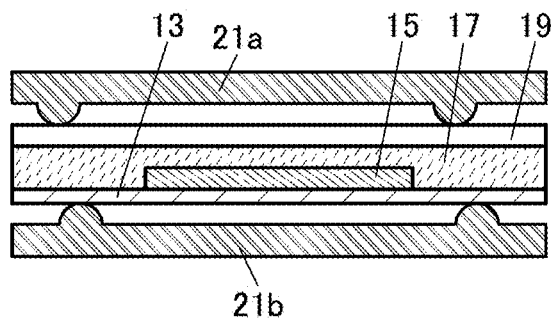
Figure 6D:
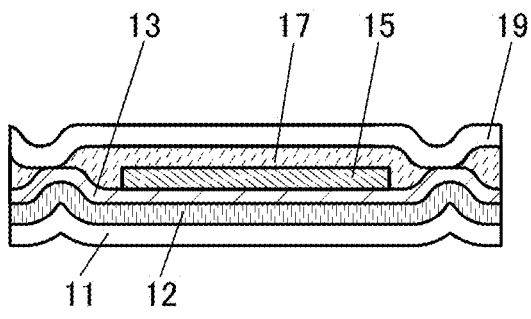

FIG. 6C illustrates an example of applying pressure to the non-light-emitting portion from both the insulating layer 13 side and the substrate 19 side with the use of the members 21a and 21b having the projections. Also in this case, the bonding layer 17 becomes thinner at the portion to which pressure is applied of the non-light-emitting portion than at the other portion (FIG. 6D). It is preferable that the projections of the members 21a and 21b partly overlap with each other with the light-emitting device provided therebetween. When the projections of the members 21a and 21b at least partly overlap with each other with the light-emitting device provided therebetween, a much thinner portion than the light-emitting portion can be formed in the non-light-emitting portion.

In the above-described manner, the light-emitting device of one embodiment of the present invention can be manufactured.

<Manufacturing Method 3>

Figure 7:
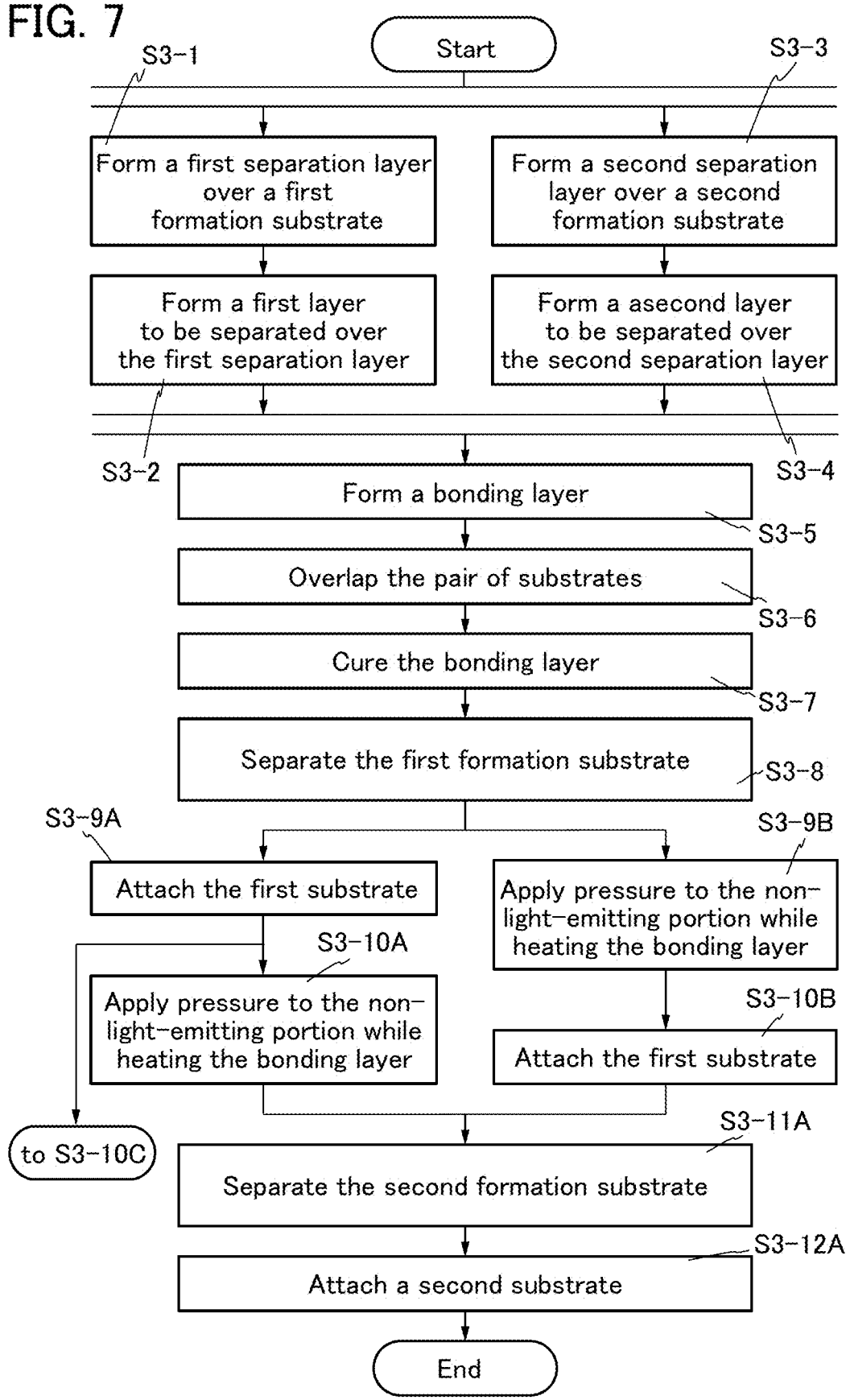
FIG. 7 is a flowchart illustrating an example of a method for manufacturing a light-emitting device.

FIG. 7 illustrates a flowchart of the manufacturing method 3 of the light-emitting device.

[S3-1: Form a First Separation Layer Over a First Formation Substrate]

A separation layer 32 is formed over a formation substrate 31.

[S3-2: Form a First Layer to be Separated Over the First Separation Layer]

Figure 8A:
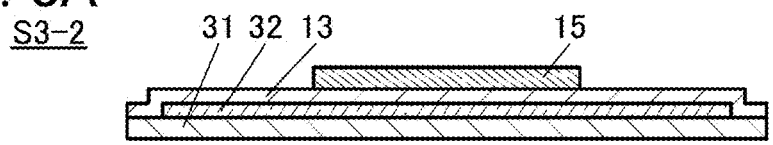
FIGS. 8A to 8E are cross-sectional views illustrating an example of a method for manufacturing a light-emitting device.

Next, a layer to be separated is formed over the separation layer 32. FIG. 8A illustrates an example in which an insulating layer 13 over the separation layer 32 and a light-emitting element 15 over the insulating layer 13 are formed as the layer to be separated.

[S3-3: Form a Second Separation Layer Over a Second Formation Substrate]

A separation layer 52 is formed over a formation substrate 51. A variety of materials that can be used for the formation substrate 31 can be used for the formation substrate 51. A variety of materials that can be used for the separation layer 32 can be used for the separation layer 52.

[S3-4: Form a Second Layer to be Separated Over the Second Separation Layer]

Figure 8B:
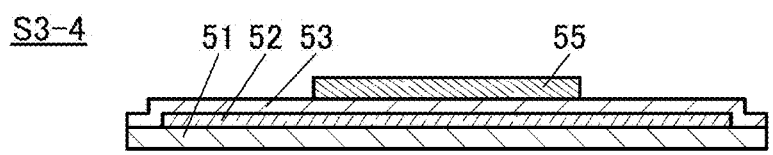

Next, a layer to be separated is formed over the separation layer 52. FIG. 8B illustrates an example in which an insulating layer 53 over the separation layer 52 and a coloring layer 55 over the insulating layer 53 are formed as the layer to be separated.

The layer to be separated over the separation layer 52 is not limited to the coloring layer 55, and a light-blocking layer, a touch sensor, or the like may be formed as the layer to be separated.

There is no particular limitation on the order of the step S3-1 and the step S3-3. Either step may be performed first, or the two steps may be performed at the same time. The same applies to the order of the step S3-2 and the step S3-4.

[S3-5: Form a Bonding Layer]

Next, a bonding layer 17 is formed over the formation substrate 31 or the formation substrate 51.

The bonding layer 17 is preferably formed in such a manner that it overlaps with the separation layer 32, the separation layer 52, the insulating layer 13, and the insulating layer 53 in the next step S3-6 in which the formation substrate 31 and the formation substrate 51 are made to overlap each other. In that case, the yield of separation of each of the formation substrates 31 and 51 can be increased.

Figure 8C:
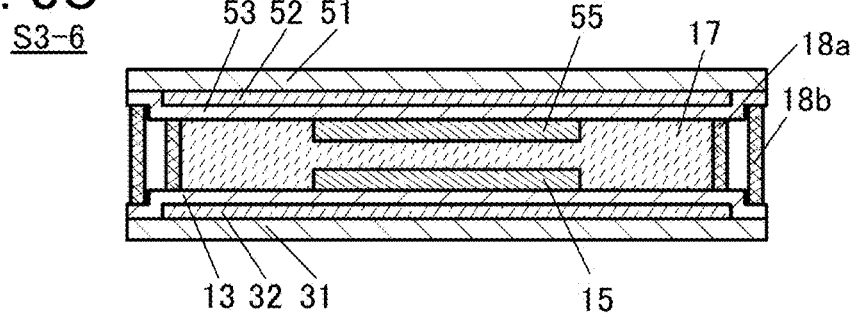

In an example described in this embodiment, the bonding layer 17, a partition 18a, and a temporary sealing layer 18b are formed (see a cross-sectional view in FIG. 8C illustrating the next step).

[S3-6: Overlap the Pair of Substrates]

Next, the formation substrate 31 and the formation substrate 51 are overlapped such that the light-emitting element 15 is positioned in a space surrounded by the bonding layer 17, the formation substrate 31, and the formation substrate 51 (FIG. 8C).

Although the separation layer 32 and the separation layer 52 have the same size in FIG. 8C, the two separation layers may have different sizes.

An end portion of the bonding layer 17 is preferably positioned inwardly from at least an end portion of either the separation layer 32 or the separation layer 52, specifically inward from an end portion of the separation layer on the side of the formation substrate which is intended to be separated first. Accordingly, strong adhesion between the formation substrate 31 and the formation substrate 51 can be suppressed; thus, a decrease in yield of a subsequent separation process can be suppressed. FIG. 8C illustrates an example in which the end portion of the bonding layer 17 is located inwardly from the end portions of both the separation layer 32 and the separation layer 52.

[S3-7: Cure the Bonding Layer]

Next, the bonding layer 17 is cured. Furthermore, at least one of the partition 18a and the temporary sealing layer 18b may be cured.

Application of pressure to a non-light-emitting portion while the bonding layer 17 is heated may be performed at any timing after the step S3-7. Note that the timing might affect the level of yield of the separation step, the changeability in shape of the bonding layer 17, and the like. Therefore, the step S3-7 is preferably followed by a step S3-8.

[S3-8: Separate the First Formation Substrate]

Next, the formation substrate 31 and the insulating layer 13 are separated from each other. The step S2-7A can be referred to for details of the separation method. By this step, the insulating layer 13 is exposed.

Since the formation substrate 31 is separated before the shape of the light-emitting device is changed, a decrease in yield of separation due to the change in shape of the light-emitting device can be suppressed.

As for subsequent steps, there are four manufacturing methods 3-A, 3-B, 3-C, and 3-D.

First, FIG. 7 illustrates a flowchart of the manufacturing methods 3-A and 3-B. The manufacturing methods 3-A and 3-B are examples of changing the shape of the light-emitting device before separating the formation substrate 51. The manufacturing method 3-A is an example of changing the shape of the light-emitting device after attaching the substrate 11. The manufacturing method 3-B is an example of changing the shape of the light-emitting device before attaching the substrate 11.

[S3-9A: Attach the First Substrate]

In the manufacturing method 3-A, the substrate 11 is then attached to the insulating layer 13 with a bonding layer 12. At that time, a partition 18c surrounding the bonding layer 12 and a temporary sealing layer 18d having a frame-like shape outside the partition 18c may be formed (see a cross-sectional view in FIG. 8D illustrating the next step).

[S3-10A: Apply Pressure to the Non-Light-Emitting Portion while Heating the Bonding Layer]

Figure 8D:
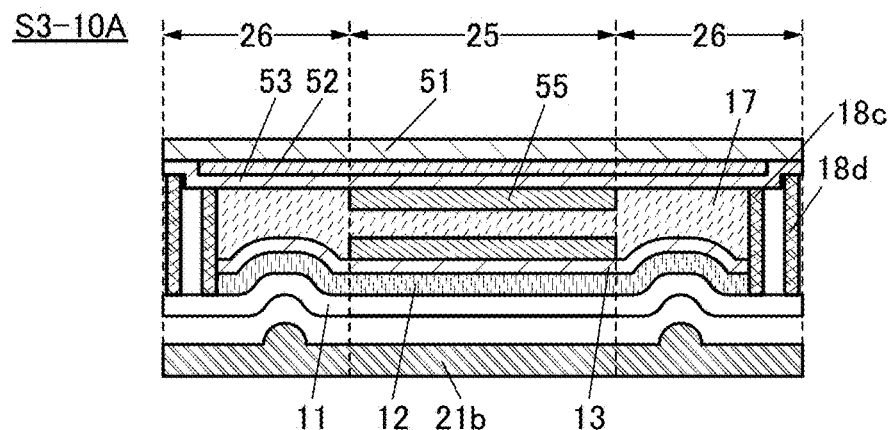
Figure 8E:
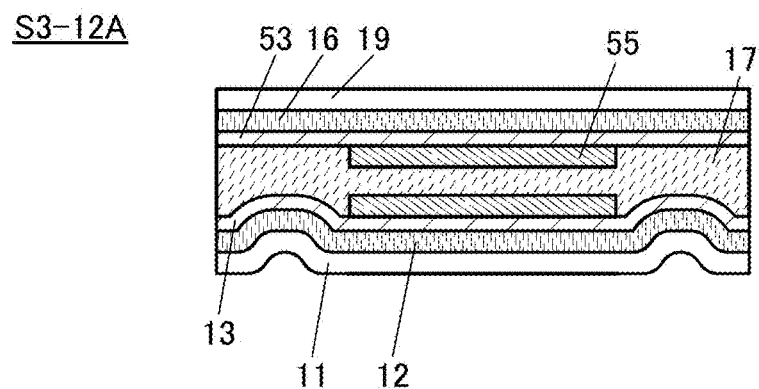

Next, while the bonding layer 17 is heated, pressure is applied to at least a portion of the non-light-emitting portion 26 by using a member 21b having a projection (FIG. 8D).

In FIG. 8D, a portion where the light-emitting element 15 is provided over the insulating layer 13 is illustrated as a light-emitting portion 25, and a portion other than the light-emitting portion 25 is illustrated as the non-light-emitting portion 26.

The bonding layer 17 becomes thinner at the portion to which pressure is applied than at the other portion (FIG. 8D). It can also be said that the gap between the substrate 11 and the formation substrate 51 becomes narrower in a portion of the non-light-emitting portion 26 than in the light-emitting portion 25.

[S3-11A: Separate the Second Formation Substrate]

Next, the formation substrate 51 and the insulating layer 53 are separated from each other. The step S2-7A can be referred to for details of the separation method. By this step, the insulating layer 53 is exposed.

[S3-12A: Attach a Second Substrate]

A substrate 19 is then attached to the insulating layer 53 with a bonding layer 16. A step of, for example, cutting an end portion of the light-emitting device is performed, so that the light-emitting device illustrated in FIG. 8E can be manufactured.

In the above-described manner, the light-emitting device of one embodiment of the present invention can be manufactured.

[S3-9B: Apply Pressure to the Non-Light-Emitting Portion while Heating the Bonding Layer]

Figure 9A:
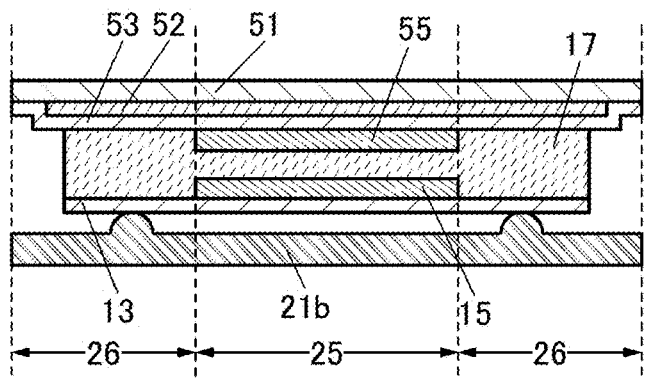
FIGS. 9A to 9E are cross-sectional views illustrating an example of a method for manufacturing a light-emitting device.

In the manufacturing method 3-B, after the step S3-8, while the bonding layer 17 is heated, pressure is applied to at least a portion of the non-light-emitting portion 26 by using the member 21b having the projection (FIG. 9A).

In FIG. 9A, a portion where the light-emitting element 15 is provided over the insulating layer 13 is illustrated as the light-emitting portion 25, and a portion other than the light-emitting portion 25 is illustrated as the non-light-emitting portion 26.

FIG. 9A illustrates an example in which only the insulating layer 13 is located between the bonding layer 17 and the member 21b having the projection. Pressure can be applied to the bonding layer 17 more directly than in the step S3-10A or the like in which pressure is applied to the bonding layer 17 through the substrate 11 or the like. Therefore, by this step, the bonding layer 17 can be surely made thinner than at the other portion.

[S3-10B: Attach the First Substrate]

Figure 9B:
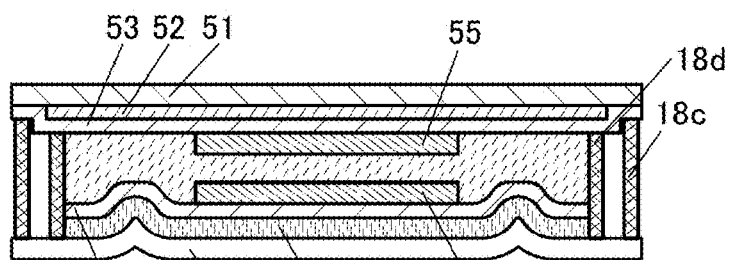
Figure 9C:
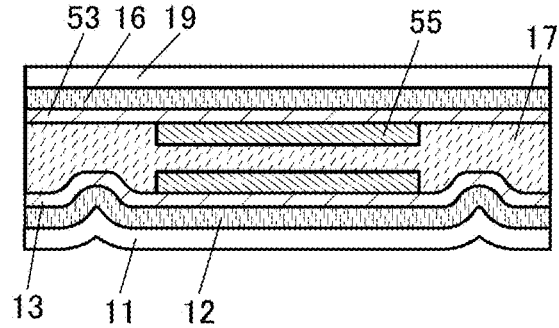

The substrate 11 is then attached to the insulating layer 13 with the bonding layer 12 (FIG. 9B). As illustrated in FIG. 9B, the partition 18c surrounding the bonding layer 12 and the temporary sealing layer 18d having a frame-like shape outside the partition 18c may be formed.

[S3-11A: Separate the Second Formation Substrate]

Next, the formation substrate 51 and the insulating layer 53 are separated from each other. The step S2-7A can be referred to for details of the separation method. By this step, the insulating layer 53 is exposed.

[S3-12A: Attach the Second Substrate]

The substrate 19 is then attached to the insulating layer 53 with the bonding layer 16. A step of, for example, cutting an end portion of the light-emitting device is performed, so that the light-emitting device illustrated in FIG. 9C can be manufactured.

In the above-described manner, the light-emitting device of one embodiment of the present invention can be manufactured.

Figure 9D:
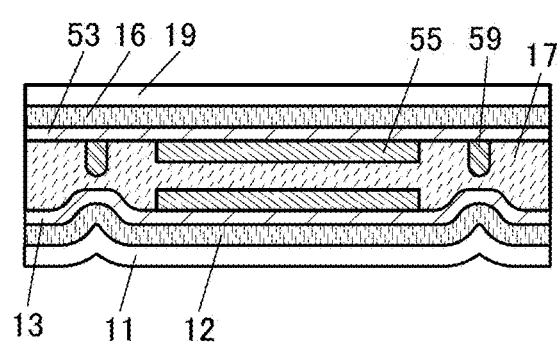
Figure 9E:
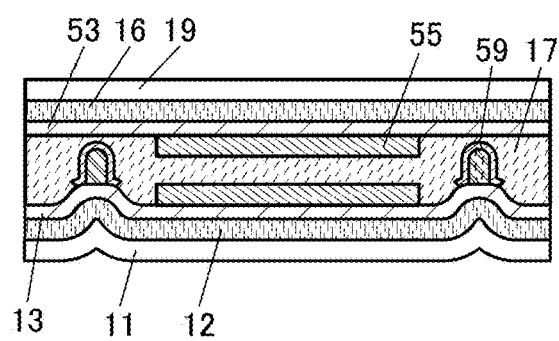

Note that a spacer 59 illustrated in FIG. 9D or 9E may be provided in the light-emitting device in order to decrease the minimum thickness of the bonding layer 17. The spacer 59 is provided in the non-light-emitting portion. The spacer 59 may be formed over the insulating layer 53 (see FIG. 9D), over the insulating layer 13 (see FIG. 9E), or over both the insulating layer 53 and the insulating layer 13. The portion to which pressure is applied by using the member having the projection preferably overlaps with the spacer 59. In that case, the minimum thickness of the bonding layer 17 can be significantly decreased.

At least a surface of the spacer 59 is preferably formed using an inorganic material. For example, the entire spacer 59 may be formed using an inorganic material. As illustrated in FIG. 9E, the spacer 59 preferably has a stacked-layer structure including a thick organic film and an inorganic film covering a top surface and a side surface of the organic film. In the case where the spacer 59 is partly formed using an organic material, the height (the thickness) of the spacer 59 can be more easily increased than in the case where the entire spacer 59 is formed using an inorganic material. In addition, the time needed to form the spacer 59 can be shortened. The spacer 59 preferably has an insulating property.

Figure 10A:
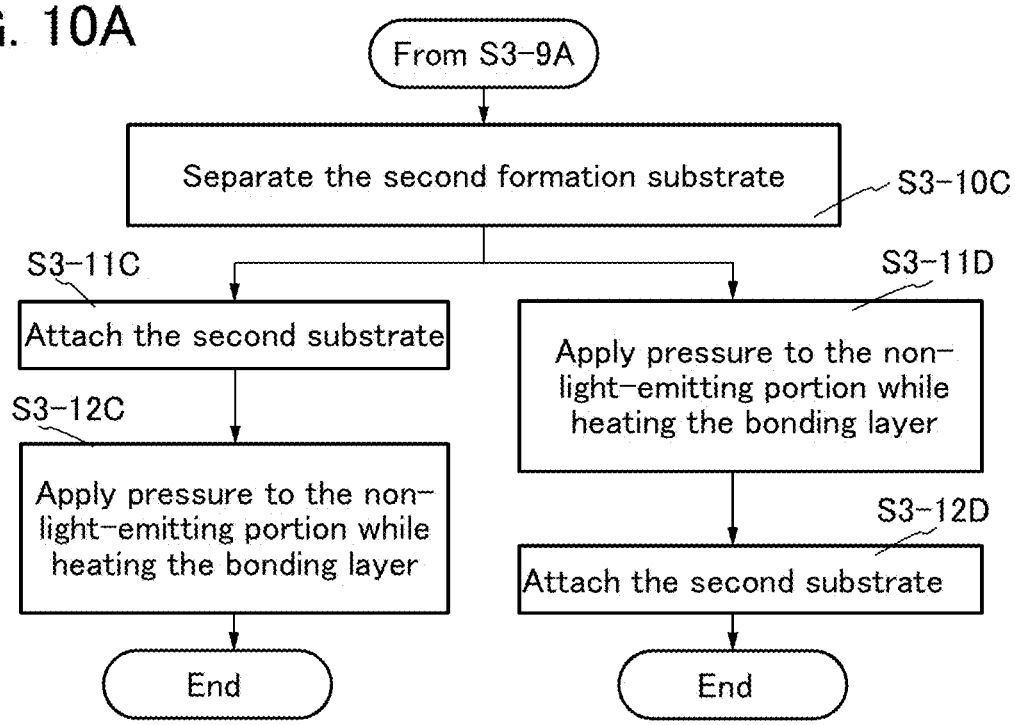
FIGS. 10A and 10B are a flowchart and a cross-sectional view illustrating an example of a method for manufacturing a light-emitting device.

Next, FIG. 10A illustrates a flowchart of the manufacturing methods 3-C and 3-D. The manufacturing methods 3-C and 3-D are examples of changing the shape of the light-emitting device after separating both the formation substrate 31 and the formation substrate 51. The manufacturing method 3-C is an example of changing the shape of the light-emitting device after attaching the substrate 19. The manufacturing method 3-D is an example of changing the shape of the light-emitting device before attaching the substrate 19.

[S3-10C: Separate the Second Formation Substrate]

In each of the manufacturing methods 3-C and 3-D, the substrate 51 and the insulating layer 53 are separated from each other after the substrate 11 is attached in the step S3-9A. The step S2-7A can be referred to for details of the separation method. By this step, the insulating layer 53 is exposed.

Since the formation substrate 51 as well as the substrate 31 is separated before the shape of the light-emitting device is changed, a decrease in yield of each separation step due to the change in shape of the light-emitting device can be suppressed.

Figure 10B:
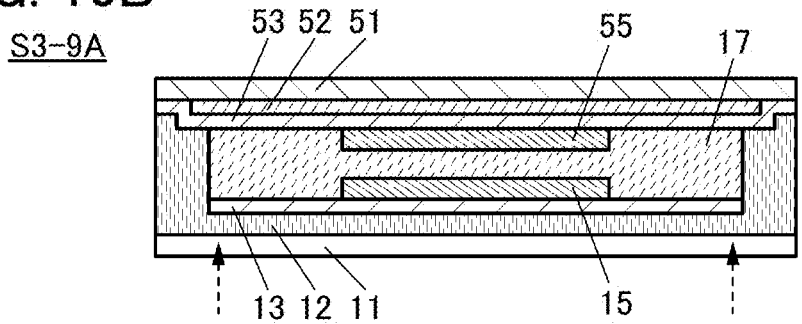

Note that FIG. 10B illustrates an example of attaching the substrate 11 in the step S3-9A by using only the bonding layer 12 without using the partition 18a and without using the temporary sealing layer 18b. In the end portion of the light-emitting device, there is a portion where the substrate 11 and the formation substrate 51 are attached to each other with the bonding layer 12 without the separation layer 52 provided therebetween. In such a case, a separation starting point having a frame-like shape is preferably formed by making a cut in the substrate 11 with a cutting tool or the like. The separation starting point can be formed by making the cut from the substrate 11 to the insulating layer 53. For example, the cut is preferably made from portions indicated by arrows in FIG. 10B.

[S3-11C: Attach the Second Substrate]

In the manufacturing method 3-C, the substrate 19 is then attached to the insulating layer 53 with the bonding layer 16.

[S3-12C: Apply Pressure to the Non-Light-Emitting Portion while Heating the Bonding Layer]

Figure 11A:
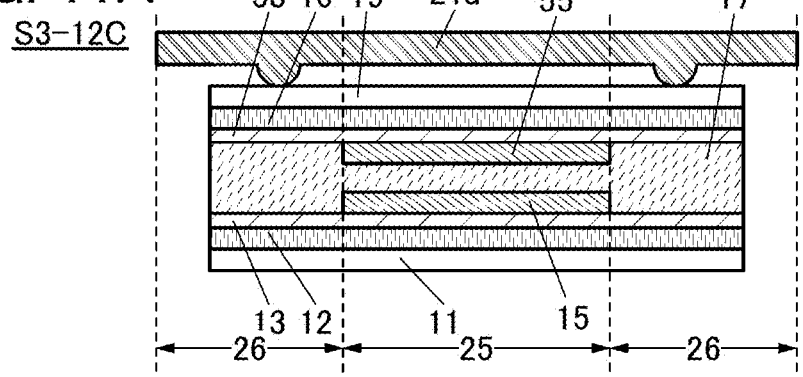
FIGS. 11A to 11D are cross-sectional views illustrating an example of a method for manufacturing a light-emitting device.

Next, while the bonding layer 17 is heated, pressure is applied to at least a portion of the non-light-emitting portion 26 by using a member 21a having a projection (FIG. 11A).

In FIG. 11A, a portion where the light-emitting element 15 is provided over the insulating layer 13 is illustrated as the light-emitting portion 25, and a portion other than the light-emitting portion 25 is illustrated as the non-light-emitting portion 26.

Figure 11B:
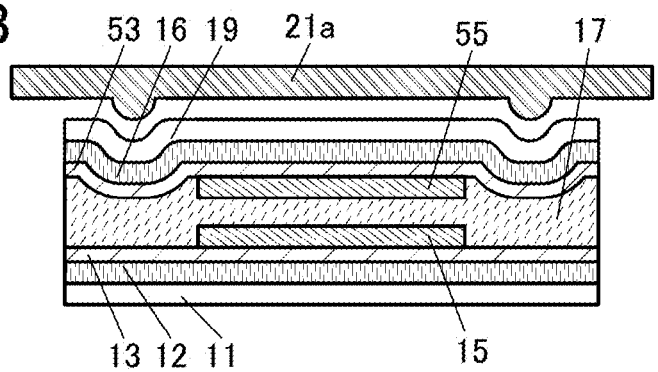

The bonding layer 17 becomes thinner at the portion to which pressure is applied than at the other portion (FIG. 11B). It can also be said that the gap between the substrate 11 and the substrate 19 becomes narrower in the non-light-emitting portion 26 than in the light-emitting portion 25.

In the above-described manner, the light-emitting device of one embodiment of the present invention can be manufactured.

[S3-11D: Apply Pressure to the Non-Light-Emitting Portion while Heating the Bonding Layer]

Figure 11C:
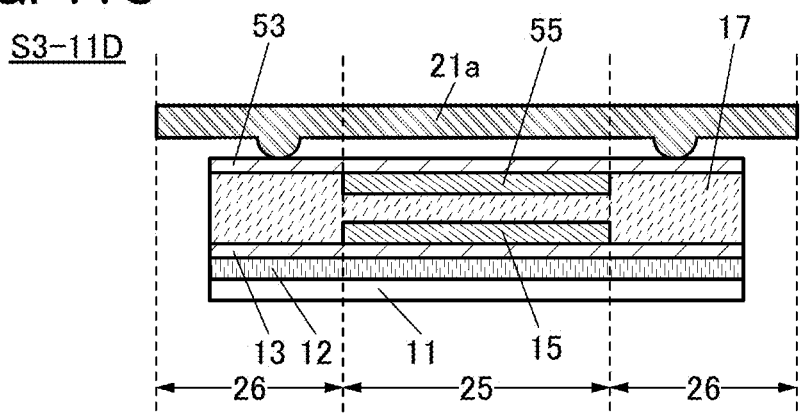

In the manufacturing method 3-D, after the step S3-10C, while the bonding layer 17 is heated, pressure is applied to at least a portion of the non-light-emitting portion 26 by using the member 21a having the projection (FIG. 11C).

In FIG. 11C, a portion where the light-emitting element 15 is provided over the insulating layer 13 is illustrated as the light-emitting portion 25, and a portion other than the light-emitting portion 25 is illustrated as the non-light-emitting portion 26.

FIG. 11C illustrates an example in which only the insulating layer 53 is located between the bonding layer 17 and the member 21*a* having the projection. Pressure can be applied to the bonding layer 17 more directly than in the step S3-12C or the like in which pressure is applied to the bonding layer 17 through the substrate 19 or the like. Therefore, by this step, the bonding layer 17 can be surely made thinner than at the other portion.

[S3-12D: Attach the Second Substrate]

Figure 11D:
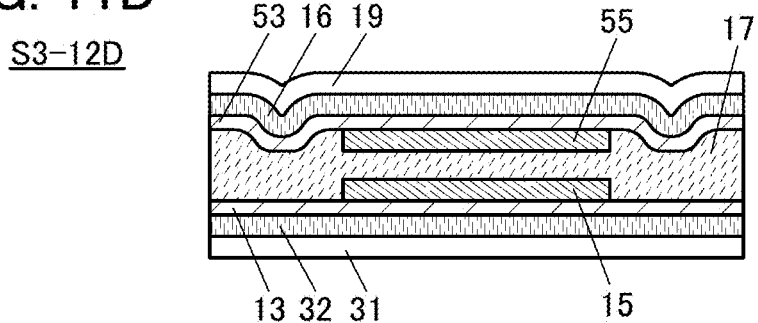

The substrate 19 is then attached to the insulating layer 53 with the bonding layer 16 (FIG. 11D).

In the above-described manner, the light-emitting device of one embodiment of the present invention can be manufactured.

<Example of a Top View of the Light-Emitting Device>

In the light-emitting device of one embodiment of the present invention, a thin region is formed in at least a portion of the non-light-emitting portion. FIGS. 12A to 12H each illustrate a light-emitting device including a pair of substrates (a flexible substrate 251 and a flexible substrate 259). An FPC 808 is connected to the light-emitting device. The FPC 808 is electrically connected to an external connection electrode (not illustrated) over the flexible substrate 251.

Figure 12A:
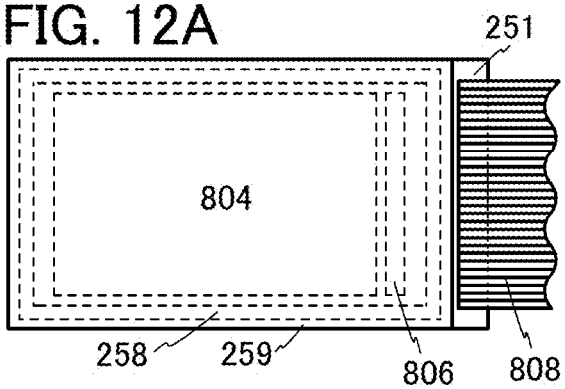
FIGS. 12A to 12H are top views each illustrating an example of a light-emitting device.

FIG. 12A illustrates an example in which a thin region 258 is formed in a frame-like shape along four sides of the light-emitting device. The thin region 258 is provided outside a light-emitting portion 804 and a driver circuit portion 806.

Figure 12B:
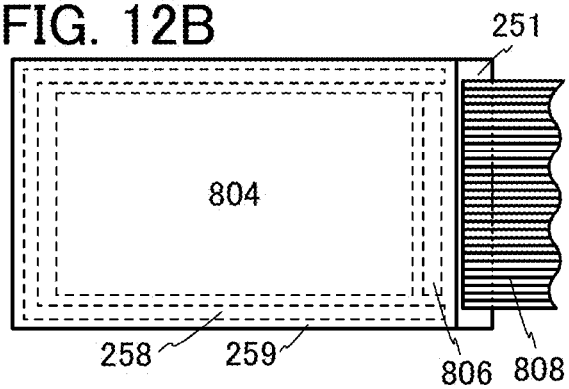

FIG. 12B illustrates an example in which the thin region 258 is formed along three sides of the light-emitting device. In FIG. 12B, the non-light-emitting portion in a portion where the driver circuit portion 806 and the external connection electrode are provided (on the right side of the light-emitting device in FIG. 12B) does not have the thin region 258. The shortest distance from the side of the light-emitting portion 804 that is adjacent to the driver circuit portion 806 to an end portion of the light-emitting device is longer than the shortest distance from the other sides of the light-emitting portion 804 to other end portions of the light-emitting device; therefore, on the side of the light-emitting device on which the driver circuit portion 806 is provided, impurities are unlikely to reach the light-emitting element or the like. In that case, the non-light-emitting portion does not necessarily have a portion whose thickness is smaller than that of the light-emitting portion. In the above manner, the element included in the driver circuit portion 806 can be prevented from deteriorating because of bending. Moreover, the external connection electrode and the FPC 808 can be electrically connected to each other reliably. Damage to the elements included in the driver circuit portion 806 can be inhibited when pressure is applied at the time of formation of a depression.

Note that the depression may be formed so as to overlap with the driver circuit portion 806 in the case where there is no adverse influence on the reliability of the elements. For example, the flexible substrate 259 may have a depression in a portion that overlaps with a scan line driver circuit or a signal line driver circuit. The flexible substrate 259 may have a depression in a portion that overlaps with a contact portion between an electrode (an anode or a cathode) of the light-emitting element and a wiring. A thin region may also be formed in a portion of the light-emitting portion as long as providing the thin region in the portion does not adversely affect display quality; for example, a thin region may be formed to overlap with a dummy pixel or an end portion of a color filter.

Figure 12C:
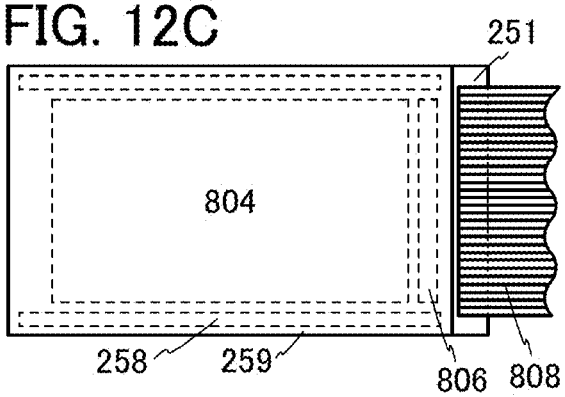

FIG. 12C illustrates an example in which the thin region 258 is formed along two sides of the light-emitting device.

Figure 12D:
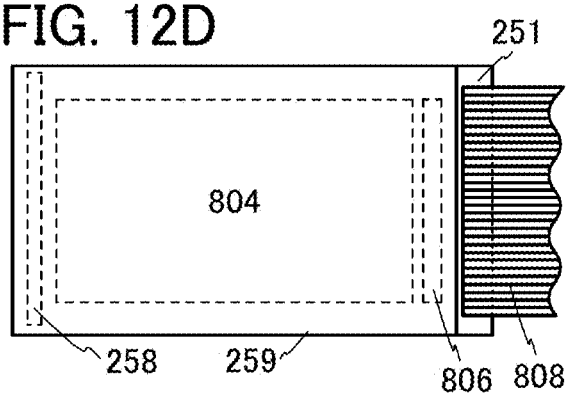

FIG. 12D illustrates an example in which the thin region 258 is formed along one side of the light-emitting device.

Figure 12E:
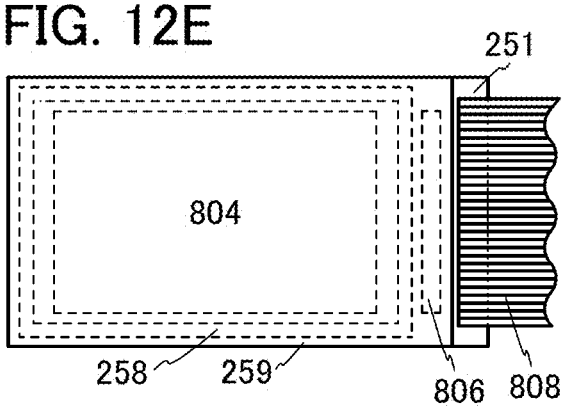

FIG. 12E illustrates an example in which the thin region 258 is formed in a frame-like shape along four sides of the light-emitting device. The example illustrated in FIG. 12E differs from the example in FIG. 12A in that the thin region 258 is provided between the light-emitting portion 804 and the driver circuit portion 806.

Figure 12F:
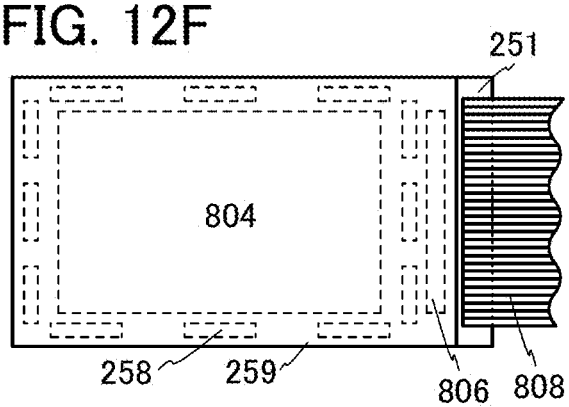

FIG. 12F illustrates an example in which the thin region 258 is formed in a frame-like shape along four sides of the light-emitting device. The example illustrated in FIG. 12F differs from the example in FIG. 12A in that a plurality of thin regions 258 are provided at intervals.

Figure 12G:
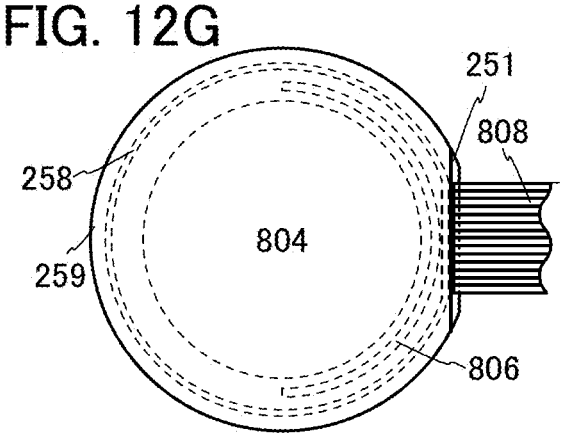
Figure 12H:
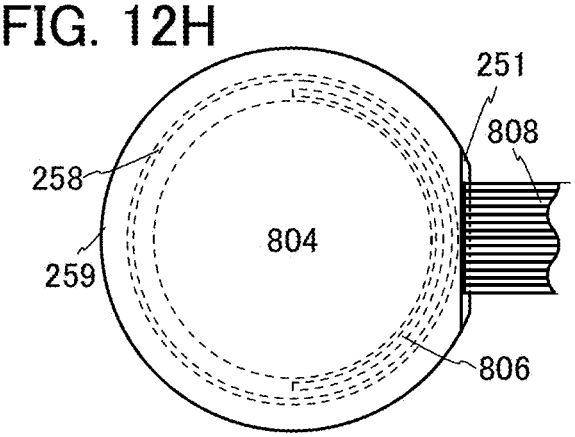

FIGS. 12G and 12H each illustrate an example of a light-emitting device in which the light-emitting portion 804 has a circular top-view shape. The light-emitting portion 804 does not necessarily have a polygonal top-view shape and may have any of a variety of top-view shapes such as circular and elliptical shapes.

The light-emitting device does not necessarily have a polygonal top-view shape and may have any of a variety of top-view shapes such as circular and elliptical shapes. The light-emitting device in each of FIGS. 12G and 12H has a top-view shape including both a curved portion and a linear portion.

The thin region 258 may have any of a variety of top-view shapes such as polygonal, circular, and elliptical shapes. The thin region 258 in FIG. 12G includes both a curved portion and a linear portion. In FIG. 12H, the thin region 258 has a circular shape.

<Example of a Method for Applying Pressure with a Hot Press>

A method for applying pressure in the light-emitting device in the step S1-5 or the like will be described.

Figure 13A:
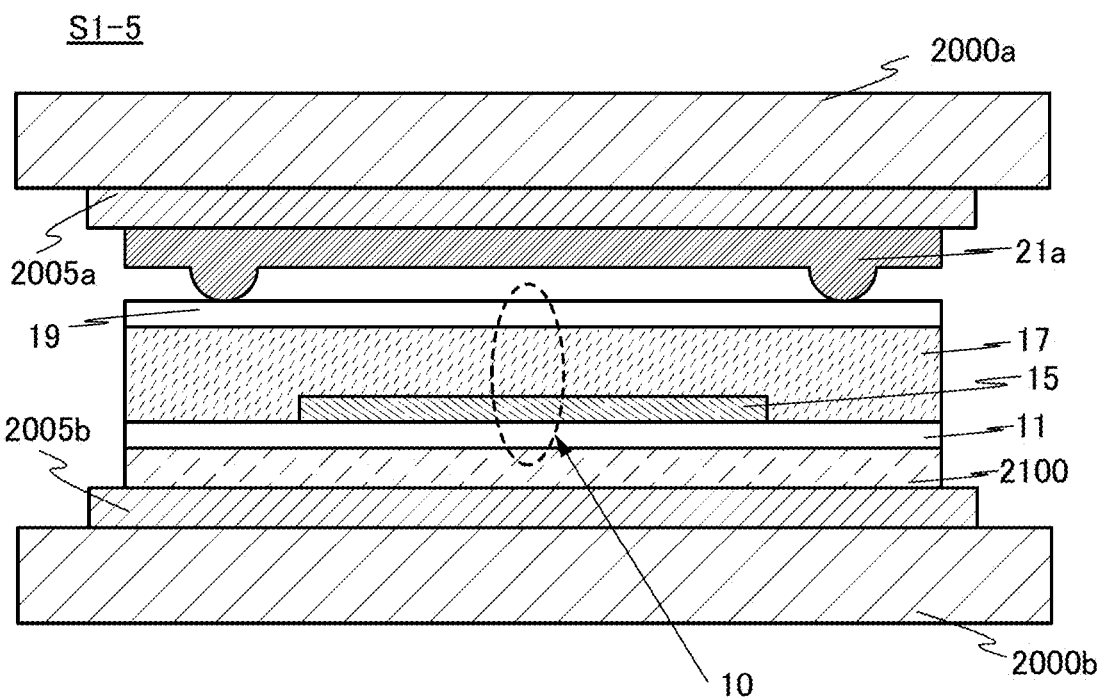
FIGS. 13A and 13B are cross-sectional views each illustrating an example of a method for manufacturing a light-emitting device.
Figure 13B:
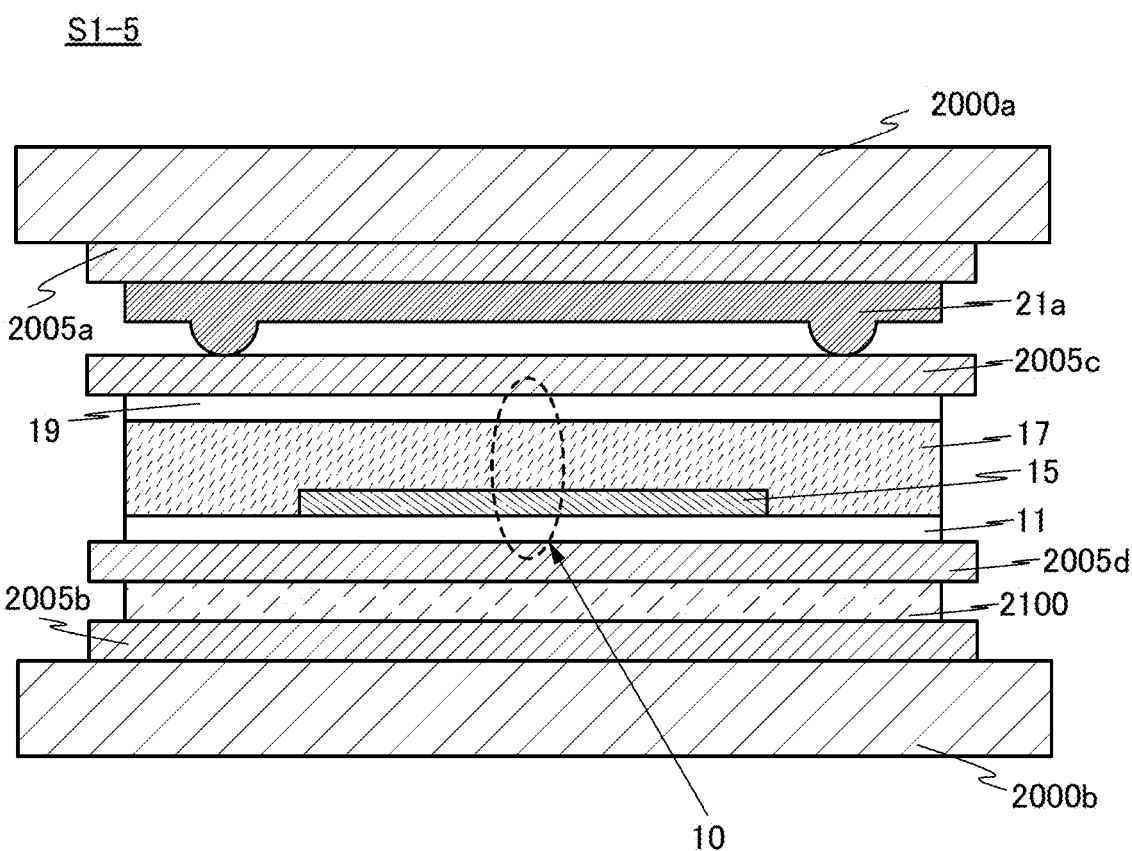

FIGS. 13A and 13B each illustrate a hot press that includes an upper plate 2000*a* and a lower plate 2000*b*. The hot press has a heat source and heats one or both of the upper plate 2000*a* and the lower plate 2000*b*.

First, the light-emitting device 10, a jig, a cushioning material, and the like are provided between the upper plate 2000*a* and the lower plate 2000*b* of the hot press.

A structure in FIG. 13A will be described. A substrate 2100 is provided over the lower plate 2000*b* with a cushioning material 2005*b* positioned therebetween. The substrate 2100 is an example of a press jig. The light-emitting device 10 (see FIG. 1D) is placed over the substrate 2100. Over the light-emitting device 10, the member 21*a* having the projection is provided. The projection is in contact with the substrate 19. The projection overlaps with the non-light-emitting portion of the light-emitting device 10. The member 21*a* having the projection is an example of a press jig. A cushioning material 2005*a* is provided between the member 21*a* having the projection and the upper plate 2000*a*.

As illustrated in FIG. 13B, a cushioning material 2005*c* may be provided between the member 21*a* having the projection and the light-emitting device 10. Furthermore, as illustrated in FIG. 13B, a cushioning material 2005*d* may be provided between the substrate 2100 and the light-emitting device 10. Providing the cushioning material can reduce damage to the light-emitting device 10 by local pressure application to the light-emitting device 10. Providing no cushioning material allows an extremely thin portion to be formed in the bonding layer 17 by local pressing of the light-emitting device 10. Whether each cushioning material is used or not is determined depending on the structure of the light-emitting device 10, pressing conditions (such as load or time), or the like.

The hot press preferably includes an alignment mechanism. This enables the depression to be formed at a desired position of the light-emitting device 10. The hot press preferably includes a mechanism for fixing the light-emitting device 10, such as a suction mechanism. This enables the light-emitting device 10 to be fixed at a position relative to the depression.

The member 21a and the projection can be formed using a material that can withstand applied pressure. A mold having a projection may be used as the member 21a having the projection. The mold can be formed using the material that can be used for the substrate. For example, the mold can be formed using a resin, glass, a metal, or an alloy. The projection can be formed over the substrate with the use of an organic material such as a resin or an inorganic material such as a metal. There is no limitation on methods for forming the projection, and a sputtering method, a CVD method, a coating method, a printing method, a droplet discharge method, or a dispensing method may be used, for example. The projection can also be formed by curing an adhesive provided over the substrate.

FIGS. 14A to 14F each illustrate an example of a top-view shape of a member 21 having a projection.

Figure 14A:
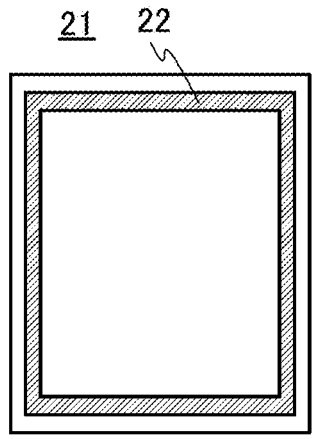
FIGS. 14A to 14G are top views of members having projections and a cross-sectional view illustrating the projection of the member and a depression in a light-emitting device.
Figure 14B:
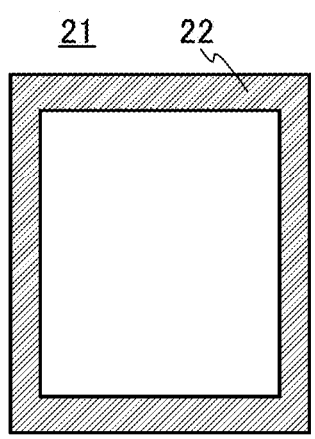
Figure 14C:
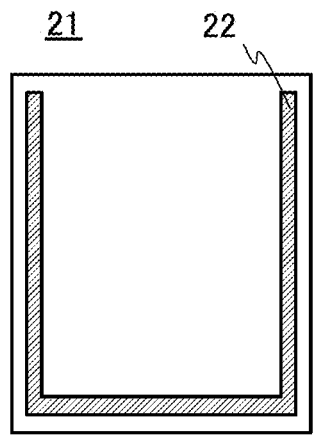
Figure 14D:
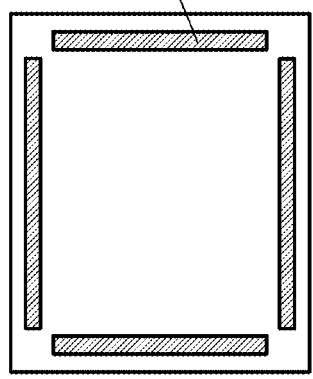
Figure 14E:
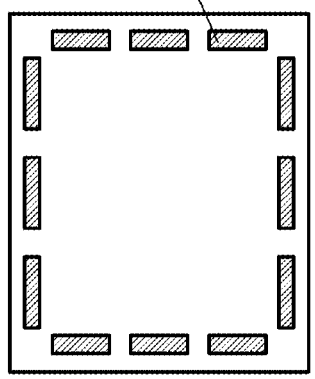
Figure 14F:
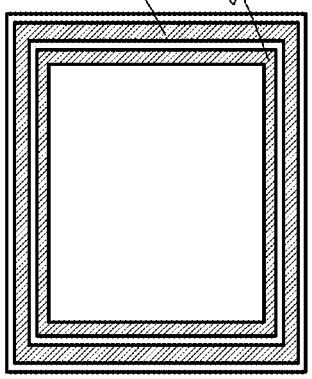

A projection 22 may be formed in a frame-like shape as illustrated in FIGS. 14A, 14B, 14D, 14E, and 14F. The projection 22 is not necessarily positioned at an edge of the member 21 (FIG. 14A). Alternatively, the projection 22 may extend to the edge of the member 21 (FIG. 14B). The projection 22 may be provided along three of four sides of the member 21 having the projection (FIG. 14C). Alternatively, the projection 22 may be provided along two sides or one side of the member 21. Note that the projection 22 is not necessarily parallel to any of the sides of the member 21. The number of projections 22 may be one or more. FIG. 14D illustrates an example in which four sides are provided with respective projections 22. FIG. 14E illustrates an example in which a plurality of projections 22 are provided at intervals along each of four sides. FIG. 14F illustrates a member 21 having two projections that are a projection 22a having a frame-like shape and a projection 22b having a frame-like shape inside the projection 22a.

Next, in a state illustrated in FIG. 13A or 13B, pressure is gently applied to the light-emitting device 10 to fix the light-emitting device 10.

Then, the light-emitting device 10 is heated using the heat source. For example, the temperature of the heat source is set higher than or equal to 80° C. and lower than or equal to 100° C.

Then, pressure is applied to the light-emitting device 10. Pressure is applied to the light-emitting device 10 with the member 21a having the projection while the light-emitting device 10 is heated with the heat source.

The load for the pressure application is not particularly limited. The load may be, for example, greater than or equal to 0.5 t, greater than or equal to 0.8 t, or greater than or equal to 1.0 t and less than or equal to 1.5 t, less than or equal to 2.0 t, or less than or equal to 3.0 t. The heating temperature is not particularly limited and is determined depending on the glass transition temperature or the like of materials used for the bonding layer 17 and the light-emitting element 15. For example, the heating temperature may be higher than or equal to 80° C., higher than or equal to 90° C., or higher than or equal to 100° C. and lower than or equal to 120° C., lower than or equal to 150° C., or lower than or equal to 200° C. The time for the pressure application while the light-emitting device 10 is heated is not particularly limited.

Figure 14G:
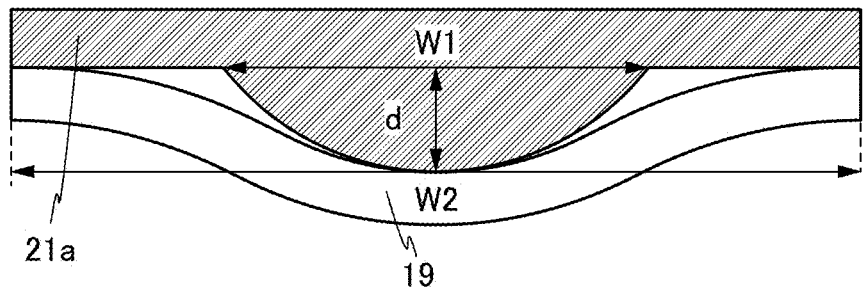

A width W2 of the depression formed in the substrate 19 of the light-emitting device 10 is larger than a width W1 of the projection (FIG. 14G). For example, the width W2 is larger than the width W1 and smaller than or equal to 1.5 times, smaller than or equal to 2 times, or smaller than or equal to 3 times the width W1. The width W2 may be more than 3 times the width W1. The depth of the depression formed in the substrate 19 of the light-emitting device 10 is smaller than or equal to a height d of the projection. The width W2 is, for example, larger than or equal to, larger than or equal to 5 times, or larger than or equal to 10 times and smaller than or equal to 20 times, smaller than or equal to 50 times, or smaller than or equal to 100 times the depth of the depression.

For example, the depth of the depression can be greater than or equal to 0.01 mm, greater than or equal to 0.05 mm, or greater than or equal to 0.1 mm and less than or equal to 2 mm, less than or equal to 1 mm, or less than or equal to 0.5 mm. The width W2 can be greater than or equal to 0.1 mm, greater than or equal to 1 mm, or greater than or equal to 1 cm and less than or equal to 10 cm, less than or equal to 5 cm, or less than or equal to 3 cm. The width W2 is preferably larger than 0 times the width of the non-light-emitting portion and smaller than or equal to the width of the non-light-emitting portion, and may be larger than or equal to 0.2 times and smaller than or equal to 0.8 times, or larger than or equal to 0.4 times and smaller than or equal to 0.6 times the width of the non-light-emitting portion. Note that the width W2 is not necessarily the width of the depression and may be the width of the region thinner than the light-emitting portion.

After a certain period of heating and pressure application, the bonding layer 17 is cured by performing cooling while continuing the pressure application. Therefore, the hot press preferably includes both a heating mechanism and a cooling mechanism. Cooling at the same time as pressure application makes it possible to maintain a state where the non-light-emitting portion of the light-emitting device 10 has the thin portion.

As described above, the hot press can be used to form the thin portion in the non-light-emitting portion of the light-emitting device 10.

In the case where a plurality of light-emitting devices are manufactured using the substrate 11, the size of the member having the projection, the shape of the projection, or the like is preferably determined depending on the number of light-emitting devices obtained using one substrate, the shape of a mask, or the like.

A member 21 illustrated in FIG. 15A has two projections 22 each having a frame-like shape. The two projections 22 each having a frame-like shape are spaced apart from each other.

FIG. 15B illustrates an example of manufacturing two light-emitting devices 10 using the substrate 11. With the use of the member 21 having the projections illustrated in FIG. 15A, pressure can be applied in one step to the two light-emitting devices 10 in each of which the light-emitting element 15 is formed over the substrate 11.

As described above, in the method for manufacturing the light-emitting device of one embodiment of the present invention, the shape is changed by pressure application at the same time as heating after the bonding layer for sealing the light-emitting element is cured once. Accordingly, the shape of the bonding layer can be locally changed. Thus, the reliability of the light-emitting device can be improved, and a decrease in viewing-angle characteristics and a degradation of display quality of the light-emitting device can be suppressed.

In addition, in the manufacturing method of one embodiment of the present invention, pressure is applied to the bonding layer after the formation substrate for forming the light-emitting element or the like is separated. Accordingly, a decrease in yield of the separation step due to the change in shape of the light-emitting device can be suppressed. Furthermore, in the manufacturing method of one embodiment of the present invention, pressure is applied to the bonding layer after the formation substrate is separated and before another substrate is attached. Accordingly, pressure can be applied to the bonding layer 17 more directly than in the case where pressure is applied to the bonding layer through the substrate. Thus, the bonding layer 17 can be surely made thinner than at the other portion.

This embodiment can be combined with any other embodiment as appropriate.

Embodiment 2

In this embodiment, a light-emitting device of one embodiment of the present invention will be described with reference to drawings.

Light-emitting devices including EL elements are mainly described in this embodiment as examples; however, one embodiment of the present invention is not limited to this example. The light-emitting devices described in this embodiment each have a region thinner than a light-emitting portion in a non-light-emitting portion and are thus highly reliable.

In this embodiment, the light-emitting device can have a structure in which subpixels of three colors of red (R), green (G), and blue (B), for example, express one color; a structure in which subpixels of four colors of R, G, B, and white (W) express one color; a structure in which subpixels of four colors of R, G, B, and yellow (Y) express one color; or the like. There is no particular limitation on color elements, and colors other than R, G, B, W, and Y may be used. For example, cyan, magenta, or the like may be used.

Figure 16A:
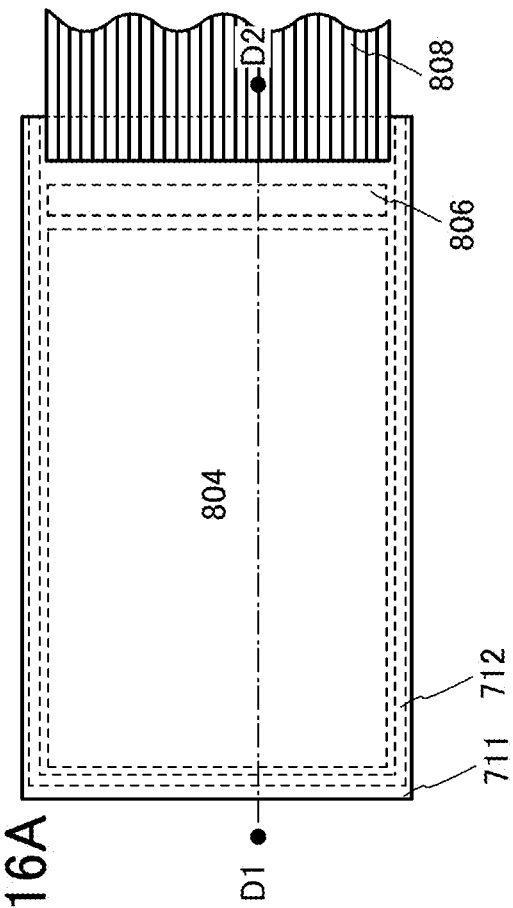
FIGS. 16A and 16B are a top view and a cross-sectional view illustrating an example of a light-emitting device.
Figure 16B:
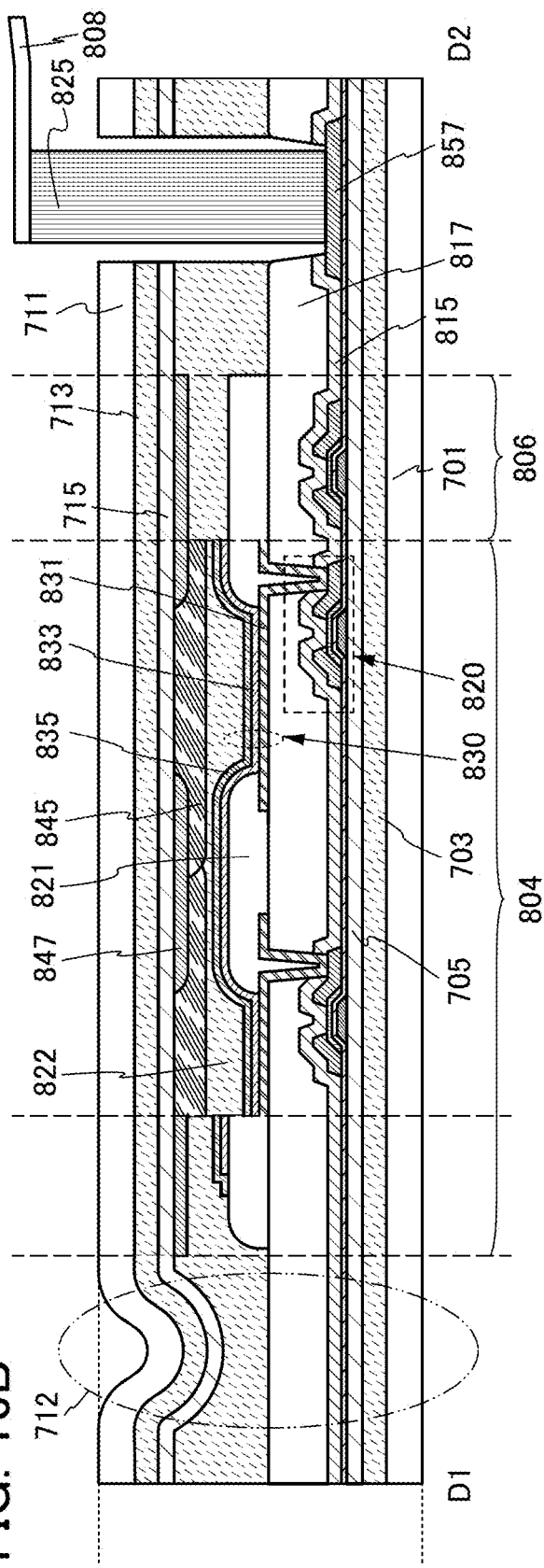

FIG. 16A is a plan view of a light-emitting device, and FIG. 16B is an example of a cross-sectional view taken along the dashed-dotted line D1-D2 in FIG. 16A. The light-emitting device illustrated in FIGS. 16A and 16B is a top-emission light-emitting device using a color filter method.

The light-emitting device illustrated in FIG. 16A includes a light-emitting portion 804 and a driver circuit portion 806. Regions other than the light-emitting portion 804 in the light-emitting device can be regarded as non-light-emitting portions. An FPC 808 is connected to the light-emitting device. A depression 712 is provided along three sides of the light-emitting device. The depression 712 is a portion thinner than other portions of the light-emitting device.

The light-emitting device illustrated in FIG. 16B includes a first flexible substrate 701, a first bonding layer 703, a first insulating layer 705, a first functional layer (a plurality of transistors, a conductive layer 857, an insulating layer 815, an insulating layer 817, a plurality of light-emitting elements, and an insulating layer 821), a third bonding layer 822, a second functional layer (a coloring layer 845 and a light-blocking layer 847), a second insulating layer 715, a second bonding layer 713, and a second flexible substrate 711. The third bonding layer 822, the second insulating layer 715, the second bonding layer 713, and the second flexible substrate 711 transmit visible light. Light-emitting elements and transistors included in the light-emitting portion 804 and the driver circuit portion 806 are sealed with the first flexible substrate 701, the second flexible substrate 711, and the third bonding layer 822.

The first insulating layer 705 and the first flexible substrate 701 are attached to each other with the first bonding layer 703. The second insulating layer 715 and the second flexible substrate 711 are attached to each other with the second bonding layer 713. The first insulating layer 705 and the second insulating layer 715 are preferably highly resistant to moisture. A light-emitting element 830, the transistors, and the like are preferably provided between a pair of insulating layers which are highly resistant to moisture, in which case impurities such as moisture can be prevented from entering these elements, leading to higher reliability of the light-emitting device.

The light-emitting portion 804 includes a transistor 820 and the light-emitting element 830 over the first flexible substrate 701 with the first bonding layer 703 and the first insulating layer 705 provided therebetween. The light-emitting element 830 includes a lower electrode 831 over the insulating layer 817, an EL layer 833 over the lower electrode 831, and an upper electrode 835 over the EL layer 833. The lower electrode 831 is electrically connected to a source electrode or a drain electrode of the transistor 820. An end portion of the lower electrode 831 is covered with the insulating layer 821. The lower electrode 831 preferably reflects visible light. The upper electrode 835 transmits visible light.

The light-emitting portion 804 includes the coloring layer 845 overlapping with the light-emitting element 830 and the light-blocking layer 847 overlapping with the insulating layer 821. The space between the light-emitting element 830 and the coloring layer 845 is filled with the third bonding layer 822.

The insulating layer 815 has an effect of inhibiting diffusion of impurities to a semiconductor included in the transistor. As the insulating layer 817, an insulating layer having a planarization function is preferably selected in order to reduce surface unevenness due to the transistor.

The light-emitting device illustrated in FIG. 16B can be manufactured by the manufacturing method 3 in Embodiment 1. The first insulating layer 705 and the first functional layer are formed as one layer to be separated. The second insulating layer 715 and the second functional layer are formed as the other layer to be separated.

The insulating layer 817 is preferably provided in the entire area of the light-emitting device as illustrated in FIG. 16B, in which case the yield of the separation step can be increased.

In the case where an organic material is used for the insulating layer 817, an impurity such as moisture outside the insulating layer 817 might enter the light-emitting element 830 or the like through the insulating layer 817. Deterioration of the light-emitting element 830 due to the entry of an impurity leads to deterioration of the light-emitting device. Thus, as illustrated in FIG. 17A, it is preferable that an opening which reaches an inorganic film (here, the insulating layer 815) be formed in the insulating layer 817 so that an impurity such as moisture entering from the outside of the light-emitting device does not easily reach the light-emitting element 830.

The driver circuit portion 806 includes a plurality of transistors over the first flexible substrate 701 with the first bonding layer 703 and the first insulating layer 705 provided therebetween. In FIG. 16B, one of the transistors included in the driver circuit portion 806 is illustrated.

Although FIG. 16B illustrates bottom-gate transistors as an example, there is no limitation on the structure of the transistors included in the light-emitting device of one embodiment of the present invention.

For example, a transistor 848 illustrated in FIGS. 17B to 17D can be used in the light-emitting device of one embodiment of the present invention.

FIG. 17B is a top view of the transistor 848. FIG. 17C is a cross-sectional view in the channel length direction of the transistor 848 in the light-emitting device of one embodiment of the present invention. The cross section of the transistor 848 illustrated in FIG. 17C is taken along the dashed-dotted line X1-X2 in FIG. 17B. FIG. 17D is a cross-sectional view in the channel width direction of the transistor 848 in the light-emitting device of one embodiment of the present invention. The cross section of the transistor 848 illustrated in FIG. 17D is taken along the dashed-dotted line Y1-Y2 in FIG. 17B.

The transistor 848 is a type of top-gate transistor including a back gate.

In the transistor 848, a semiconductor layer 742 is formed over a projection of an insulating layer 772. When the semiconductor layer 742 is provided over the projection of the insulating layer 772, the side surface of the semiconductor layer 742 can also be covered with a gate 743. Thus, the transistor 848 has a structure in which the semiconductor layer 742 can be electrically surrounded by an electric field of the gate 743. Such a structure of a transistor in which a semiconductor layer in which a channel is formed is electrically surrounded by an electric field of a conductive layer is called a surrounded channel (s-channel) structure. A transistor with an s-channel structure is referred to as an s-channel transistor.

In the s-channel structure, a channel can be formed in the whole (bulk) of the semiconductor layer 742. In the s-channel structure, the drain current of the transistor can be increased, so that a larger amount of on-state current can be obtained. Furthermore, the entire channel formation region of the semiconductor layer 742 can be depleted by the electric field of the gate 743. Accordingly, the off-state current of the transistor with the s-channel structure can further be reduced.

A back gate 723 is provided over an insulating layer 378.

A conductive layer 744a provided over an insulating layer 729 is electrically connected to the semiconductor layer 742 through an opening 747c formed in a gate insulating layer 312, an insulating layer 728, and the insulating layer 729. A conductive layer 744b provided over the insulating layer 729 is electrically connected to the semiconductor layer 742 through an opening 747d formed in the gate insulating layer 312 and the insulating layers 728 and 729.

The gate 743 provided over the gate insulating layer 312 is electrically connected to the back gate 723 through an opening 747a and an opening 747b formed in the gate insulating layer 312 and the insulating layer 772. Accordingly, the same potential is supplied to the gate 743 and the back gate 723. Furthermore, either or both of the openings 747a and 747b may be omitted. In the case where both the openings 747a and 747b are omitted, different potentials can be supplied to the back gate 723 and the gate 743.

As a semiconductor in the transistor having the s-channel structure, an oxide semiconductor, silicon such as polycrystalline silicon or single crystal silicon that is transferred from a single crystal silicon substrate, or the like is used.

The first insulating layer 705 and the first flexible substrate 701 are attached to each other with the first bonding layer 703. The second insulating layer 715 and the second flexible substrate 711 are attached to each other with the second bonding layer 713. One or both of the first insulating layer 705 and the second insulating layer 715 is preferably highly resistant to moisture, in which case impurities such as water can be prevented from entering the light-emitting element 830 or the like, leading to higher reliability of the light-emitting device.

The conductive layer 857 is an example of an external connection electrode. The conductive layer 857 is electrically connected to an external input terminal through which a signal and a potential from the outside is transmitted to the driver circuit portion 806. Here, an example in which the FPC 808 is provided as the external input terminal is described. To prevent an increase in the number of manufacturing steps, the conductive layer 857 is preferably formed using the same material and the same step as those of electrodes and wirings in the light-emitting portion or the driver circuit portion. Here, an example is described in which the conductive layer 857 is formed using the same material and the same step as those of the electrodes of the transistor 820.

In the light-emitting device in FIG. 16B, the FPC 808 is positioned over the second flexible substrate 711. A connector 825 is connected to the conductive layer 857 through an opening provided in the second flexible substrate 711, the second bonding layer 713, the second insulating layer 715, the third bonding layer 822, the insulating layer 817, and the insulating layer 815. The connector 825 is also connected to the FPC 808. The FPC 808 and the conductive layer 857 are electrically connected to each other via the connector 825. When the conductive layer 857 and the second flexible substrate 711 overlap with each other, an opening is formed in the second flexible substrate 711 (or a substrate with an opening portion is used) so that the conductive layer 857, the connector 825, and the FPC 808 can be electrically connected to each other.

In the case of employing the manufacturing method 3-C described in Embodiment 1, the step S3-12C (the step of applying pressure to the non-light-emitting portion) is preferably performed after the conductive layer 857 is exposed by forming the opening in the second flexible substrate 711 and the like. Accordingly, a decrease in yield of the step of exposing the conductive layer 857 due to a change in shape of the light-emitting device can be suppressed.

Figure 18A:
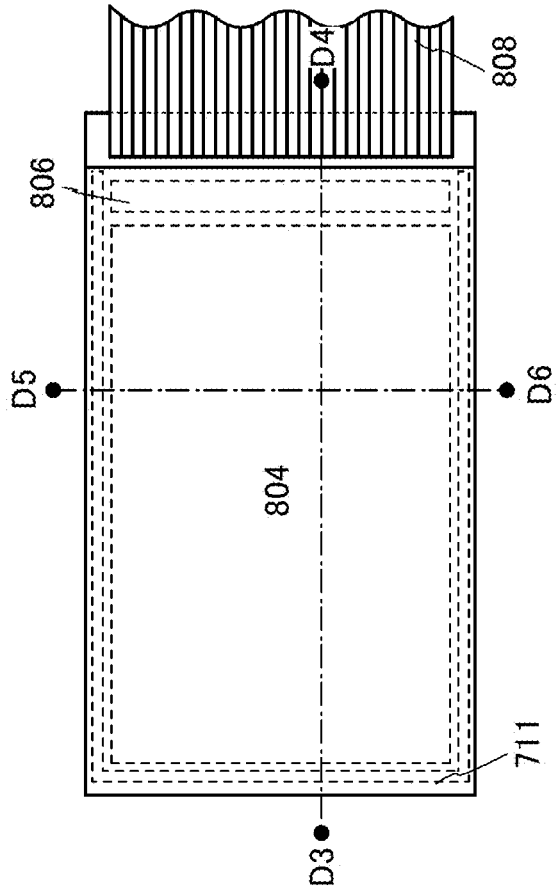
FIGS. 18A and 18B are a top view and a cross-sectional view illustrating an example of a light-emitting device.
Figure 18B:
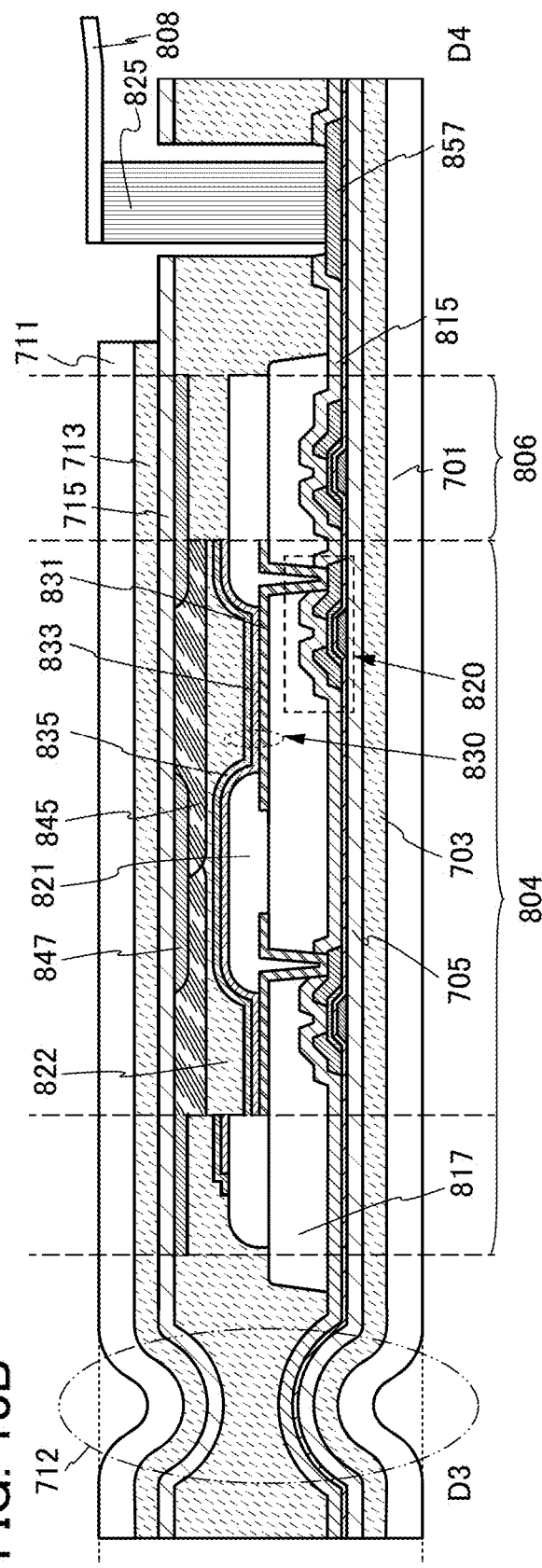

A modification example of the light-emitting device illustrated in FIGS. 16A and 16B is illustrated in FIGS. 18A, 18B, and 19A. FIG. 18A is a plan view of a light-emitting device, and FIG. 18B is an example of a cross-sectional view taken along the dashed-dotted line D3-D4 in FIG. 18A. FIG. 19A is an example of a cross-sectional view taken along the dashed-dotted line D5-D6 in FIG. 18A.

The light-emitting device illustrated in FIGS. 18A and 18B is an example in which the first flexible substrate 701 and the second flexible substrate 711 have different sizes. The FPC 808 is located over the second insulating layer 715 and does not overlap with the second flexible substrate 711. The connector 825 is connected to the conductive layer 857 through an opening provided in the second insulating layer 715, the third bonding layer 822, the insulating layer 817, and the insulating layer 815. Since no opening needs to be provided in the second flexible substrate 711, there is no limitation on the material for the second flexible substrate 711.

In the case of employing the manufacturing method 3-C or 3-D described in Embodiment 1, the step of applying pressure to the non-light-emitting portion is preferably performed after the conductive layer 857 is exposed by forming the opening in the second insulating layer 715 and the like. Accordingly, a decrease in yield of the step of exposing the conductive layer 857 due to a change in shape of the light-emitting device can be suppressed.

The depression 712 is provided in the non-light-emitting portion of any of the light-emitting devices illustrated in FIGS. 16B, 17B, 18B, and 19A. In the depression 712, the second flexible substrate 711, the second bonding layer 713, and the second insulating layer 715 have depressions. In the depression 712 of the light-emitting device illustrated in FIG. 18B and FIG. 19A, the first flexible substrate 701, the first bonding layer 703, and the first insulating layer 705 have depressions. The non-light-emitting portion has a portion thinner than the light-emitting portion in this manner, whereby entry of impurities through a side surface of the light-emitting device can be inhibited.

In the case where an organic resin with a poor gas barrier property or a poor moisture-resistant property is used for forming the insulating layers, it is preferable that the insulating layers not be exposed at an end portion of the light-emitting device. With this structure, entry of impurities through a side surface of the light-emitting device can be inhibited. For example, a structure may be employed in which the insulating layer 817 is not provided at an end portion of the light-emitting device as illustrated in FIGS. 18B and 19A.

FIG. 19B illustrates a modification example of the light-emitting element 830.

Note that as illustrated in FIG. 19B, the light-emitting element 830 may include an optical adjustment layer 832 between the lower electrode 831 and the EL layer 833. It is preferable to use a conductive material having a light-transmitting property for the optical adjustment layer 832. Owing to the combination of a color filter (the coloring layer) and a microcavity structure (the optical adjustment layer), light with high color purity can be extracted from the light-emitting device of one embodiment of the present invention. The thickness of the optical adjustment layer may be set in accordance with the emission color of the sub-pixel.

Modification examples of the light-emitting device illustrated in FIG. 16B are illustrated in FIGS. 20A and 20B and FIGS. 21A and 21B.

Each of the light-emitting devices illustrated in FIGS. 20A and 20B and FIGS. 21A and 21B differs from the light-emitting device illustrated in FIG. 16B in including a spacer 810 in the non-light-emitting portion.

The spacer 810 is preferably positioned at the depression 712. In that case, the minimum thickness of the bonding layer 822 can be further decreased.

A surface of the spacer 810 is preferably an insulating film. In that case, impurities such as moisture do not easily pass through the spacer 810, and the impurities do not easily reach the light-emitting element 830. Thus, deterioration of the light-emitting device can be suppressed.

Figures 20A, 20B:
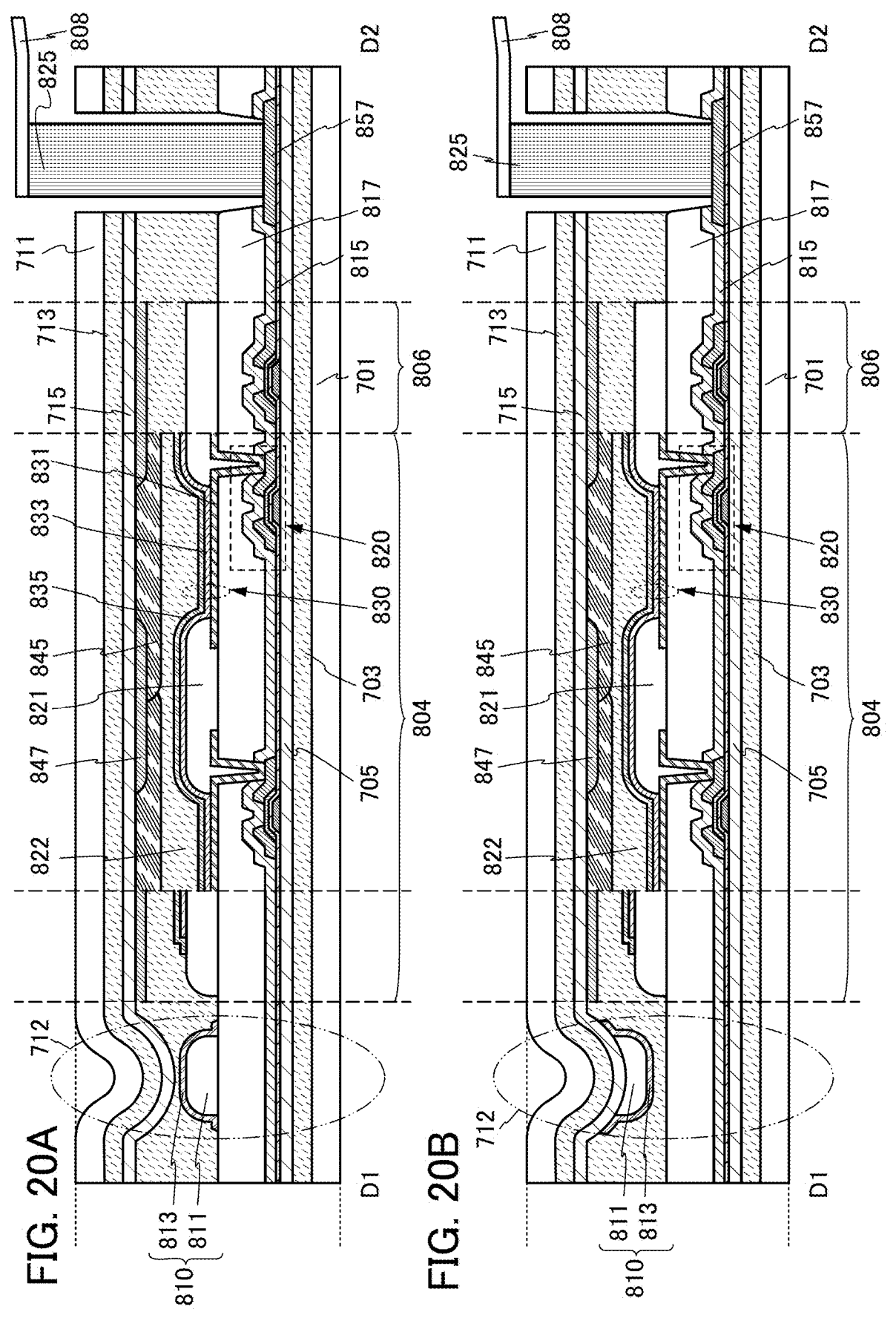

The spacer 810 included in the light-emitting device illustrated in FIG. 20A has a structure in which an insulating layer 811 over the insulating layer 817 and an inorganic insulating layer 813 over the insulating layer 811 are stacked. The insulating layer 811 can be formed using the same material and the same step as those of the insulating layer 821. The inorganic insulating layer 813 covers a top surface and a side surface of the insulating layer 811.

The spacer 810 included in the light-emitting device illustrated in FIG. 20B has a structure in which the insulating layer 811 between the second insulating layer 715 and the bonding layer 822 and the inorganic insulating layer 813 between the insulating layer 811 and the bonding layer 822 are stacked. The inorganic insulating layer 813 covers the top surface and the side surface of the insulating layer 811.

The spacer 810 may be provided on either the first flexible substrate 701 side or the second flexible substrate 711 side or both the first flexible substrate 701 side and the second flexible substrate 711 side.

The spacer 810 included in the light-emitting device illustrated in FIG. 21A has a structure in which the insulating layer 811 over the insulating layer 817, an insulating layer 812 over the insulating layer 811, and the inorganic insulating layer 813 over the insulating layer 812 are stacked. The insulating layer 811 can be formed using the same material and the same step as those of the insulating layer 821. The inorganic insulating layer 813 covers a top surface and a side surface of the insulating layer 812 and the top surface and the side surface of the insulating layer 811.

The spacer 810 included in the light-emitting device illustrated in FIG. 21B has a single-layer structure over the insulating layer 817. The spacer 810 is formed using an inorganic insulating material.

Figure 22A:
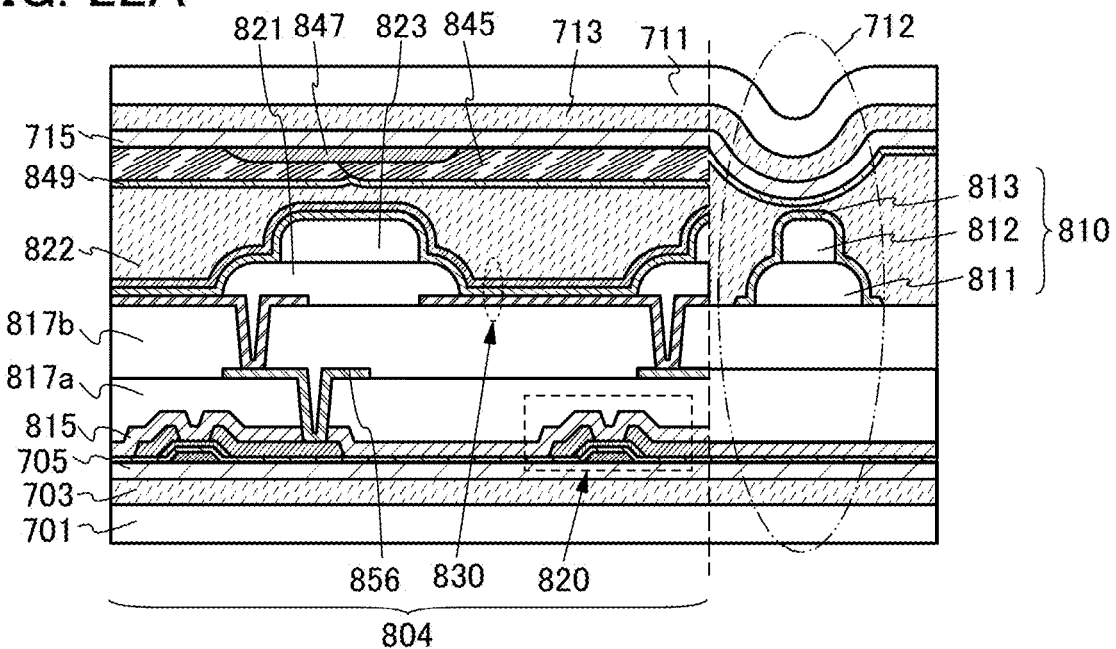
FIGS. 22A and 22B are cross-sectional views each illustrating an example of a light-emitting device.
Figure 22B:
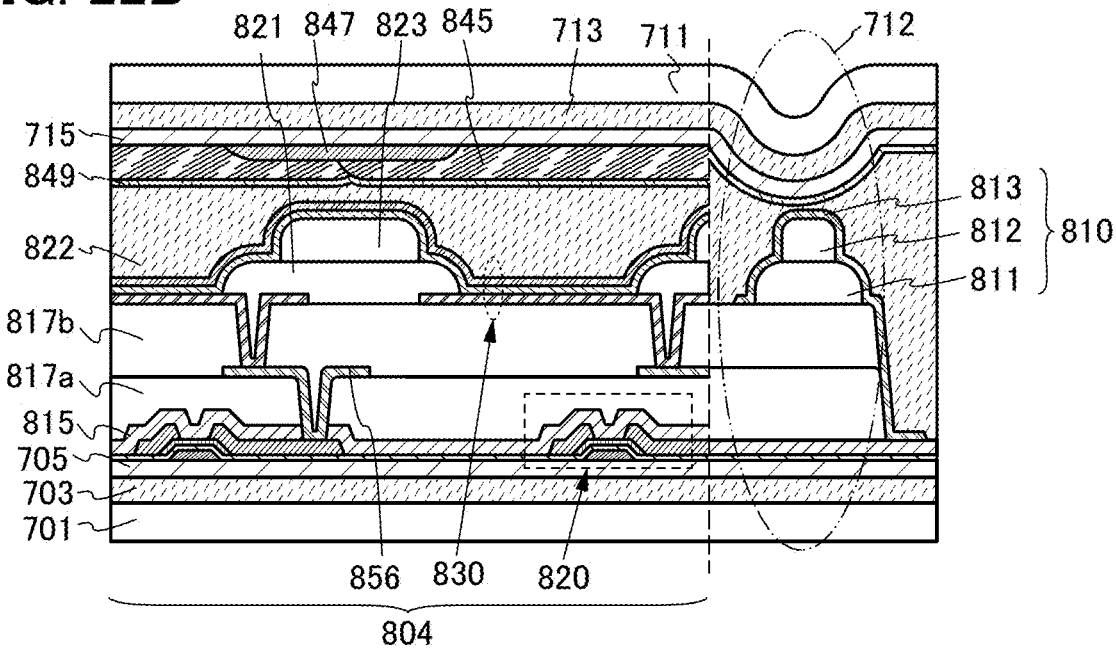

Modification examples of the light-emitting portion 804 and the depression 712 are illustrated in FIGS. 22A and 22B.

Light-emitting devices illustrated in FIGS. 22A and 22B each include insulating layers 817a and 817b and a conductive layer 856 over the insulating layer 817a. The source electrode or the drain electrode of the transistor 820 and the lower electrode of the light-emitting element 830 are electrically connected to each other through the conductive layer 856.

The light-emitting devices in FIGS. 22A and 22B each include a spacer 823 over the insulating layer 821 in the light-emitting portion 804. The spacer 823 can adjust the gap between the first flexible substrate 701 and the second flexible substrate 711.

The light-emitting devices in FIGS. 22A and 22B each include an overcoat 849 covering the coloring layer 845 and the light-blocking layer 847. The space between the light-emitting element 830 and the overcoat 849 is filled with the bonding layer 822.

The light-emitting device preferably includes the spacer 810 in the depression 712. In that case, the minimum thickness of the bonding layer 822 can be further decreased.

The spacer 810 included in the light-emitting device illustrated in FIG. 22A has a structure in which the insulating layer 811 over the insulating layer 817b, the insulating layer 812 over the insulating layer 811, and the inorganic insulating layer 813 over the insulating layer 812 are stacked. The insulating layer 811 can be formed using the same material and the same step as those of the insulating layer 821. The insulating layer 812 can be formed using the same material and the same step as those of the spacer 823 positioned in the light-emitting portion 804. The inorganic insulating layer 813 covers the top surface and the side surface of the insulating layer 812 and the top surface and the side surface of the insulating layer 811.

The light-emitting device illustrated in FIG. 22B differs from the light-emitting device illustrated in FIG. 22A in that the inorganic insulating layer 813 covers an end portion of the insulating layer 817a and an end portion of the insulating layer 817b. In the case where organic insulating layers are used as the insulating layers 817a and 817b, the end portions thereof are preferably covered with the inorganic insulating layer 813. In that case, entry of impurities such as moisture into the insulating layer 817a or 817b and also arrival thereof at the light-emitting element 830 can be inhibited.

As illustrated in FIG. 23A, the light-emitting device of one embodiment of the present invention can be a bottom-emission light-emitting device using a color filter method.

The light-emitting device in FIG. 23A includes the first flexible substrate 701, the first bonding layer 703, the first insulating layer 705, a first functional layer (a plurality of transistors, the insulating layer 815, the coloring layer 845, the insulating layer 817a, the insulating layer 817b, the conductive layer 856, a plurality of light-emitting elements, and the insulating layer 821), the second bonding layer 713, and the second flexible substrate 711. The first flexible substrate 701, the first bonding layer 703, the first insulating layer 705, the insulating layer 815, the insulating layer 817a, and the insulating layer 817b transmit visible light.

The light-emitting portion 804 includes the transistor 820, a transistor 824, and the light-emitting element 830 over the first flexible substrate 701 with the first bonding layer 703 and the first insulating layer 705 provided therebetween. The light-emitting element 830 includes the lower electrode 831 over the insulating layer 817b, the EL layer 833 over the lower electrode 831, and the upper electrode 835 over the EL layer 833. The lower electrode 831 is electrically connected to a source electrode or a drain electrode of the transistor 820. An end portion of the lower electrode 831 is covered with the insulating layer 821. The upper electrode 835 preferably reflects visible light. The lower electrode 831 transmits visible light. The coloring layer 845 that overlaps with the light-emitting element 830 can be provided anywhere; for example, the coloring layer 845 may be provided between the insulating layers 817a and 817b or between the insulating layers 815 and 817a.

The first insulating layer 705 and the first flexible substrate 701 are attached to each other with the first bonding layer 703. The first insulating layer 705 is preferably highly resistant to moisture, in which case impurities such as water can be prevented from entering the light-emitting element 830 and the like, leading to higher reliability of the light-emitting device.

The light-emitting device illustrated in FIG. 23A can be manufactured by the manufacturing method 2 in Embodiment 1. The first insulating layer 705 and the first functional layer are formed as the layer to be separated.

As illustrated in FIG. 23B, the light-emitting device of one embodiment of the present invention can be a top-emission light-emitting device using a separate coloring method.

The light-emitting device in FIG. 23B includes the first flexible substrate 701, the first bonding layer 703, the first insulating layer 705, a first functional layer (a plurality of transistors, the insulating layer 815, the insulating layer 817, a plurality of light-emitting elements, the insulating layer 821, and the spacer 823), the second bonding layer 713, and the second flexible substrate 711. The second bonding layer 713 and the second flexible substrate 711 transmit visible light.

The light-emitting device illustrated in FIG. 23B can be manufactured by the manufacturing method 2 in Embodiment 1. The first insulating layer 705 and the first functional layer are formed as the layer to be separated.

A light-emitting device illustrated in FIG. 23C includes the first flexible substrate 701, the first bonding layer 703, the first insulating layer 705, a first functional layer (a conductive layer 814, a conductive layer 857a, a conductive layer 857b, the light-emitting element 830, and the insulating layer 821), the second bonding layer 713, and the second flexible substrate 711.

The light-emitting device illustrated in FIG. 23C can be manufactured by the manufacturing method 2 in Embodiment 1. The first insulating layer 705 and the first functional layer are formed as the layer to be separated.

The conductive layer 857a and the conductive layer 857b, which are external connection electrodes of the light-emitting device, can each be electrically connected to an FPC or the like.

The light-emitting element 830 includes the lower electrode 831, the EL layer 833, and the upper electrode 835. An end portion of the lower electrode 831 is covered with the insulating layer 821. The light-emitting element 830 has a bottom emission structure, a top emission structure, or a dual emission structure. The electrode, the substrate, the insulating layer, and the like through each of which light is extracted transmit visible light. The conductive layer 814 is electrically connected to the lower electrode 831.

The substrate through which light is extracted may have, as a light extraction structure, a hemispherical lens, a micro lens array, a film provided with an uneven surface structure, a light diffusing film, or the like. For example, a substrate having the light extraction structure can be formed by bonding the above lens or film to a resin substrate with an adhesive or the like having substantially the same refractive index as the substrate or the lens or film.

The conductive layer 814 is preferably, though not necessarily, provided because voltage drop due to the resistance of the lower electrode 831 can be inhibited. In addition, for a similar purpose, a conductive layer electrically connected to the upper electrode 835 may be provided over the insulating layer 821, the EL layer 833, the upper electrode 835, or the like.

The conductive layer 814 can be formed to have a single-layer structure or a stacked-layer structure using a material selected from copper, titanium, tantalum, tungsten, molybdenum, chromium, neodymium, scandium, nickel, and aluminum, an alloy material containing any of these materials as its main component, or the like. The thickness of the conductive layer 814 can be greater than or equal to 0.1 μm and less than or equal to 3 μm, preferably greater than or equal to 0.1 μm and less than or equal to 0.5 μm, for example.

EXAMPLES OF MATERIALS

Next, materials and the like that can be used for the light-emitting devices are described. Note that description on the components already described in this specification is omitted in some cases.

The structure of the transistors in the light-emitting device is not particularly limited. For example, a planar transistor, a forward staggered transistor, or an inverted staggered transistor may be used. A top-gate transistor or a bottom-gate transistor may be used. Gate electrodes may be provided above and below a channel.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. It is preferable that a semiconductor having crystallinity be used, in which case deterioration of the transistor characteristics can be suppressed.

A semiconductor material used for the semiconductor layer of the transistor is not particularly limited, and for example, a Group 14 element, a compound semiconductor, or an oxide semiconductor can be used. Typically, a semiconductor containing silicon, a semiconductor containing gallium arsenide, an oxide semiconductor containing indium, or the like can be used.

An oxide semiconductor is preferably used as a semiconductor where a channel of the transistor is formed. In particular, an oxide semiconductor having a wider band gap than silicon is preferably used. A semiconductor material having a wider band gap and a lower carrier density than silicon is preferably used because off-state current of the transistor can be reduced.

For example, the oxide semiconductor preferably contains at least indium (In) or zinc (Zn). Further preferably, the oxide semiconductor contains an oxide represented by an In-M-Zn oxide (M is a metal such as Al, Ti, Ga, Ge, Y, Zr, Sn, La, Ce, Hf, or Nd).

A c-axis aligned crystalline oxide semiconductor (CAAC-OS) is preferably used as a semiconductor material for the transistors. Unlike amorphous semiconductor, the CAAC-OS has few defect states, so that the reliability of the transistor can be improved. Moreover, since the CAAC-OS does not have a grain boundary, a stable and uniform film can be formed over a large area, and stress that is caused by bending a flexible light-emitting device does not easily make a crack in a CAAC-OS film.

The CAAC-OS is a crystalline oxide semiconductor in which c-axes of crystals are oriented in a direction substantially perpendicular to the film surface. It has been found that oxide semiconductors have a variety of crystal structures other than a single-crystal structure. An example of such structures is a nano-crystal (nc) structure, which is an aggregate of nanoscale microcrystals. The crystallinity of a CAAC-OS structure is lower than that of a single-crystal structure and higher than that of an nc structure.

The CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

An organic insulating material or an inorganic insulating material can be used for the insulating layers included in the light-emitting device. Examples of organic resins include an acrylic resin, an epoxy resin, a polyimide resin, a polyamide resin, a polyimide-amide resin, a polysiloxane resin, a benzocyclobutene-based resin, and a phenol resin. Examples of inorganic insulating films include a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film.

The conductive layers included in the light-emitting device can each have, for example, a single-layer structure or a stacked-layer structure including any of metals such as aluminum, titanium, chromium, nickel, copper, yttrium, zirconium, molybdenum, silver, tantalum, and tungsten or an alloy containing any of these metals as its main component. Note that a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide containing silicon oxide may be used for the conductive layers. Alternatively, a semiconductor such as an oxide semiconductor or polycrystalline silicon whose resistance is lowered by containing an impurity element or the like, or silicide such as nickel silicide may be used.

The light-emitting device of one embodiment of the present invention may have any of a top emission structure, a bottom emission structure, and a dual emission structure.

When a voltage higher than the threshold voltage of the light-emitting element is applied between the lower electrode 831 and the upper electrode 835, holes are injected to the EL layer 833 from the anode side and electrons are injected to the EL layer 833 from the cathode side. The injected electrons and holes are recombined in the EL layer 833 and a light-emitting substance contained in the EL layer 833 emits light.

A conductive layer that transmits visible light is used as the electrode through which light is extracted. A conductive layer that reflects visible light is preferably used as the electrode through which light is not extracted.

The conductive layer that transmits visible light can be formed using, for example, indium oxide, indium tin oxide (ITO), indium zinc oxide, zinc oxide (ZnO), or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. Alternatively, a stacked film of any of the above materials can be used as the conductive layer. For example, a stacked film of ITO and an alloy of silver and magnesium is preferably used, in which case conductivity can be increased. Further alternatively, graphene or the like may be used.

For the conductive layer that reflects visible light, for example, a metal material such as aluminum, gold, platinum, silver, nickel, tungsten, chromium, molybdenum, iron, cobalt, copper, or palladium or an alloy containing any of these metal materials can be used. Further, lanthanum, neodymium, germanium, or the like may be added to the metal material or the alloy. Furthermore, an alloy containing aluminum (an aluminum alloy) such as an alloy of aluminum and titanium, an alloy of aluminum and nickel, an alloy of aluminum and neodymium, or an alloy of aluminum, nickel, and lanthanum (Al—Ni—La); or an alloy containing silver such as an alloy of silver and copper, an alloy of silver, palladium, and copper (also referred to as Ag—Pd—Cu or APC), or an alloy of silver and magnesium may be used. An alloy containing silver and copper is preferable because of its high heat resistance. Further, when a metal film or a metal oxide film is stacked on and in contact with an aluminum alloy film, oxidation of the aluminum alloy film can be prevented. Examples of materials for the metal film or the metal oxide film include titanium and titanium oxide. Alternatively, the above conductive layer that transmits visible light and a film containing a metal material may be stacked. For example, a stacked film of silver and ITO or a stacked film of an alloy of silver and magnesium and ITO can be used.

Each of the electrodes can be formed by an evaporation method or a sputtering method. Alternatively, a discharging method such as an inkjet method, a printing method such as a screen printing method, or a plating method may be used.

The EL layer includes at least a light-emitting layer. The EL layer 833 may include a plurality of light-emitting layers. In addition to the light-emitting layer, the EL layer 833 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer 833, either a low molecular compound or a high molecular compound can be used, and an inorganic compound may also be used. Each of the layers included in the EL layer 833 can be formed by any of the following methods: an evaporation method (including a vacuum evaporation method), a transfer method, a printing method, an inkjet method, a coating method, and the like.

The light-emitting element may contain two or more kinds of light-emitting substances. Thus, for example, a light-emitting element that emits white light can be obtained. For example, a white emission can be obtained by selecting light-emitting substances so that two or more kinds of light-emitting substances emit light of complementary colors. A light-emitting substance that emits red (R) light, green (G) light, blue (B) light, yellow (Y) light, or orange (O) light or a light-emitting substance that emits light containing spectral components of two or more of R light, G light, and B light can be used, for example. A light-emitting substance that emits blue light and a light-emitting substance that emits yellow light may be used, for example. At this time, the emission spectrum of the light-emitting substance that emits yellow light preferably contains spectral components of G light and R light. The emission spectrum of the light-emitting element preferably has two or more peaks in the wavelength range in a visible region (e.g., greater than or equal to 350 nm and less than or equal to 750 nm or greater than or equal to 400 nm and less than or equal to 800 nm).

Moreover, the light-emitting element may be a single element including one EL layer or a tandem element in which EL layers are stacked with a charge generation layer provided therebetween.

In one embodiment of the present invention, a light-emitting element containing an inorganic compound such as a quantum dot may be employed. Examples of quantum dot materials include a colloidal quantum dot material, an alloyed quantum dot material, a core-shell quantum dot material, a core quantum dot material, and the like. For example, an element such as cadmium (Cd), selenium (Se), zinc (Zn), sulfur (S), phosphorus (P), indium (In), tellurium (Te), lead (Pb), gallium (Ga), arsenic (As), or aluminum (Al) may be contained.

As the insulating layer 815, an inorganic insulating film such as a silicon oxide film, a silicon oxynitride film, or an aluminum oxide film can be used, for example. For example, an organic material such as polyimide, acrylic, polyamide, polyimide amide, or a benzocyclobutene-based resin can be used for the insulating layer 817, the insulating layer 817a, and the insulating layer 817b. It is also possible to use a low-dielectric constant material (a low-k material) or the like. Furthermore, each insulating layer may be formed by stacking a plurality of insulating films.

The insulating layer 821 is formed using an organic insulating material or an inorganic insulating material. As the resin, for example, a polyimide resin, a polyamide resin, an acrylic resin, a polysiloxane resin, an epoxy resin, or a phenol resin can be used. It is particularly preferable that the insulating layer 821 be formed using a photosensitive resin material to have an opening portion over the lower electrode 831 so that a side wall of the insulating layer 821 is formed as an inclined surface with a curvature.

There is no particular limitation on the method for forming the insulating layer 821; a photolithography method, a sputtering method, an evaporation method, a droplet discharging method (e.g., an inkjet method), a printing method (e.g., a screen printing method or an off-set printing method), or the like can be used.

The spacer 823 can be formed using an inorganic insulating material, an organic insulating material, a metal material, or the like. As the inorganic insulating material and the organic insulating material, for example, a variety of materials that can be used for the aforementioned insulating layers can be used. As the metal material, titanium, aluminum, or the like can be used. When the spacer 823 containing a conductive material is electrically connected to the upper electrode 835, a potential drop due to the resistance of the upper electrode 835 can be inhibited. The spacer 823 may have either a tapered shape or an inverse tapered shape.

The coloring layer is a coloring layer that transmits light in a specific wavelength range. For example, a color filter for transmitting light in a red, green, blue, or yellow wavelength range can be used. Examples of materials that can be used for the coloring layer include a metal material, a resin material, and a resin material containing a pigment or dye.

Note that one embodiment of the present invention is not limited to a color filter method, and a separate coloring method, a color conversion method, a quantum dot method, and the like may be employed.

The light-blocking layer is provided between the adjacent coloring layers. The light-blocking layer blocks light emitted from an adjacent light-emitting element to inhibit color mixture between adjacent light-emitting elements. Here, the coloring layer is provided such that its end portion overlaps with the light-blocking layer, whereby light leakage can be reduced. As the light-blocking layer, a material that can block light from the light-emitting element can be used; for example, a black matrix can be formed using a metal material or a resin material containing pigment or dye. Note that it is preferable to provide the light-blocking layer in a region other than the light-emitting portion, such as a driver circuit portion, in which case undesired leakage of guided light or the like can be inhibited.

The overcoat can prevent impurities and the like contained in the coloring layer from being diffused into the light-emitting element. The overcoat is formed with a material that transmits light emitted from the light-emitting element; for example, an inorganic insulating film such as a silicon nitride film or a silicon oxide film, or an organic insulating film such as an acrylic film or a polyimide film can be used, and further, a stacked structure of an organic insulating film and an inorganic insulating film may be employed.

In the case where a material of the bonding layer is applied to the coloring layer and the light-blocking layer, a material with high wettability with respect to the material of the bonding layer is preferably used as a material of the overcoat. For example, an oxide conductive layer such as an ITO film or a metal film such as an Ag film which is thin enough to transmit light is preferably used as the overcoat.

When the overcoat is formed using a material that has high wettability with respect to the material for the bonding layer, the material for the bonding layer can be uniformly applied. Thus, entry of bubbles in the step of attaching the pair of substrates to each other can be prevented, and thus defective display can be inhibited.

As the connector, any of various anisotropic conductive films (ACF), anisotropic conductive pastes (ACP), and the like can be used.

Note that the light-emitting device of one embodiment of the present invention may be used as a display device or as a lighting device. For example, it may be used as a light source such as a backlight or a front light, that is, a lighting device for a display panel.

As described above in this embodiment, in the light-emitting device of one embodiment of the present invention, entry of impurities through a side surface of the light-emitting device can be inhibited because the non-light-emitting portion has a region thinner than the light-emitting portion. Thus, the light-emitting device can be highly reliable.

This embodiment can be combined with any other embodiment as appropriate.

Embodiment 3

In this embodiment, an input/output device of one embodiment of the present invention will be described with reference to drawings. Note that the above description can be referred to for the components of the input/output device, which are similar to those of the light-emitting device described in Embodiment 2. Although an input/output device including a light-emitting element is described as an example in this embodiment, one embodiment of the present invention is not limited thereto. The input/output device described in this embodiment is also a touch panel.

The input/output devices described in this embodiment each have a region thinner than a display portion in a non-display portion and are thus highly reliable. Portions other than the display portion (light-emitting portion) in the input/output device can be regarded as the non-display portions (non-light-emitting portions). In other words, the non-display portion is provided in a frame-like shape outside a display portion 301 or a display portion 501. For example, a driver circuit is part of a non-light-emitting portion.

Structure Example 1

Figure 24A:
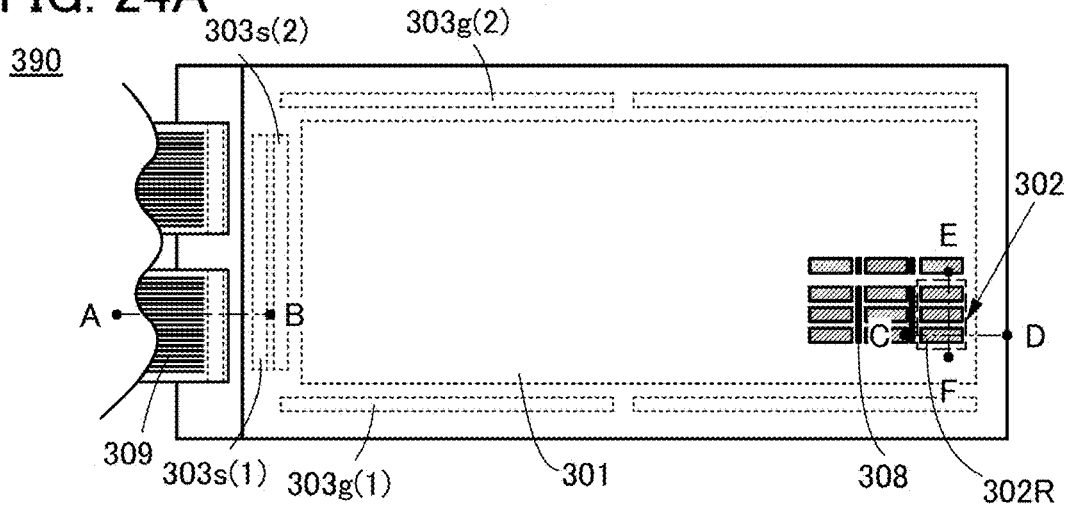
FIGS. 24A to 24C are a top view and cross-sectional views illustrating an example of an input/output device.
Figure 24B:
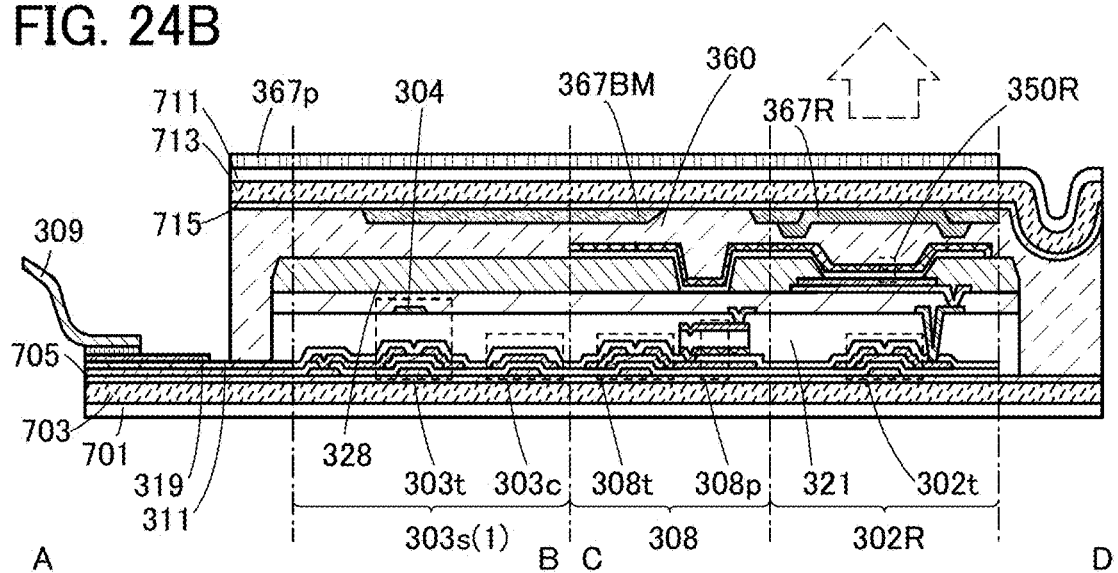
Figure 24C:
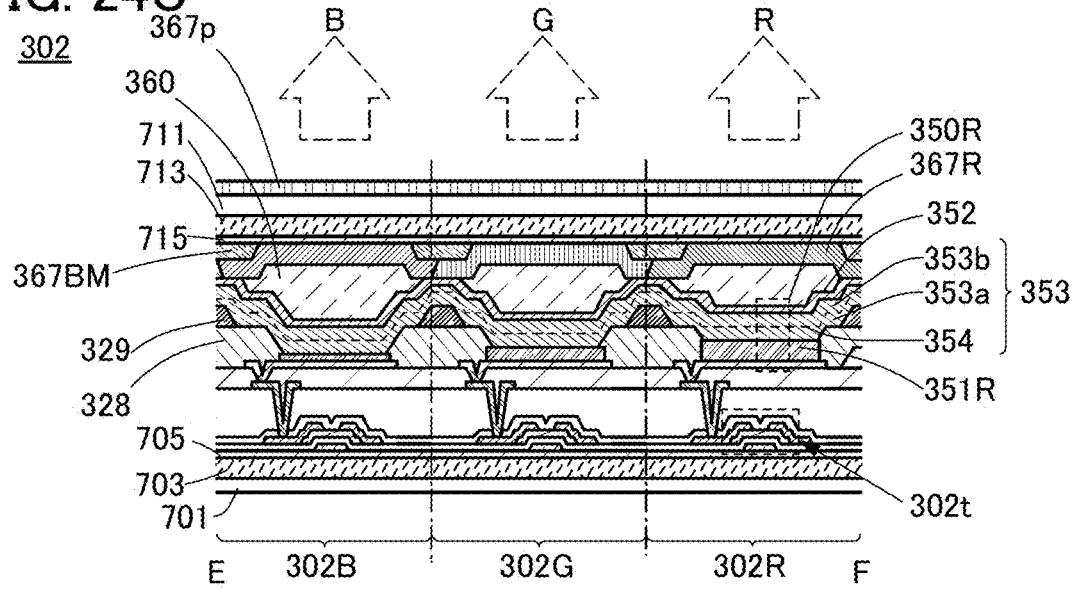

FIG. 24A is a top view of the input/output device. FIG. 24B is a cross-sectional view taken along the dashed-dotted line A-B and dashed-dotted line C-D in FIG. 24A. FIG. 24C is a cross-sectional view taken along the dashed-dotted line E-F in FIG. 24A.

An input/output device 390 illustrated in FIG. 24A includes the display portion 301 (serving also as an input portion), a scan line driver circuit 303g(1), an imaging pixel driver circuit 303g(2), an image signal line driver circuit 303s(1), and an imaging signal line driver circuit 303s(2).

The display portion 301 includes a plurality of pixels 302 and a plurality of imaging pixels 308.

The pixel 302 includes a plurality of sub-pixels. Each sub-pixel includes a light-emitting element and a pixel circuit.

The pixel circuits can supply electric power for driving the light-emitting element. The pixel circuits are electrically connected to wirings through which selection signals are supplied. The pixel circuits are also electrically connected to wirings through which image signals are supplied.

The scan line driver circuit 303g(1) can supply selection signals to the pixels 302.

The image signal line driver circuit 303s(1) can supply image signals to the pixels 302.

A touch sensor can be formed using the imaging pixels 308. Specifically, the imaging pixels 308 can sense a touch of a finger or the like on the display portion 301.

The imaging pixels 308 include photoelectric conversion elements and imaging pixel circuits.

The imaging pixel circuits can drive photoelectric conversion elements. The imaging pixel circuits are electrically connected to wirings through which control signals are supplied. The imaging pixel circuits are also electrically connected to wirings through which power supply potentials are supplied.

Examples of the control signals include a signal for selecting an imaging pixel circuit from which a recorded imaging signal is read, a signal for initializing an imaging pixel circuit, and a signal for determining the time for an imaging pixel circuit to sense light.

The imaging pixel driver circuit 303g(2) can supply control signals to the imaging pixels 308.

The imaging signal line driver circuit 303s(2) can read out imaging signals.

As illustrated in FIGS. 24B and 24C, the input/output device 390 includes the first flexible substrate 701, the first bonding layer 703, the first insulating layer 705, the second flexible substrate 711, the second bonding layer 713, and the second insulating layer 715. The first and second flexible substrates 701 and 711 are attached to each other with a third bonding layer 360.

In Structure example 1, a depression is formed in the non-display portion. In the depression, the thickness of the third bonding layer 360 is small. With this structure, entry of impurities into the inside through a side surface of the input/output device can be inhibited.

The first flexible substrate 701 and the first insulating layer 705 are attached to each other with the first bonding layer 703. The second flexible substrate 711 and the second insulating layer 715 are attached to each other with the second bonding layer 713. Embodiment 2 can be referred to for materials used for the substrates, the bonding layers, and the insulating layers.

Each of the pixels 302 includes a sub-pixel 302R, a sub-pixel 302G, and a sub-pixel 302B (see FIG. 24C).

For example, the sub-pixel 302R includes a light-emitting element 350R and the pixel circuit. The pixel circuit includes a transistor 302t that can supply electric power to the light-emitting element 350R. The sub-pixel 302R further includes an optical element (e.g., a coloring layer 367R that transmits red light).

The light-emitting element 350R includes a lower electrode 351R, an EL layer 353, and an upper electrode 352, which are stacked in this order (see FIG. 24C).

The EL layer 353 includes a first EL layer 353a, an intermediate layer 354, and a second EL layer 353b, which are stacked in this order.

Note that a microcavity structure can be provided for the light-emitting element 350R so that light with a specific wavelength can be efficiently extracted. Specifically, an EL layer may be provided between a film that reflects visible light and a film that partly reflects and partly transmits visible light, which are provided so that light with a specific wavelength can be efficiently extracted.

The sub-pixel 302R includes the third bonding layer 360 that is in contact with the light-emitting element 350R and the coloring layer 367R. The coloring layer 367R is positioned in a region overlapping with the light-emitting element 350R. Accordingly, part of light emitted from the light-emitting element 350R passes through the third bonding layer 360 and through the coloring layer 367R and is emitted to the outside of the sub-pixel 302R as indicated by an arrow in FIG. 24B or 24C.

The input/output device 390 includes a light-blocking layer 367BM. The light-blocking layer 367BM is provided so as to surround the coloring layer (e.g., the coloring layer 367R).

The input/output device 390 includes an anti-reflective layer 367p positioned in a region overlapping with the display portion 301. As the anti-reflective layer 367p, a circularly polarizing plate can be used, for example.

The input/output device 390 includes an insulating layer 321. The insulating layer 321 covers the transistor 302t and the like. Note that the insulating layer 321 can be used as a layer covering unevenness caused by the pixel circuits and the imaging pixel circuits to provide a flat surface. The transistor 302t and the like are preferably covered with an insulating layer that can inhibit diffusion of impurities to the transistor 302t and the like.

The input/output device 390 includes a partition 328 that overlaps with an end portion of the lower electrode 351R. A spacer 329 that controls the gap between the first flexible substrate 701 and the second flexible substrate 711 is provided over the partition 328.

The image signal line driver circuit 303s(1) includes a transistor 303t and a capacitor 303c. Note that the driver circuit can be formed in the same process and over the same substrate as those of the pixel circuits. As illustrated in FIG. 24B, the transistor 303t may include a second gate 304 over the insulating layer 321. The second gate 304 may be electrically connected to a gate of the transistor 303t, or different potentials may be supplied to these gates. Alternatively, if necessary, the second gate 304 may be provided for a transistor 308t, the transistor 302t, or the like.

The imaging pixels 308 each include a photoelectric conversion element 308p and an imaging pixel circuit. The imaging pixel circuit can sense light received by the photoelectric conversion element 308p. The imaging pixel circuit includes the transistor 308t. For example, a PIN photodiode can be used as the photoelectric conversion element 308p.

The input/output device 390 includes a wiring 311 through which a signal is supplied. The wiring 311 is provided with a terminal 319. An FPC 309 through which a signal such as an image signal or a synchronization signal is supplied is electrically connected to the terminal 319. A printed wiring board (PWB) may be attached to the FPC 309.

Note that transistors such as the transistors 302t, 303t, and 308t can be formed in the same process. Alternatively, the transistors may be formed in different processes.

Structure Example 2

Figure 25A:
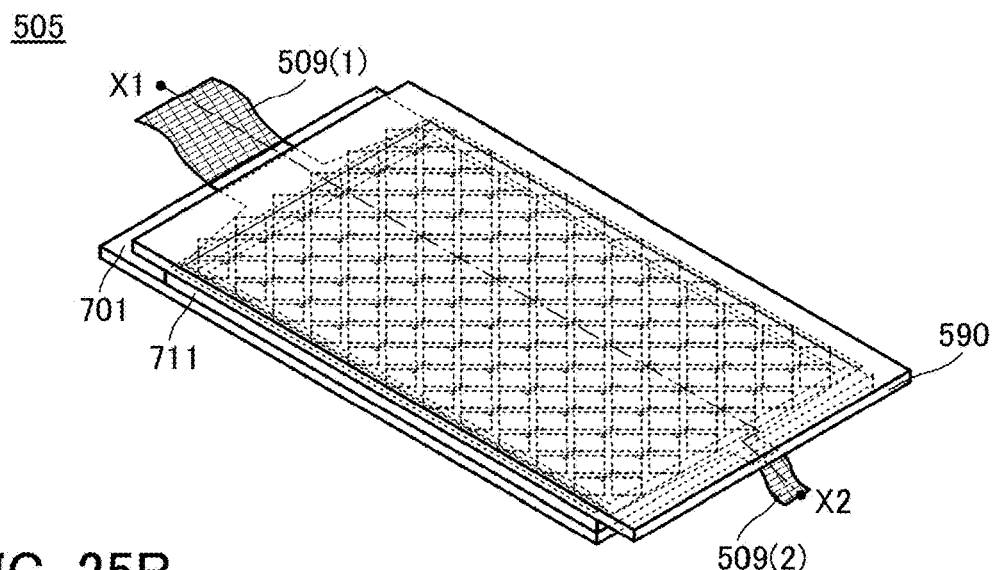
FIGS. 25A and 25B are perspective views illustrating an example of an input/output device.
Figure 25B:
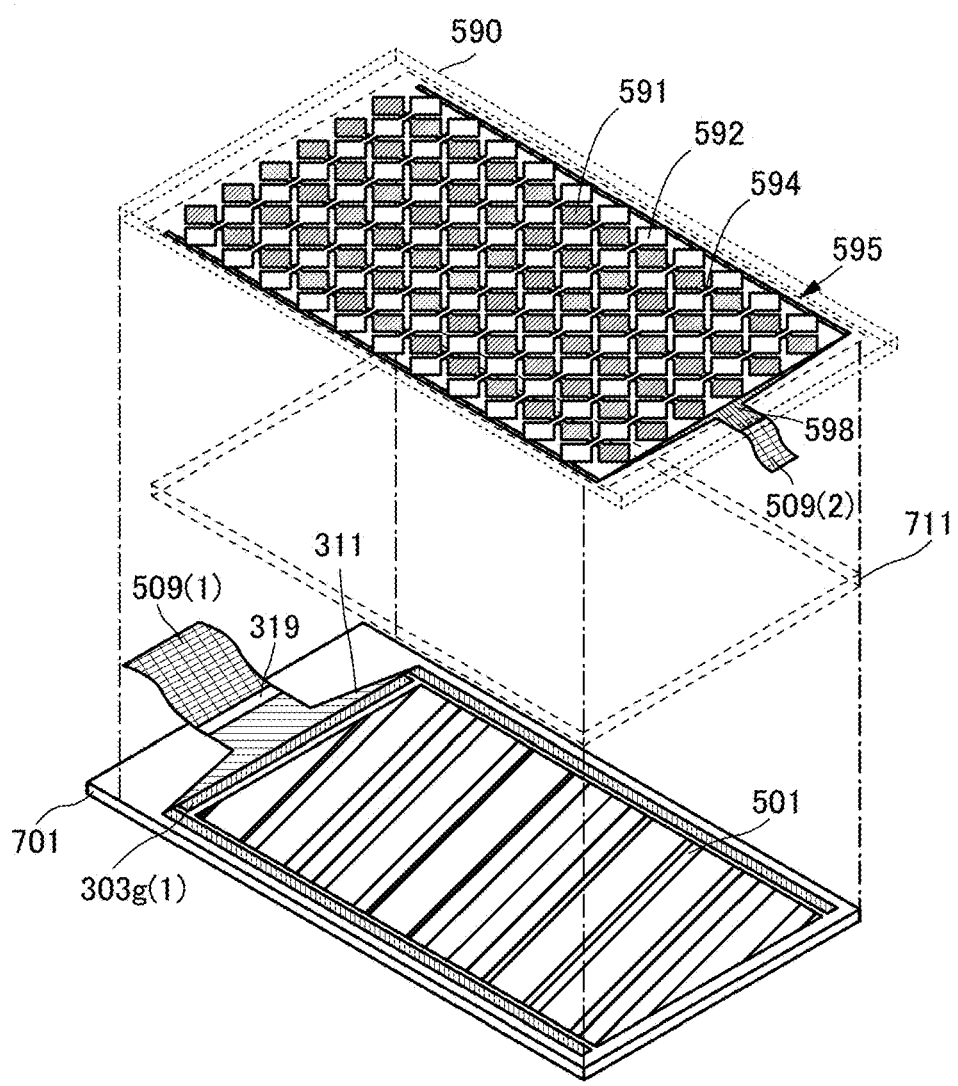
Figure 26A:
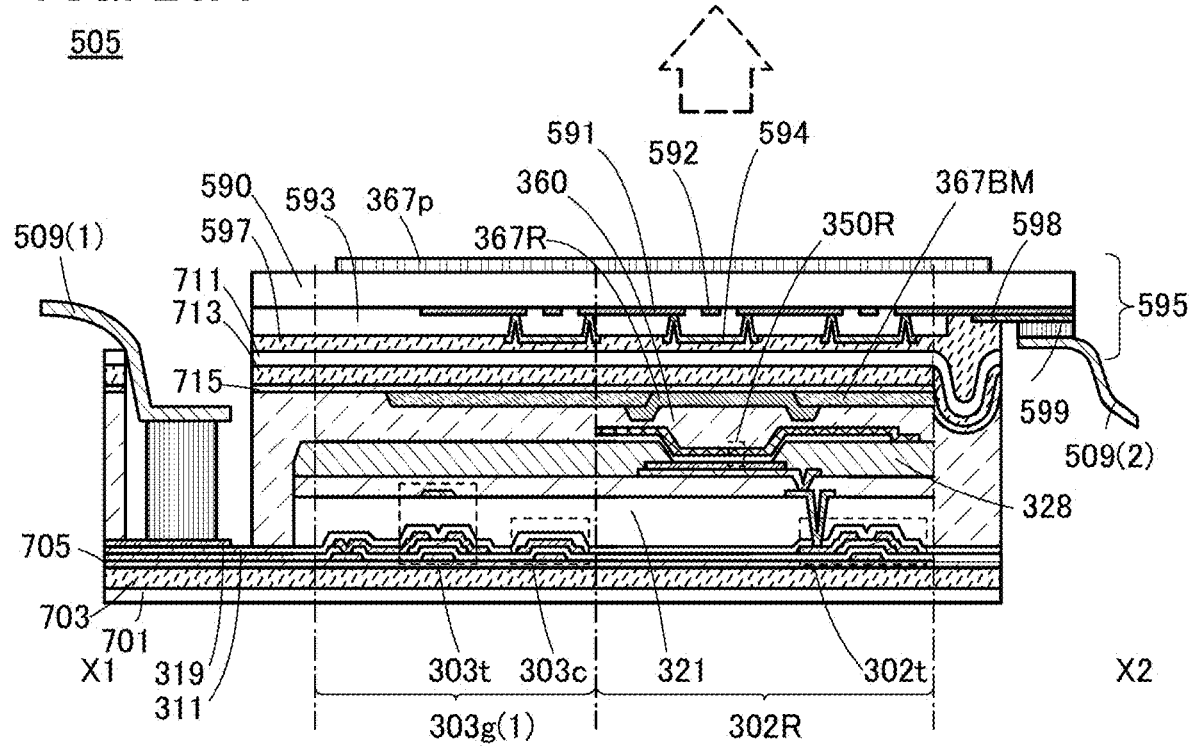
FIGS. 26A and 26B are cross-sectional views each illustrating an example of an input/output device.
Figure 26B:
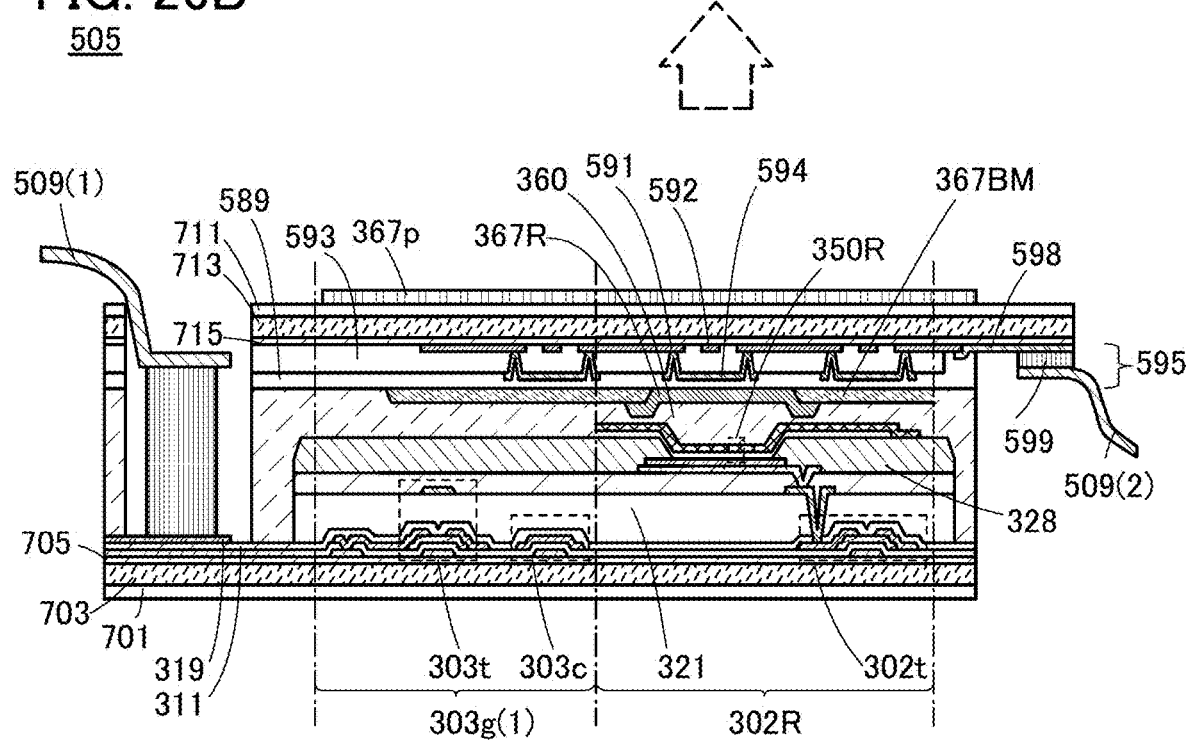

FIGS. 25A and 25B are perspective views of an input/output device 505. FIGS. 25A and 25B illustrate only main components for simplicity. FIGS. 26A and 26B are each a cross-sectional view taken along the dashed-dotted line X1-X2 in FIG. 25A.

As illustrated in FIGS. 25A and 25B, the input/output device 505 includes the display portion 501, the scan line driver circuit 303g(1), a touch sensor 595, and the like. Furthermore, the input/output device 505 includes the first flexible substrate 701, the second flexible substrate 711, and a flexible substrate 590.

The input/output device 505 includes a plurality of pixels and a plurality of wirings 311. The plurality of wirings 311 can supply signals to the pixels. The plurality of wirings 311 are arranged to a peripheral portion of the first flexible substrate 701, and part of the plurality of wirings 311 forms the terminal 319. The terminal 319 is electrically connected to an FPC 509(1).

The input/output device 505 includes the touch sensor 595 and a plurality of wirings 598. The plurality of wirings 598 are electrically connected to the touch sensor 595. The plurality of wirings 598 are arranged to a peripheral portion of the flexible substrate 590, and part of the plurality of wirings 598 forms a terminal. The terminal is electrically connected to an FPC 509(2). Note that in FIG. 25B, electrodes, wirings, and the like of the touch sensor 595 provided on the back side of the flexible substrate 590 (the side facing the first flexible substrate 701) are indicated by solid lines for clarity.

As the touch sensor 595, for example, a capacitive touch sensor can be used. Examples of the capacitive touch sensor include a surface capacitive touch sensor and a projected capacitive touch sensor. An example of using a projected capacitive touch sensor is described here.

Examples of the projected capacitive touch sensor include a self-capacitive touch sensor and a mutual capacitive touch sensor. The use of a mutual capacitive touch sensor is preferred because multiple points can be sensed simultaneously.

Note that a variety of sensors that can sense the closeness or the contact of a sensing target such as a finger can be used as the touch sensor 595.

The projected capacitive touch sensor 595 includes electrodes 591 and electrodes 592. The electrodes 591 are electrically connected to any of the plurality of wirings 598, and the electrodes 592 are electrically connected to any of the other wirings 598.

The electrodes 592 each have a shape of a plurality of quadrangles arranged in one direction with one corner of a quadrangle connected to one corner of another quadrangle as illustrated in FIGS. 25A and 25B.

The electrodes 591 each have a quadrangular shape and are arranged in a direction intersecting with the direction in which the electrodes 592 extend. Note that the plurality of electrodes 591 are not necessarily arranged in the direction orthogonal to one electrode 592 and may be arranged to intersect with one electrode 592 at an angle of less than 90 degrees.

A wiring 594 intersects with the electrode 592. The wiring 594 electrically connects two electrodes 591 between which one electrode 592 is positioned. The intersecting area of the electrode 592 and the wiring 594 is preferably as small as possible. Such a structure allows a reduction in the area of a region where the electrodes are not provided, reducing unevenness in light transmittance. As a result, unevenness in luminance of light emitted through the touch sensor 595 can be reduced.

Note that the shapes of the electrodes 591 and the electrodes 592 are not limited to the above-mentioned shapes and can be any of a variety of shapes.

As illustrated in FIG. 26A, the input/output device 505 includes the first flexible substrate 701, the first bonding layer 703, the first insulating layer 705, the second flexible substrate 711, the second bonding layer 713, and the second insulating layer 715. The first and second flexible substrates 701 and 711 are attached to each other with the third bonding layer 360.

A bonding layer 597 attaches the flexible substrate 590 to the second flexible substrate 711 so that the touch sensor 595 overlaps with the display portion 501. The bonding layer 597 has a light-transmitting property.

The electrodes 591 and the electrodes 592 are formed using a light-transmitting conductive material. As a light-transmitting conductive material, a conductive oxide such as indium oxide, indium tin oxide, indium zinc oxide, zinc oxide, or zinc oxide to which gallium is added can be used. A film including graphene may be used as well. The film including graphene can be formed, for example, by reducing a film including graphene oxide. As a reducing method, heating or the like can be employed.

As an example of a material for the conductive layers such as the electrodes 591, the electrodes 592, and the wirings 594, that is, wirings and electrodes forming a touch panel, a transparent conductive layer including indium oxide, tin oxide, zinc oxide, or the like (e.g., ITO) can be given. The resistance of materials used for wirings and electrodes of the touch panel is preferably low. For example, silver, copper, aluminum, a carbon nanotube, graphene, or a metal halide (such as silver halide) may be used. Alternatively, a metal nanowire including a plurality of conductors with an extremely small width (for example, a diameter of several nanometers) may be used. Further alternatively, a metal mesh which is a net-like conductor may be used. For example, an Ag nanowire, a Cu nanowire, an Al nanowire, an Ag mesh, a Cu mesh, or an Al mesh may be used. In the case of using an Ag nanowire for a wiring or an electrode of the touch panel, a visible light transmittance of 89% or more and a sheet resistance of 40 Ω/square or more and 100 Ω/square or less can be achieved. Since the above-described metal nanowire, metal mesh, carbon nanotube, graphene, and the like, which are examples of the material that can be used as the wirings and electrodes forming the touch panel, have high visible light transmittances, they may be used as electrodes of display elements (e.g., a pixel electrode or a common electrode).

The electrodes 591 and the electrodes 592 can be formed by depositing a light-transmitting conductive material on the flexible substrate 590 by a sputtering method and then removing an unneeded portion by a variety of patterning techniques such as photolithography.

The electrodes 591 and the electrodes 592 are covered with an insulating layer 593. Openings reaching the electrodes 591 are formed in the insulating layer 593, and the wiring 594 electrically connects the adjacent electrodes 591. A light-transmitting conductive material can be favorably used as the wiring 594 because the aperture ratio of the input/output device can be increased. Moreover, a material with higher conductivity than the conductivities of the electrodes 591 and the electrodes 592 can be favorably used for the wiring 594 because electric resistance can be reduced.

Note that an insulating layer covering the insulating layer 593 and the wiring 594 may be provided to protect the touch sensor 595.

A connection layer 599 electrically connects the wirings 598 to the FPC 509(2).

The display portion 501 includes a plurality of pixels arranged in a matrix. Each pixel has the same structure as Structure example 1; thus, description is omitted.

As illustrated in FIG. 26B, the touch panel may include two substrates of the first flexible substrate 701 and the second flexible substrate 711 without including the flexible substrate 590. The second flexible substrate 711 and the second insulating layer 715 are attached to each other with the second bonding layer 713, and the touch sensor 595 is provided in contact with the second insulating layer 715. The coloring layer 367R and the light-blocking layer 367BM are provided in contact with an insulating layer 589 that covers the touch sensor 595. The insulating layer 589 is not necessarily provided, in which case the coloring layer 367R and the light-blocking layer 367BM are provided in contact with the wiring 594.

Structure Example 3

Figure 27A:
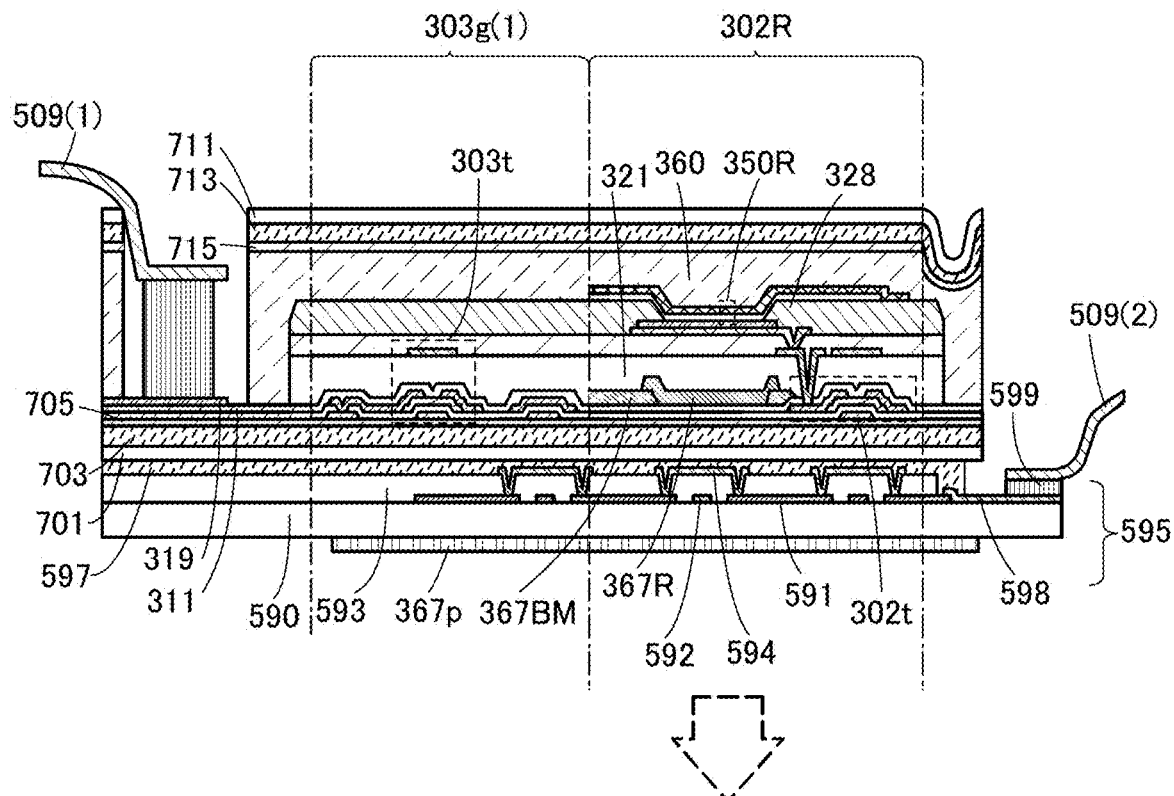
FIGS. 27A to 27C are cross-sectional views illustrating examples of an input/output device.
Figure 27B:
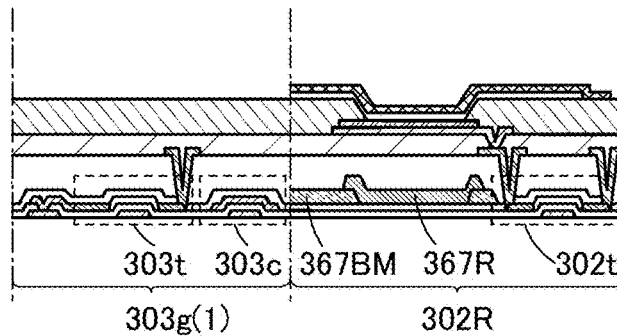
Figure 27C:
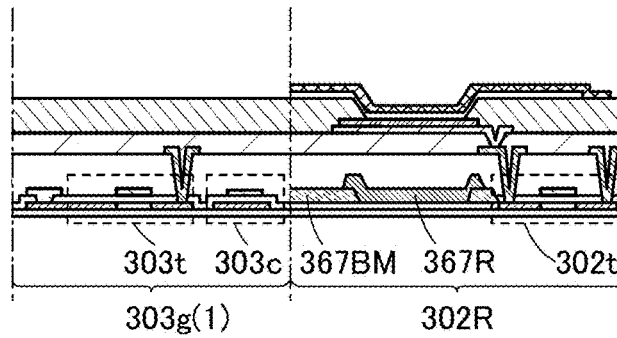

FIGS. 27A to 27C are cross-sectional views of an input/output device 505B. The input/output device 505B described in this embodiment is different from the input/output device 505 in Structure example 2 in that received image data is displayed on the side where the transistors are provided and that the touch sensor is provided on the first flexible substrate 701 side of the display portion. Different structures will be described in detail below, and the above description is referred to for the other similar structures.

The coloring layer 367R is positioned in a region overlapping with the light-emitting element 350R. The light-emitting element 350R illustrated in FIG. 27A emits light to the side where the transistor 302t is provided. Accordingly, part of light emitted from the light-emitting element 350R passes through the coloring layer 367R and is emitted to the outside of the input/output device 505B as indicated by an arrow in FIG. 27A.

The input/output device 505B includes the light-blocking layer 367BM on the light extraction side. The light-blocking layer 367BM is provided so as to surround the coloring layer (e.g., the coloring layer 367R).

The touch sensor 595 is provided not on the second flexible substrate 711 side but on the first flexible substrate 701 side (see FIG. 27A).

The bonding layer 597 attaches the flexible substrate 590 to the first flexible substrate 701 so that the touch sensor 595 overlaps with the display portion. The bonding layer 597 has a light-transmitting property.

Note that a structure in the case of using bottom-gate transistors in the display portion 501 is illustrated in FIGS. 27A and 27B.

For example, a semiconductor layer containing an oxide semiconductor, amorphous silicon, or the like can be used in the transistor 302t and the transistor 303t illustrated in FIG. 27A.

For example, a semiconductor layer containing polycrystalline silicon can be used in the transistor 302t and the transistor 303t illustrated in FIG. 27B.

A structure in the case of using top-gate transistors is illustrated in FIG. 27C.

For example, a semiconductor layer containing polycrystalline silicon, a single crystal silicon film that is transferred from a single crystal silicon substrate, or the like can be used in the transistor 302t and the transistor 303t illustrated in FIG. 27C.

This embodiment can be combined with any other embodiment as appropriate.

Embodiment 4

<Composition of CAC-OS>

Described below is the composition of a cloud aligned complementary oxide semiconductor (CAC-OS) applicable to a transistor disclosed in one embodiment of the present invention.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. In other words, an OS FET is a transistor including a metal oxide or an oxide semiconductor.

In this specification, a metal oxide in which regions functioning as a conductor and regions functioning as a dielectric are mixed and which functions as a semiconductor as a whole is defined as a CAC-OS or a CAC-metal oxide.

The CAC-OS has, for example, a composition in which elements included in an oxide semiconductor are unevenly distributed. Materials including unevenly distributed elements each have a size of greater than or equal to 0.5 nm and less than or equal to 10 nm, preferably greater than or equal to 0.5 nm and less than or equal to 3 nm, or a similar size. Note that in the following description of an oxide semiconductor, a state in which one or more elements are unevenly distributed and regions including the element(s) are mixed is referred to as a mosaic pattern or a patch-like pattern. The region has a size of greater than or equal to 0.5 nm and less than or equal to 10 nm, preferably greater than or equal to 0.5 nm and less than or equal to 3 nm, or a similar size.

The physical properties of a region including an unevenly distributed element are determined by the properties of the element. For example, a region including an unevenly distributed element which relatively tends to serve as an insulator among elements included in a metal oxide serves as a dielectric region. In contrast, a region including an unevenly distributed element which relatively tends to serve as a conductor among elements included in a metal oxide serves as a conductive region. A material in which conductive regions and dielectric regions are mixed to form a mosaic pattern serves as a semiconductor.

That is, a metal oxide in one embodiment of the present invention is a kind of matrix composite or metal matrix composite, in which materials having different physical properties are mixed.

Note that an oxide semiconductor preferably contains at least indium. In particular, indium and zinc are preferably contained. In addition, an element M (M is one or more of gallium, aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like) may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0), gallium zinc oxide ($Ga_{X4}Zn_{Y4}O_{Z4}$, where X4, Y4, and Z4 are real numbers greater than 0), or the like, and a mosaic pattern is formed. Then, $InO_{X1}$ and $In_{X2}Zn_{Y2}O_{Z2}$ forming the mosaic pattern are evenly distributed in the film. This composition is also referred to as a cloud-like composition.

That is, the CAC-OS is a composite oxide semiconductor with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected element(s) as a main component(s) are observed in part of the CAC-OS and nanoparticle regions including In as a main component are observed in part thereof, and these nanoparticle regions are randomly dispersed to form a mosaic pattern in the CAC-OS.

<Analysis of CAC-OS>

Next, measurement results of an oxide semiconductor over a substrate by a variety of methods are described.

<<Structure of Samples and Formation Method Thereof>>

Nine samples of one embodiment of the present invention are described below. The samples are formed at different substrate temperatures and with different ratios of an oxygen gas flow rate in formation of the oxide semiconductor. Note that each sample includes a substrate and an oxide semiconductor over the substrate.

A method for forming the samples is described.

A glass substrate is used as the substrate. Over the glass substrate, a 100-nm-thick In—Ga—Zn oxide is formed as an oxide semiconductor with a sputtering apparatus. The formation conditions are as follows: the pressure in a chamber is 0.6 Pa, and an oxide target (with an atomic ratio of In:Ga:Zn=4:2:4.1) is used as a target. The oxide target provided in the sputtering apparatus is supplied with an AC power of 2500 W.

As for the conditions in the formation of the oxide of the nine samples, the substrate temperature is set to a temperature that is not increased by intentional heating (hereinafter such a temperature is also referred to as room temperature or R.T.), to 130° C., and to 170° C. The ratio of a flow rate of an oxygen gas to a flow rate of a mixed gas of Ar and oxygen (also referred to as an oxygen gas flow rate ratio) is set to 10%, 30%, and 100%.

<<Analysis by X-Ray Diffraction>>

In this section, results of X-ray diffraction (XRD) measurement performed on the nine samples are described. As an XRD apparatus, D8 ADVANCE manufactured by Bruker AXS is used. The conditions are as follows: scanning is performed by an out-of-plane method at θ/2θ, the scanning range is 15 deg. to 50 deg., the step width is 0.02 deg., and the scanning speed is 3.0 deg./min.

Figure 31:
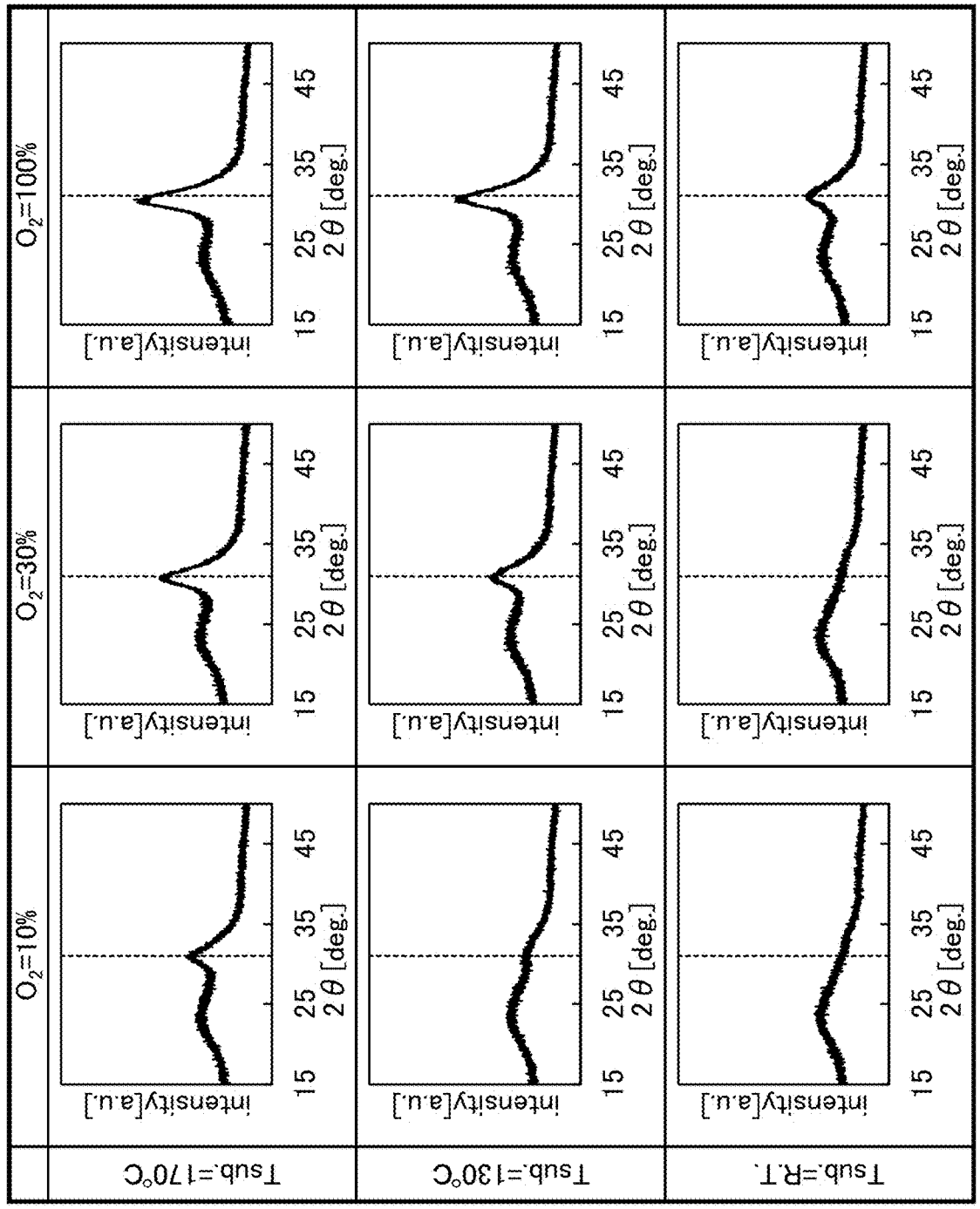
FIG. 31 shows measured XRD spectra of samples.

FIG. 31 shows XRD spectra measured by an out-of-plane method. In FIG. 31, the top row shows the measurement results of the samples formed at a substrate temperature of 170° C.; the middle row shows the measurement results of the samples formed at a substrate temperature of 130° C.; the bottom row shows the measurement results of the samples formed at a substrate temperature of R.T. The left column shows the measurement results of the samples formed with an oxygen gas flow rate ratio of 10%; the middle column shows the measurement results of the samples formed with an oxygen gas flow rate ratio of 30%; the right column shows the measurement results of the samples formed with an oxygen gas flow rate ratio of 100%.

In the XRD spectra shown in FIG. 31, the higher the substrate temperature at the time of formation is or the higher the oxygen gas flow rate ratio at the time of formation is, the higher the intensity of the peak at around $2\theta=31°$ is. Note that it is found that the peak at around $2\theta=31°$ is derived from a crystalline IGZO compound whose c-axes are aligned in a direction substantially perpendicular to a formation surface or a top surface of the crystalline IGZO compound (such a compound is also referred to as c-axis aligned crystalline (CAAC) IGZO).

As shown in the XRD spectra in FIG. 31, as the substrate temperature at the time of formation is lower or the oxygen gas flow rate ratio at the time of formation is lower, a peak becomes less clear. Accordingly, it is found that there are no alignment in the a-b plane direction and c-axis alignment in the measured areas of the samples that are formed at a lower substrate temperature or with a lower oxygen gas flow rate ratio.

<<Analysis with Electron Microscope>>

This section describes the observation and analysis results of the samples formed at a substrate temperature of R.T. and with an oxygen gas flow rate ratio of 10% with a high-angle annular dark-field scanning transmission electron microscope (HAADF-STEM). An image obtained with an HAADF-STEM is also referred to as a TEM image.

Described are the results of image analysis of plan-view images and cross-sectional images obtained with an HAADF-STEM (also referred to as plan-view TEM images and cross-sectional TEM images, respectively). The TEM images are observed with a spherical aberration corrector function. The HAADF-STEM images are obtained using an atomic resolution analytical electron microscope JEM-ARM200F manufactured by JEOL Ltd. under the following conditions: the acceleration voltage is 200 kV, and irradiation with an electron beam with a diameter of approximately 0.1 nm is performed.

FIG. 32A is a plan-view TEM image of the sample formed at a substrate temperature of R.T. and with an oxygen gas flow rate ratio of 10%. FIG. 32B is a cross-sectional TEM image of the sample formed at a substrate temperature of R.T. and with an oxygen gas flow rate ratio of 10%.

<<Analysis of Electron Diffraction Patterns>>

This section describes electron diffraction patterns obtained by irradiation of the sample formed at a substrate temperature of R.T. and an oxygen gas flow rate ratio of 10% with an electron beam with a probe diameter of 1 nm (also referred to as a nanobeam).

Electron diffraction patterns of points indicated by black dots a1, a2, a3, a4, and a5 in the plan-view TEM image in FIG. 32A of the sample formed at a substrate temperature of R.T. and an oxygen gas flow rate ratio of 10% are observed. Note that the electron diffraction patterns are observed while electron beam irradiation is performed at a constant rate for 35 seconds. FIGS. 32C, 32D, 32E, 32F, and 32G show the results of the points indicated by the black dots a1, a2, a3, a4, and a5, respectively.

In FIGS. 32C, 32D, 32E, 32F, and 32G, regions with high luminance in a circular (ring) pattern can be shown. Furthermore, a plurality of spots can be shown in a ring-like shape.

Figures 32I, 32J, 32K:
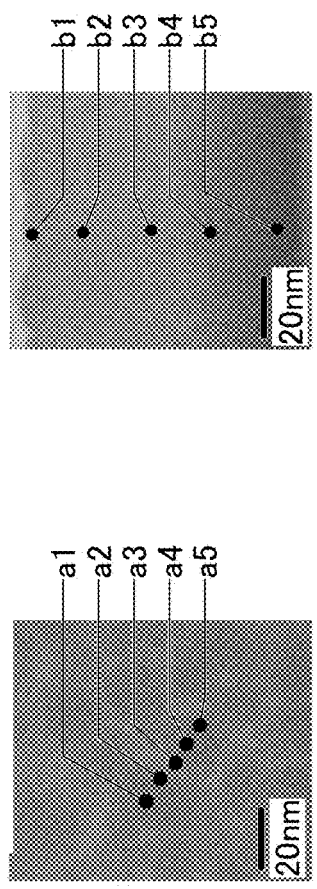
Figure 32C:
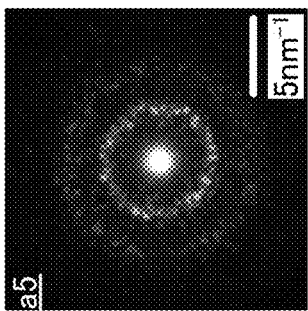
Figure 32D:
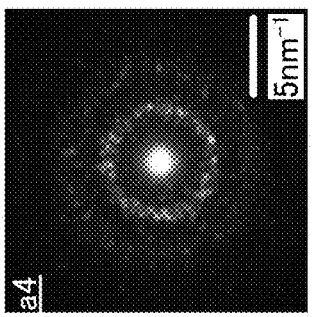
Figure 32E:
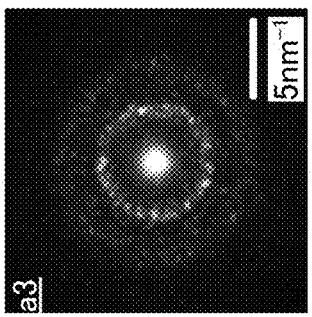
Figure 32F:
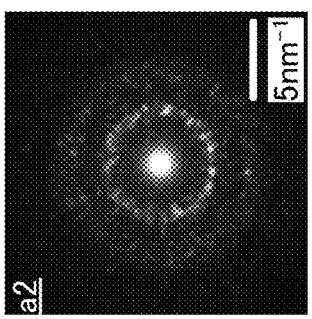
Figure 32G:
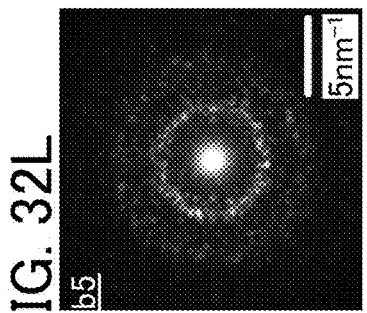
Figure 32H:
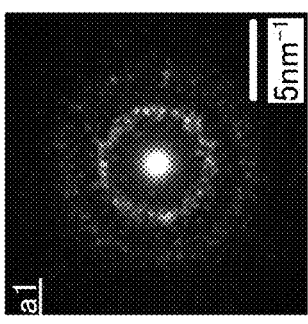
Figure 32L:
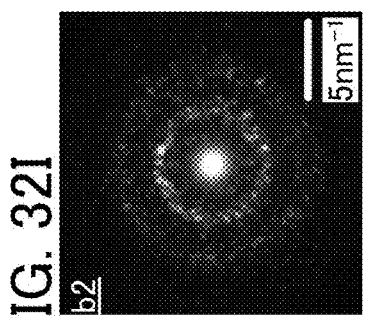

Electron diffraction patterns of points indicated by black dots b1, b2, b3, b4, and b5 in the cross-sectional TEM image in FIG. 32B of the sample formed at a substrate temperature of R.T. and an oxygen gas flow rate ratio of 10% are observed. FIGS. 32H, 32I, 32J, 32K, and 32L show the results of the points indicated by the black dots b1, b2, b3, b4, and b5, respectively.

In FIGS. 32H, 32I, 32J, 32K, and 32L, regions with high luminance in a ring pattern can be shown. Furthermore, a plurality of spots can be shown in a ring-like shape.

For example, when an electron beam with a probe diameter of 300 nm is incident on a CAAC-OS including an InGaZnO$_4$ crystal in a direction parallel to the sample surface, a diffraction pattern including a spot derived from the (009) plane of the InGaZnO$_4$ crystal is obtained. That is, the CAAC-OS has c-axis alignment and the c-axes are aligned in the direction substantially perpendicular to the formation surface or the top surface of the CAAC-OS. Meanwhile, a ring-like diffraction pattern is shown when an electron beam with a probe diameter of 300 nm is incident on the same sample in a direction perpendicular to the sample surface. That is, it is found that the CAAC-OS has neither a-axis alignment nor b-axis alignment.

Furthermore, a diffraction pattern like a halo pattern is observed when an oxide semiconductor including a nanocrystal (a nanocrystalline oxide semiconductor (nc-OS)) is subjected to electron diffraction using an electron beam with a large probe diameter (e.g., 50 nm or larger). Meanwhile, bright spots are shown in a nanobeam electron diffraction pattern of the nc-OS obtained using an electron beam with a small probe diameter (e.g., smaller than 50 nm). Furthermore, in a nanobeam electron diffraction pattern of the nc-OS, regions with high luminance in a circular (ring) pattern are shown in some cases. Also in a nanobeam electron diffraction pattern of the nc-OS, a plurality of bright spots are shown in a ring-like shape in some cases.

The electron diffraction pattern of the sample formed at a substrate temperature of R.T. and with an oxygen gas flow rate ratio of 10% has regions with high luminance in a ring pattern and a plurality of bright spots appear in the ring-like pattern. Accordingly, the sample formed at a substrate temperature of R.T. and with an oxygen gas flow rate ratio of 10% exhibits an electron diffraction pattern similar to that of the nc-OS and does not show alignment in the plane direction and the cross-sectional direction.

According to what is described above, an oxide semiconductor formed at a low substrate temperature or with a low oxygen gas flow rate ratio is likely to have characteristics distinctly different from those of an oxide semiconductor film having an amorphous structure and an oxide semiconductor film having a single crystal structure.

<<Elementary Analysis>>

This section describes the analysis results of elements included in the sample formed at a substrate temperature of R.T. and with an oxygen gas flow rate ratio of 10%. For the analysis, by energy dispersive X-ray spectroscopy (EDX), EDX mapping images are obtained. An energy dispersive X-ray spectrometer AnalysisStation JED-2300T manufactured by JEOL Ltd. is used as an elementary analysis apparatus in the EDX measurement. A Si drift detector is used to detect an X-ray emitted from the sample.

In the EDX measurement, an EDX spectrum of a point is obtained in such a manner that electron beam irradiation is performed on the point in a detection target region of a sample, and the energy of characteristic X-ray of the sample generated by the irradiation and its frequency are measured. In this embodiment, peaks of an EDX spectrum of the point are attributed to electron transition to the L shell in an In atom, electron transition to the K shell in a Ga atom, and electron transition to the K shell in a Zn atom and the K shell in an O atom, and the proportions of the atoms in the point are calculated. An EDX mapping image indicating distributions of proportions of atoms can be obtained through the process in an analysis target region of a sample.

Figure 33A:
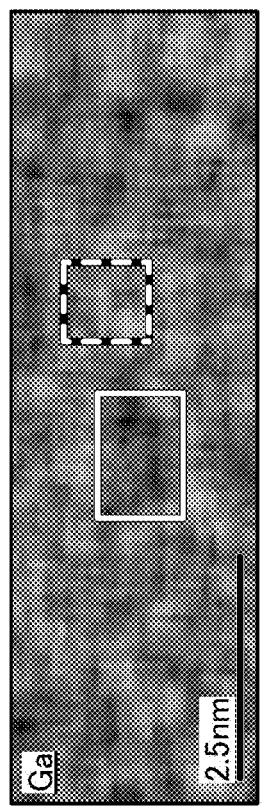
FIGS. 33A to 33C show EDX mapping images of a sample.
Figure 33B:
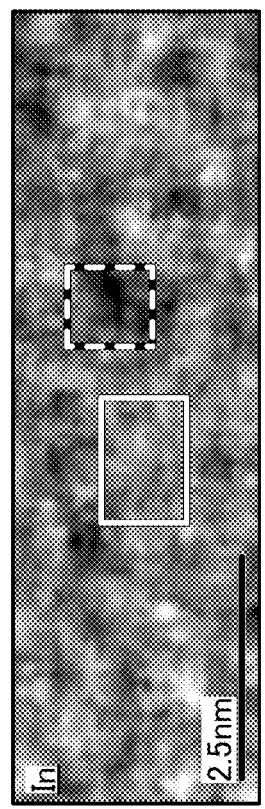
Figure 33C:
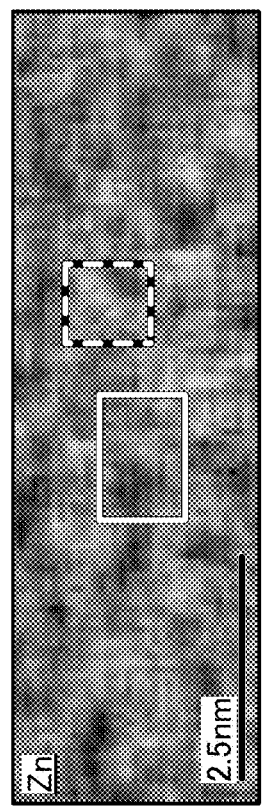

FIGS. 33A to 33C show EDX mapping images in a cross section of the sample formed at a substrate temperature of R.T. and with an oxygen gas flow rate ratio of 10%. FIG. 33A shows an EDX mapping image of Ga atoms. The proportion of the Ga atoms in all the atoms is 1.18 atomic % to 18.64 atomic %. FIG. 33B shows an EDX mapping image of In atoms. The proportion of the In atoms in all the atoms is 9.28 atomic % to 33.74 atomic %. FIG. 33C shows an EDX mapping image of Zn atoms. The proportion of the Zn atoms in all the atoms is 6.69 atomic % to 24.99 atomic %. FIGS. 33A to 33C show the same region in the cross section of the sample formed at a substrate temperature of R.T. and with an oxygen gas flow rate ratio of 10%. In the EDX mapping images, the proportion of an element is indicated by grayscale: the more measured atoms exist in a region, the brighter the region is; the less measured atoms exist in a region, the darker the region is. The magnification of the EDX mapping images in FIGS. 33A to 33C is 7200000 times.

The EDX mapping images in FIGS. 33A to 33C show relative distribution of brightness indicating that each element has a distribution in the sample formed at a substrate temperature of R.T. and with an oxygen gas flow rate ratio of 10%. Areas surrounded by solid lines and areas surrounded by dashed lines in FIGS. 33A to 33C are examined.

In FIG. 33A, a relatively dark region occupies a large area in the area surrounded by the solid line, while a relatively bright region occupies a large area in the area surrounded by the dashed line. In FIG. 33B, a relatively bright region occupies a large area in the area surrounded by the solid line, while a relatively dark region occupies a large area in the area surrounded by the dashed line.

That is, the areas surrounded by the solid lines are regions including a relatively large number of In atoms and the areas surrounded by the dashed lines are regions including a relatively small number of In atoms. In FIG. 33C, the right portion of the area surrounded by the solid line is relatively bright and the left portion thereof is relatively dark. Thus, the area surrounded by the solid line is a region including $In_{X2}Zn_{Y2}O_{Z2}$, $InO_{X1}$, and the like as main components.

The area surrounded by the solid line is a region including a relatively small number of Ga atoms and the area surrounded by the dashed line is a region including a relatively large number of Ga atoms. In FIG. 33C, the upper left portion of the area surrounded by the dashed line is relatively bright and the lower right portion thereof is relatively dark. Thus, the area surrounded by the dashed line is a region including $GaO_{X3}$, $Ga_{X4}Zn_{Y4}O_{Z4}$, and the like as main components.

Furthermore, as shown in FIGS. 33A to 33C, the In atoms are relatively more uniformly distributed than the Ga atoms, and regions including $InO_{X1}$ as a main component is seemingly joined to each other through a region including $In_{X2}Zn_{Y2}O_{Z2}$ as a main component. Thus, the regions including $In_{X2}Zn_{Y2}O_{Z2}$ and $InO_{X1}$ as main components extend like a cloud.

An In—Ga—Zn oxide having a composition in which the regions including $GaO_{X3}$ or the like as a main component and the regions including $In_{X2}Zn_{Y2}O_{Z2}$ or $InO_{X1}$ as a main component are unevenly distributed and mixed can be referred to as a CAC-OS.

The crystal structure of the CAC-OS includes an nc structure. In an electron diffraction pattern of the CAC-OS with the nc structure, several or more bright spots appear in addition to bright sports derived from IGZO including a single crystal, a polycrystal, or a CAAC. Alternatively, the crystal structure is defined as having high luminance regions appearing in a ring pattern in addition to the several or more bright spots.

As shown in FIGS. 33A to 33C, each of the regions including $GaO_{X3}$ or the like as a main component and the regions including $In_{X2}Zn_{Y2}O_{Z2}$ or $InO_{X1}$ as a main component has a size of greater than or equal to 0.5 nm and less than or equal to 10 nm, or greater than or equal to 1 nm and less than or equal to 3 nm. Note that it is preferable that a diameter of a region including each metal element as a main component be greater than or equal to 1 nm and less than or equal to 2 nm in the EDX mapping images.

As described above, the CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor exhibits. Accordingly, when regions including $In_{X2}Zn_{Y2}O_{Z2}$ or $InO_{X1}$ as a main component are distributed in an oxide semiconductor like a cloud, high field-effect mobility ($\mu$) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current (Ion) and high field-effect mobility ($\mu$) can be achieved.

A semiconductor element including a CAC-OS has high reliability. Thus, the CAC-OS is suitably used in a variety of semiconductor devices typified by a display.

This embodiment can be combined with any other embodiment as appropriate.

Embodiment 5

In this embodiment, electronic devices and lighting devices of one embodiment of the present invention will be described with reference to drawings.

Highly reliable electronic devices or lighting devices can be manufactured by using the light-emitting device, display device, input/output device, or the like of one embodiment of the present invention. Furthermore, highly reliable electronic devices or lighting devices that have a curved surface or flexibility can be manufactured by using the light-emitting device, display device, input/output device, or the like of one embodiment of the present invention.

Examples of electronic devices are television devices (also referred to as TV or television receivers), monitors for computers and the like, cameras such as digital cameras and digital video cameras, digital photo frames, cellular phones (also referred to as portable telephone devices), portable game machines, portable information terminals, audio playback devices, large game machines such as pin-ball machines, and the like.

The electronic device or the lighting device of one embodiment of the present invention has flexibility and thus can be incorporated along a curved inside/outside wall surface of a house or a building or a curved interior/exterior surface of a car.

Furthermore, the electronic device of one embodiment of the present invention may include a secondary battery. It is preferable that the secondary battery be capable of being charged by non-contact power transmission.

Examples of the secondary battery include a lithium ion secondary battery such as a lithium polymer battery using a gel electrolyte (lithium ion polymer battery), a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display an image, data, or the like on a display portion. When the electronic device includes the antenna and a secondary battery, the antenna may be used for contactless power transmission.

FIGS. 28A, 28B, 28C1, 28C2, 28D, and 28E illustrate examples of electronic devices each including a display portion 7000 with a curved surface. The display surface of the display portion 7000 is curved, and images can be displayed on the curved display surface. Note that the display portion 7000 may be flexible.

The display portion 7000 is manufactured using the light-emitting device, display device, input/output device, or the like of one embodiment of the present invention.

In accordance with one embodiment of the present invention, a highly reliable electronic device having a curved display portion can be provided.

FIG. 28A illustrates an example of a cellular phone. A cellular phone 7100 is provided with a housing 7101, the display portion 7000, operation buttons 7103, an external connection port 7104, a speaker 7105, a microphone 7106, and the like.

The cellular phone 7100 illustrated in FIG. 28A includes a touch sensor in the display portion 7000. Moreover, operations such as making a call and inputting a letter can be performed by touch on the display portion 7000 with a finger, a stylus, or the like.

The power can be turned on or off with the operation button 7103. In addition, types of images displayed on the display portion 7000 can be switched; for example, switching images from a mail creation screen to a main menu screen is performed with the operation button 7103.

FIG. 28B illustrates an example of a television set. In a television set 7200, the display portion 7000 is incorporated into the housing 7201. Here, the housing 7201 is supported by a stand 7203.

The television set 7200 illustrated in FIG. 28B can be operated with an operation switch of the housing 7201 or a separate remote controller 7211. Alternatively, the display portion 7000 may include a touch sensor. The display portion 7000 can be operated by touching the display portion with a finger or the like. The remote controller 7211 may be provided with a display portion for displaying data output from the remote controller 7211. With operation keys or a touch panel of the remote controller 7211, channels and volume can be controlled and images displayed on the display portion 7000 can be controlled.

Note that the television set 7200 is provided with a receiver, a modem, or the like. A general television broadcast can be received with the receiver. Furthermore, when the television set is connected to a communication network with or without wires via the modem, one-way (from a transmitter to a receiver) or two-way (between a transmitter and a receiver or between receivers) data communication can be performed.

FIGS. 28C1, 28C2, 28D, and 28E illustrate examples of portable information terminals. Each portable information terminal includes a housing 7301 and the display portion 7000. Each portable information terminal may also include an operation button, an external connection port, a speaker, a microphone, an antenna, a battery, or the like. The display portion 7000 is provided with a touch sensor. An operation of the portable information terminal can be performed by touching the display portion 7000 with a finger, a stylus, or the like.

FIG. 28C1 is a perspective view of a portable information terminal 7300. FIG. 28C2 is a top view of the portable information terminal 7300. FIG. 28D is a perspective view of a portable information terminal 7310. FIG. 28E is a perspective view of a portable information terminal 7320.

Each of the portable information terminals illustrated in this embodiment functions as, for example, one or more of a telephone set, a notebook, and an information browsing system. Specifically, each of the portable information terminals can be used as a smartphone. Each of the portable information terminals illustrated in this embodiment is capable of executing a variety of applications such as mobile phone calls, e-mailing, reading and editing texts, music reproduction, Internet communication, and a computer game, for example.

The portable information terminals 7300, 7310, and 7320 can each display characters, image information, and the like on its plurality of surfaces. For example, as illustrated in FIGS. 28C1 and 28D, three operation buttons 7302 can be displayed on one surface, and information 7303 indicated by a rectangle can be displayed on another surface. FIGS. 28C1 and 28C2 illustrate an example in which information is displayed at the top of the portable information terminal. FIG. 28D illustrates an example in which information is displayed on the side of the portable information terminal. Information may also be displayed on three or more surfaces of the portable information terminal. FIG. 28E illustrates an example where information 7304, information 7305, and information 7306 are displayed on different surfaces.

Examples of the information include notification from a social networking service (SNS), display indicating reception of an e-mail or an incoming call, the subject of an e-mail or the like, the sender of an e-mail or the like, the date, the time, remaining battery level, and the reception strength of an antenna. Alternatively, the operation button, an icon, or the like may be displayed in place of the information.

For example, a user of the portable information terminal 7300 can see the display (here, the information 7303) with the portable information terminal 7300 put in a breast pocket of his/her clothes.

Specifically, a caller's phone number, name, or the like of an incoming call is displayed in a position that can be seen from above the portable information terminal 7300. Thus, the user can see the display without taking out the portable information terminal 7300 from the pocket and decide whether to answer the call.

FIGS. 28F to 28H each illustrate an example of a lighting device having a curved light-emitting portion.

The light-emitting portion included in the lighting device illustrated in each of FIGS. 28F to 28H can be manufactured using the light-emitting device or the like of one embodiment of the present invention.

In accordance with one embodiment of the present invention, a highly reliable lighting device having a curved light-emitting portion can be provided.

A lighting device 7400 illustrated in FIG. 28F includes a light-emitting portion 7402 having a wave-shaped light-emitting surface, which is a good-design lighting device.

A light-emitting portion 7412 included in a lighting device 7410 illustrated in FIG. 28G has two convex-curved light-emitting portions symmetrically placed. Thus, light radiates from the lighting device 7410.

A lighting device 7420 illustrated in FIG. 28H includes a concave-curved light-emitting portion 7422. This is suitable for illuminating a specific range because light emitted from the light-emitting portion 7422 is collected to the front of the lighting device 7420. In addition, with this structure, a shadow is less likely to be produced.

The light-emitting portion included in each of the lighting devices 7400, 7410, and 7420 may be flexible. The light-emitting portion may be fixed on a plastic member, a movable frame, or the like so that an emission surface of the light-emitting portion can be bent freely depending on the intended use.

Lighting devices 7400, 7410, and 7420 each include a stage 7401 provided with an operation switch 7403 and a light-emitting portion supported by the stage 7401.

Note that although the lighting device in which the light-emitting portion is supported by the stage is described as an example here, a housing provided with a light-emitting portion can be fixed on a ceiling or suspended from a ceiling. Since the light-emitting surface can be curved, the light-emitting surface is curved to have a concave shape, whereby a particular area can be brightly illuminated, or the light-emitting surface is curved to have a convex shape, whereby a whole room can be brightly illuminated.

FIGS. 29A1, 29A2, and 29B to 29I each illustrate an example of a portable information terminal including a display portion 7001 having flexibility.

The display portion 7001 is manufactured using the light-emitting device, display device, input/output device, or the like of one embodiment of the present invention. For example, a light-emitting device, a display device, an input/output device, or the like that can be bent with a radius of curvature of greater than or equal to 0.01 mm and less than or equal to 150 mm can be used. The display portion 7001 may include a touch sensor so that the portable information terminal can be operated by touching the display portion 7001 with a finger or the like.

In accordance with one embodiment of the present invention, a highly reliable electronic device having a flexible display portion can be provided.

FIGS. 29A1 and 29A2 are a perspective view and a side view, respectively, illustrating an example of the portable information terminal. A portable information terminal 7500 includes a housing 7501, the display portion 7001, a display portion tab 7502, operation buttons 7503, and the like.

The portable information terminal 7500 includes a rolled flexible display portion 7001 in the housing 7501. The display portion 7001 can be pulled out by using the display portion tab 7502.

The portable information terminal 7500 can receive a video signal with a control portion incorporated therein and can display the received video on the display portion 7001. The portable information terminal 7500 incorporates a battery. A terminal portion for connecting a connector may be included in the housing 7501 so that a video signal and power can be directly supplied from the outside with a wiring.

By pressing the operation buttons 7503, power on/off, switching of displayed videos, and the like can be performed. Although FIGS. 29A1, 29A2, and 29B illustrate an example where the operation buttons 7503 are positioned on a side surface of the portable information terminal 7500, one embodiment of the present invention is not limited thereto. The operation buttons 7503 may be placed on a display surface (a front surface) or a rear surface of the portable information terminal 7500.

FIG. 29B illustrates the portable information terminal 7500 in a state where the display portion 7001 is pulled out. Videos can be displayed on the display portion 7001 in this state. In addition, the portable information terminal 7500 may perform different displays in the state where part of the display portion 7001 is rolled as illustrated in FIG. 29A1 and in the state where the display portion 7001 is pulled out as illustrated in FIG. 29B. For example, in the state illustrated in FIG. 29A1, the rolled portion of the display portion 7001 is put in a non-display state, which results in a reduction in power consumption of the portable information terminal 7500.

Note that a reinforcement frame may be provided for a side portion of the display portion 7001 so that the display portion 7001 has a flat display surface when pulled out.

Note that in addition to this structure, a speaker may be provided for the housing so that sound is output with an audio signal received together with a video signal.

FIGS. 29C to 29E illustrate an example of a foldable portable information terminal. FIG. 29C illustrates a portable information terminal 7600 that is opened. FIG. 29D illustrates the portable information terminal 7600 that is being opened or being folded. FIG. 29E illustrates the portable information terminal 7600 that is folded. The portable information terminal 7600 is highly portable when folded, and is highly browsable when opened because of a seamless large display area.

The display portion 7001 is supported by three housings 7601 joined together by hinges 7602. By folding the portable information terminal 7600 at a connection portion between two housings 7601 with the hinges 7602, the portable information terminal 7600 can be reversibly changed in shape from an opened state to a folded state.

FIGS. 29F and 29G illustrate an example of a foldable portable information terminal. FIG. 29F illustrates a portable information terminal 7650 that is folded so that the display portion 7001 is on the inside. FIG. 29G illustrates the portable information terminal 7650 that is folded so that the display portion 7001 is on the outside. The portable information terminal 7650 includes the display portion 7001 and a non-display portion 7651. When the portable information terminal 7650 is not used, the portable information terminal 7650 is folded so that the display portion 7001 is on the inside, whereby the display portion 7001 can be prevented from being contaminated and damaged.

FIG. 29H illustrates an example of a flexible portable information terminal. A portable information terminal 7700 includes a housing 7701 and the display portion 7001. In addition, the portable information terminal 7700 may include buttons 7703a and 7703b which serve as input means, speakers 7704a and 7704b which serve as sound output means, an external connection port 7705, a microphone 7706, or the like. A flexible battery 7709 can be mounted on the portable information terminal 7700. The battery 7709 may be arranged to overlap with the display portion 7001, for example.

The housing 7701, the display portion 7001, and the battery 7709 are flexible. Thus, it is easy to curve the portable information terminal 7700 into a desired shape and to twist the portable information terminal 7700. For example, the portable information terminal 7700 can be curved so that the display portion 7001 is on the inside or on the outside. Alternatively, the portable information terminal 7700 can be used in a rolled state. Since the housing 7701 and the display portion 7001 can be transformed freely in this manner, the portable information terminal 7700 is less likely to be broken even when the portable information terminal 7700 falls down or external stress is applied to the portable information terminal 7700.

The portable information terminal 7700 can be used effectively in various situations because the portable information terminal 7700 is lightweight. For example, the portable information terminal 7700 can be used in the state where the upper portion of the housing 7701 is suspended by a clip or the like, or in the state where the housing 7701 is fixed to a wall by magnets or the like.

FIG. 29I illustrates an example of a wrist-watch-type portable information terminal. The portable information terminal 7800 includes a band 7801, the display portion 7001, an input/output terminal 7802, operation buttons 7803, or the like. The band 7801 has a function of a housing. A flexible battery 7805 can be mounted on the portable information terminal 7800. The battery 7805 may overlap with the display portion 7001 or the band 7801, for example.

The band 7801, the display portion 7001, and the battery 7805 have flexibility. Thus, the portable information terminal 7800 can be easily curved to have a desired shape.

With the operation button 7803, a variety of functions such as time setting, on/off of the power, on/off of wireless communication, setting and cancellation of silent mode, and setting and cancellation of power saving mode can be performed. For example, the functions of the operation button 7803 can be set freely by the operating system incorporated in the portable information terminal 7800.

By touching an icon 7804 displayed on the display portion 7001 with a finger or the like, an application can be started.

The portable information terminal 7800 can employ near field communication that is a communication method based on an existing communication standard. In that case, for example, mutual communication between the portable information terminal 7800 and a headset capable of wireless communication can be performed, and thus hands-free calling is possible.

The portable information terminal 7800 may include the input/output terminal 7802. In the case where the input/output terminal 7802 is included, data can be directly transmitted to and received from another information terminal via a connector. Charging through the input/output terminal 7802 is also possible. Note that charging of the portable information terminal described as an example in this embodiment can be performed by non-contact power transmission without using the input/output terminal.

Figure 30A:
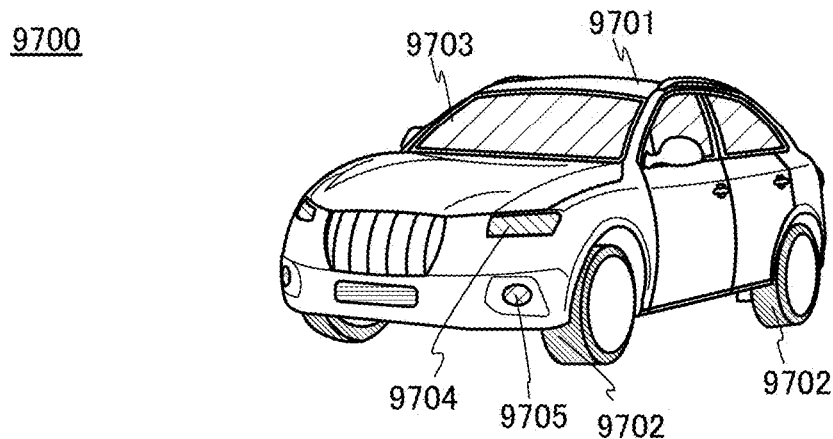
FIGS. 30A to 30E illustrate examples of electronic devices.
Figure 30B:
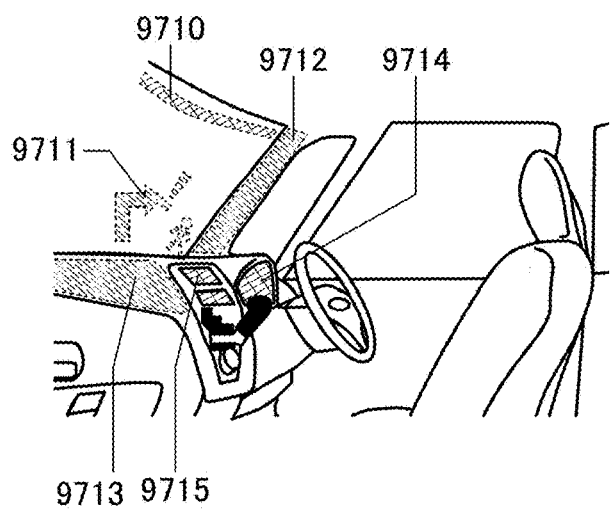

FIG. 30A is an external view of an automobile 9700. FIG. 30B illustrates a driver's seat of the automobile 9700. The automobile 9700 includes a car body 9701, wheels 9702, a windshield 9703, lights 9704, fog lamps 9705, and the like. The light-emitting device, display device, input/output device, or the like of one embodiment of the present invention can be used in a display portion of the automobile 9700. For example, the light-emitting device or the like of one embodiment of the present invention can be used in display portions 9710 to 9715 illustrated in FIG. 30B. Alternatively, the light-emitting device or the like of one embodiment of the present invention may be used in the lights 9704 or the fog lamps 9705.

The display portion 9710 and the display portion 9711 are display devices provided in the automobile windshield. The light-emitting device or the like of one embodiment of the present invention can be a see-through device, through which the opposite side can be seen, by using a light-transmitting conductive material for its electrodes and wirings. Such a see-through display portion 9710 or 9711 does not hinder driver's vision during the driving of the automobile 9700. Therefore, the light-emitting device or the like of one embodiment of the present invention can be provided in the windshield of the automobile 9700. Note that in the case where a transistor or the like for driving the light-emitting device or the like is provided, a transistor having light-transmitting properties, such as an organic transistor using an organic semiconductor material or a transistor using an oxide semiconductor, is preferably used.

The display portion 9712 is a display device provided on a pillar portion. For example, the display portion 9712 can compensate for the view hindered by the pillar portion by showing an image taken by an imaging unit provided on the car body. The display portion 9713 is a display device provided on a dashboard portion. For example, the display portion 9713 can compensate for the view hindered by the dashboard portion by showing an image taken by an imaging unit provided on the car body. That is, showing an image taken by an imaging unit provided on the outside of the car body leads to elimination of blind areas and enhancement of safety. In addition, showing an image so as to compensate for the area which a driver cannot see makes it possible for the driver to confirm safety easily and comfortably.

Figure 30C:
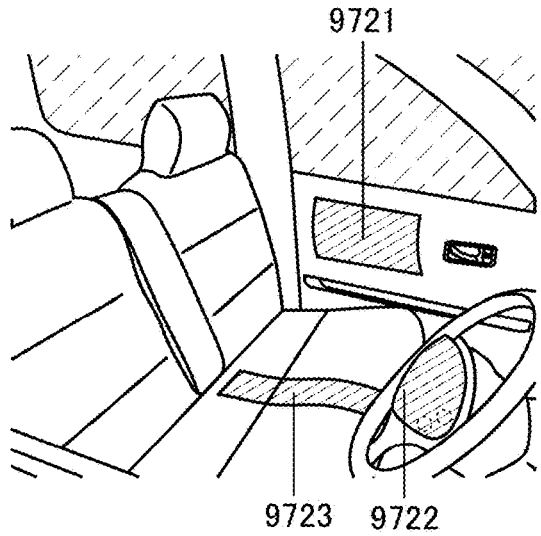

FIG. 30C illustrates the inside of an automobile in which a bench seat is used as a driver seat and a front passenger seat. A display portion 9721 is a display device provided in a door portion. For example, the display portion 9721 can compensate for the view hindered by the door portion by showing an image taken by an imaging unit provided on the car body. A display portion 9722 is a display device provided in a steering wheel. A display portion 9723 is a display device provided in the middle of a seating face of the bench seat. Note that the display device can be used as a seat heater by providing the display device on the seating face or backrest and by using heat generated by the display device as a heat source.

The display portion 9714, the display portion 9715, or the display portion 9722 can display a variety of kinds of information such as navigation data, a speedometer, a tachometer, a mileage, a fuel meter, a gearshift indicator, and air-condition setting. The content, layout, or the like of the display on the display portions can be changed freely by a user as appropriate. The information listed above can also be displayed on the display portions 9710 to 9713, 9721, and 9723. The display portions 9710 to 9715 and 9721 to 9723 can also be used as lighting devices. The display portions 9710 to 9715 and 9721 to 9723 can also be used as heating devices.

The display portion in which the light-emitting device, display device, input/output device, or the like of one embodiment of the present invention is used may have a flat surface.

Figure 30D:
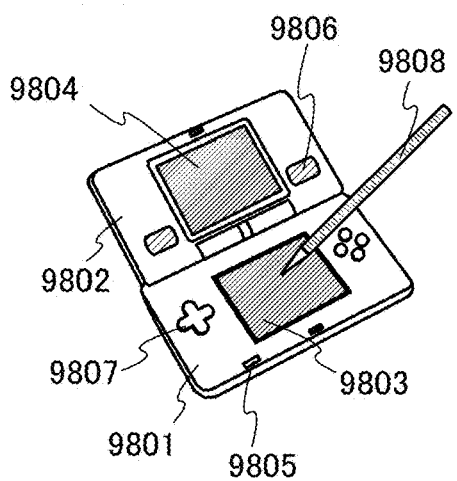

FIG. 30D illustrates a portable game console including a housing 9801, a housing 9802, a display portion 9803, a display portion 9804, a microphone 9805, a speaker 9806, an operation key 9807, a stylus 9808, and the like.

The portable game console illustrated in FIG. 30D includes two display portions 9803 and 9804. Note that the number of display portions of an electronic device of one embodiment of the present invention is not limited to two and can be one or three or more as long as at least one display portion includes the light-emitting device, display device, input/output device, or the like of one embodiment of the present invention.

Figure 30E:
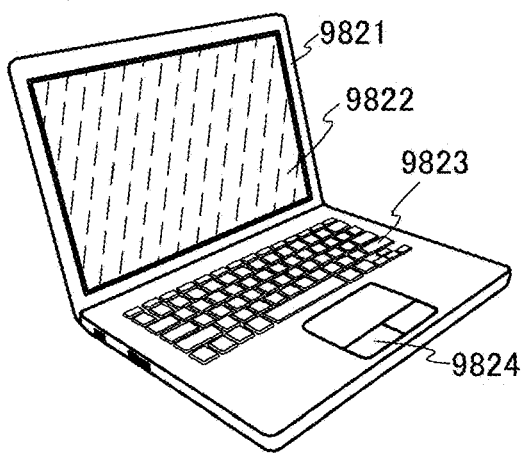

FIG. 30E illustrates a laptop personal computer, which includes a housing 9821, a display portion 9822, a keyboard 9823, a pointing device 9824, and the like.

This embodiment can be combined with any other embodiment as appropriate.

EXPLANATION OF REFERENCE

10: light-emitting device, 11: substrate, 12: bonding layer, 13: insulating layer, 15: light-emitting element, 16: bonding layer, 17: bonding layer, 18a: partition, 18b: temporary sealing layer, 18c: partition, 18d: temporary sealing layer, 19: substrate, 21: member, 21a: member, 21b: member, 22: projection, 22a: projection, 22b: projection, 25: light-emitting portion, 26: non-light-emitting portion, 31: formation substrate, 32: separation layer, 51: formation substrate, 52: separation layer, 53: insulating layer, 55: coloring layer, 59: spacer, 251: flexible substrate, 258: thin region, 259: flexible substrate, 301: display portion, 302: pixel, 302B: sub-pixel, 302G: sub-pixel, 302R: sub-pixel, 302t: transistor, 303c: capacitor, 303g(1): scan line driver circuit, 303g(2): imaging pixel driver circuit, 303s(1): image signal line driver circuit, 303s(2): imaging signal line driver circuit, 303t: transistor, 304: gate, 308: imaging pixel, 308p: photoelectric conversion element, 308t: transistor, 309: FPC, 311: wiring, 312: gate insulating layer, 319: terminal, 321: insulating layer, 328: partition, 329: spacer, 350R: light-emitting element, 351R: lower electrode, 352: upper electrode, 353: EL layer, 353a: EL layer, 353b: EL layer, 354: intermediate layer, 360: bonding layer, 367BM: light-blocking layer, 367p: anti-reflective layer, 367R: coloring layer, 378: insulating layer, 390: input/output device, 501: display portion, 505: input/output device, 505B: input/output device, 509: FPC, 589: insulating layer, 590: flexible substrate, 591: electrode, 592: electrode, 593: insulating layer, 594: wiring, 595: touch sensor, 597: bonding layer, 598: wiring, 599: connection layer, 701: first flexible substrate, 703: first bonding layer, 705: first insulating layer, 711: second flexible substrate, 712: depression, 713: second bonding layer, 715: second insulating layer, 723: back gate, 728: insulating layer, 729: insulating layer, 742: semiconductor layer, 743: gate, 744a: conductive layer, 744b: conductive layer, 747a: opening, 747b: opening, 747c: opening, 747d: opening, 772: insulating layer, 804: light-emitting portion, 806: driver circuit portion, 808: FPC, 810: spacer, 811: insulating layer, 812: insulating layer, 813: inorganic insulating layer, 814: conductive layer, 815: insulating layer, 817: insulating layer, 817a: insulating layer, 817b: insulating layer, 820: transistor, 821: insulating layer, 822: bonding layer, 823: spacer, 824: transistor, 825: connector, 830: light-emitting element, 831: lower electrode, 832: optical adjustment layer, 833: EL layer, 835: upper electrode, 845: coloring layer, 847: light-blocking layer, 848: transistor, 849: overcoat, 856: conductive layer, 857: conductive layer, 857a: conductive layer, 857b: conductive layer, 2000a: upper plate, 2000b: lower plate, 2005a: cushioning material, 2005b: cushioning material, 2005c: cushioning material, 2005d: cushioning material, 2100: substrate, 7000: display portion, 7001: display portion, 7100: cellular phone, 7101: housing, 7103: operation button, 7104: external connection port, 7105: speaker, 7106: microphone, 7200: television set, 7201: housing, 7203: stand, 7211: remote controller, 7300: portable information terminal, 7301: housing, 7302: operation button, 7303: housing, 7304: housing, 7305: housing, 7306: housing, 7310: portable information terminal, 7320: portable information terminal, 7400: lighting device, 7401: stage, 7402: light-emitting portion, 7403: operation switch, 7410: lighting device, 7412: light-emitting portion, 7420: lighting device, 7422: light-emitting portion, 7500: portable information terminal, 7501: housing, 7502: display portion tab, 7503: operation button, 7600: portable information terminal, 7601: housing, 7602: hinge, 7650: portable information terminal, 7651: non-display portion, 7700: portable information terminal, 7701: housing, 7703a: button, 7703b: button, 7704a: speaker, 7704b: speaker, 7705: external connection port, 7706: microphone, 7709: battery, 7800: portable information terminal, 7801: band, 7802: input/output terminal, 7803: operation button, 7804: icon, 7805: battery, 9700: automobile, 9701: car body, 9702: wheel, 9703: windshield, 9704: light, 9705: fog lamp, 9710: display portion, 9711: display portion, 9712: display portion, 9713: display portion, 9714: display portion, 9715: display portion, 9721: display portion, 9722: display portion, 9723: display portion, 9801: housing, 9802: housing, 9803: display portion, 9804: display portion, 9805: microphone, 9806: speaker, 9807: operation key, 9808: stylus, 9821: housing, 9822: display portion, 9823: keyboard, and 9824: pointing device.

This application is based on Japanese Patent Application serial no. 2015-150777 filed with Japan Patent Office on Jul. 30, 2015 and Japanese Patent Application serial no. 2016-119834 filed with Japan Patent Office on Jun. 16, 2016, the entire contents of which are hereby incorporated by reference.

The invention claimed is:

1. A light-emitting device comprising:
   a light-emitting portion; and
   a non-light-emitting portion having a frame-like shape outside the light-emitting portion;
   a first flexible substrate;
   a second flexible substrate over the first flexible substrate;
   a first bonding layer;
   a second bonding layer;
   a third bonding layer;
   a first insulating layer; and
   a first functional layer,
   wherein the first bonding layer is between the first flexible substrate and the first insulating layer,
   wherein the second bonding layer is between the second flexible substrate and the first insulating layer, wherein the first functional layer is between the second bonding layer and the first insulating layer,
wherein the first bonding layer and the second bonding layer overlap with each other with the first insulating layer therebetween,
wherein the light-emitting portion comprises a light-emitting element in the first functional layer,
wherein the non-light-emitting portion comprises a spacer having an insulating property,
wherein the first flexible substrate comprises a dented portion in the non-light-emitting portion,
wherein the dented portion and the spacer overlap with each other, and
wherein a thickness of the third bonding layer is smaller in a first portion overlapping with the dented portion than a second portion.

2. A module comprising:
the light-emitting device according to claim 1; and
a flexible printed circuit board or an integrated circuit.

3. An electronic device comprising:
the module according to claim 2; and
at least one of a sensor, an antenna, a battery, a housing, a camera, a speaker, a microphone, and an operation button.

4. The light-emitting device according to claim 1,
wherein the non-light-emitting portion has a frame-like shape outside the light-emitting portion, and
wherein the non-light-emitting portion surrounds the light-emitting portion.

5. A light-emitting device comprising:
a light-emitting portion; and
a non-light-emitting portion;
a first flexible substrate;
a second flexible substrate over the first flexible substrate;
a first bonding layer;
a second bonding layer;
a first insulating layer; and
a first functional layer,
wherein the non-light-emitting portion is between the light-emitting portion and an edge of the light-emitting device,
wherein the first bonding layer is between the first flexible substrate and the first insulating layer,
wherein the second bonding layer is between the second flexible substrate and the first insulating layer,
wherein the first functional layer is between the second bonding layer and the first insulating layer,
wherein the first bonding layer and the second bonding layer overlap with each other with the first insulating layer therebetween,
wherein the light-emitting portion comprises a light-emitting element in the first functional layer,
wherein a gap between the second flexible substrate and a first portion of the first insulating layer overlapping with the non-light-emitting portion is smaller than a gap between the second flexible substrate and the rest of the first insulating layer, and
wherein the first and second flexible substrates are dented in the non-light-emitting portion.

6. The light-emitting device according to claim 5, wherein the non-light-emitting portion has a frame-like shape outside the light-emitting portion.

* * * * *